(12) United States Patent
Mujica-Fernaud et al.

(10) Patent No.: US 11,440,925 B2
(45) Date of Patent: Sep. 13, 2022

(54) COMPOUNDS FOR ELECTRONIC DEVICES

(71) Applicant: Merck Patent GmbH, Darmstadt (DE)

(72) Inventors: Teresa Mujica-Fernaud, Darmstadt (DE); Rémi Anémian, Seoul (KR); Hyeon-Hui Kang, Uiwang-si (KR); Il Jung, Yongin-si (KR); Jun-Ho Kim, Hwaseong-si (KR)

(73) Assignee: MERCK PATENT GMBH, Darmstadt (DE)

( * ) Notice: Subject to any disclaimer, the term of this patent is extended or adjusted under 35 U.S.C. 154(b) by 432 days.

(21) Appl. No.: 16/347,847

(22) PCT Filed: Nov. 6, 2017

(86) PCT No.: PCT/EP2017/078262
§ 371 (c)(1),
(2) Date: May 7, 2019

(87) PCT Pub. No.: WO2018/087020
PCT Pub. Date: May 17, 2018

(65) Prior Publication Data
US 2019/0263841 A1 Aug. 29, 2019

(30) Foreign Application Priority Data
Nov. 8, 2016 (EP) ..................................... 16197670

(51) Int. Cl.
*C07F 7/08* (2006.01)
*H01L 51/00* (2006.01)
*H01L 51/50* (2006.01)

(52) U.S. Cl.
CPC ........ *C07F 7/0816* (2013.01); *H01L 51/0052* (2013.01); *H01L 51/0074* (2013.01); *H01L 51/0094* (2013.01); *H01L 51/006* (2013.01); *H01L 51/0054* (2013.01); *H01L 51/0058* (2013.01); *H01L 51/0061* (2013.01); *H01L 51/0067* (2013.01); *H01L 51/0072* (2013.01); *H01L 51/0073* (2013.01); *H01L 51/506* (2013.01); *H01L 51/5012* (2013.01); *H01L 51/5056* (2013.01)

(58) Field of Classification Search
None
See application file for complete search history.

(56) References Cited

U.S. PATENT DOCUMENTS

| 8,847,141 | B2 | 9/2014 | Fukuzaki et al. | |
| 2005/0014023 | A1* | 1/2005 | Yu | C08G 61/12 546/10 |
| 2006/0083945 | A1* | 4/2006 | Morishita | C08G 61/124 313/506 |
| 2009/0039765 | A1 | 2/2009 | Uetani et al. | |
| 2010/0045170 | A1* | 2/2010 | Lee | C07C 25/22 313/504 |
| 2013/0122276 | A1 | 5/2013 | Nomura et al. | |
| 2015/0129861 | A1 | 5/2015 | Hamano et al. | |
| 2015/0171342 | A1* | 6/2015 | Jung | C07D 405/14 257/40 |
| 2015/0255736 | A1 | 9/2015 | Kim et al. | |
| 2015/0364705 | A1* | 12/2015 | Jun | H01L 51/0055 257/40 |
| 2016/0111653 | A1 | 4/2016 | Itoi | |
| 2016/0118594 | A1* | 4/2016 | Itoi | H01L 51/0071 257/40 |
| 2016/0155961 | A1 | 6/2016 | Ueno et al. | |
| 2016/0163993 | A1 | 6/2016 | Nakano | |
| 2016/0190487 | A1* | 6/2016 | Akashi | C07F 7/0816 257/40 |
| 2016/0248019 | A1* | 8/2016 | Choi | H01L 51/0073 |
| 2016/0301005 | A1 | 10/2016 | Pfister et al. | |
| 2016/0329494 | A1* | 11/2016 | Jun | H01L 51/0061 |
| 2017/0261870 | A1* | 9/2017 | Yumita | G03G 5/14713 |
| 2017/0277050 | A1* | 9/2017 | Yumita | G03G 5/0542 |
| 2017/0324037 | A1* | 11/2017 | Itoi | C07C 211/61 |

FOREIGN PATENT DOCUMENTS

| CN | 104471022 | A | 3/2015 | |
| JP | 2001-172284 | A | 6/2001 | |
| JP | 2012169518 | A | 9/2012 | |
| JP | 2013-020996 | A | 1/2013 | |
| JP | 2013074085 | A | 4/2013 | |
| JP | 2013100239 | A | 5/2013 | |
| JP | 2016-082158 | A | 5/2016 | |
| JP | 2016-108290 | A | 6/2016 | |
| KR | 20110138129 | A | 12/2011 | |
| KR | 20140020208 | | * 2/2014 | ............. C09K 11/06 |
| KR | 20160051210 | | * 5/2016 | ........... C07D 401/14 |
| WO | WO-2006025290 | A1 | 3/2006 | |

(Continued)

OTHER PUBLICATIONS

IUPAC definitoin for "aromatic", 1 page. (Year: 2022).*
IUPAC definition for "conjugated system", 1 page. (Year: 2022).*
International Preliminary Report on Patentability received for PCT Patent Application No. PCT/EP2017/078262, dated May 23, 2019, 7 pages.
International Search Report for PCT/EP2017/078262 dated Jan. 18, 2018.

(Continued)

*Primary Examiner* — Robert S Loewe
(74) *Attorney, Agent, or Firm* — Faegre Drinker Biddle & Reath LLP

(57) ABSTRACT

The present application concerns silafluorene derivatives according to a specific formula. The silafluorene derivatives can be employed in electronic devices. Furthermore, the present application concerns methods for preparation of the silafluorene derivatives, and electronic devices comprising the silafluorene derivatives.

14 Claims, No Drawings

(56) References Cited

FOREIGN PATENT DOCUMENTS

| WO | WO-2010140645 A1 | 12/2010 | |
|---|---|---|---|
| WO | WO-2012077431 A1 | 6/2012 | |
| WO | WO-2013173396 A2 | 11/2013 | |
| WO | WO-2014017042 A1 | 1/2014 | |
| WO | WO-2014017844 A1 | 1/2014 | |
| WO | WO-2015082056 A1 | 6/2015 | |
| WO | WO-2015152547 A1 | 10/2015 | |
| WO | WO-2016116520 A1 * | 7/2016 | ........... C07C 255/58 |
| WO | 2017/126370 A1 | 7/2017 | |

OTHER PUBLICATIONS

Shimizu, M., et al,. "Synthesis and Photophysical Properties of 2-Donor-7-acceptor-9-silafluorenes: Remarkable Fluorescence Solvatochromism and Highly Efficient Fluorescence in Doped Polymer Films", Journal of Physical Chemistry, vol. 114, No. 21, (2010), pp. 10004-10014.

Written Opinion of the International Searching Authority for PCT/EP2017/078262 dated Jan. 18, 2018.

\* cited by examiner

COMPOUNDS FOR ELECTRONIC DEVICES

CROSS-REFERENCE TO RELATED APPLICATIONS

This application is a national stage application (under 35 U.S.C. § 371) of PCT/EP2017/078262, filed Nov. 6, 2017, which claims benefit of European Application No. 16197670.9, filed Nov. 8, 2016, both of which are incorporated herein by reference in their entirety.

The present application concerns silafluorene derivatives according to a specific formula. The silafluorene derivatives can be employed in electronic devices. Furthermore, the present application concerns methods for preparation of the silafluorene derivatives, and electronic devices comprising the silafluorene derivatives.

Electronic devices according to the present application are understood to be organic electronic devices, which contain organic semiconductor materials as functional materials. In particular, the electronic devices are organic electroluminescent devices (OLEDs). OLEDs, in the sense of the present application, are understood to be electronic devices which contain one or more layers of organic compounds, and which emit light if an electrical voltage is applied. The structure as well as the basic operating mode of OLEDs, as well as methods for the preparation of OLEDs, are known to the skilled person.

Regarding electronic devices, in particular OLEDs, there is strong interest in finding alternative compounds which can be used in OLEDs.

Furthermore, there is strong interest in finding compounds which lead to an improvement of the performance of the electronic devices, in particular in respect to lifetime, efficiency, and operating voltage of the devices.

Furthermore, there is strong interest in finding compounds which are easily processable, temperature stable, and have a high stability of their glassy state. Still, in spite of strong research efforts over the past decades, these demands have not been satisfied yet.

Layers with hole transporting function, such as hole injection layers, hole transporting layers, electron blocking layers and emitting layers, are known to have a large influence of the performance of OLEDs.

Therefore, there is a strong demand for new materials which are suitable for use in such layers, in particular for new materials which have hole transporting properties and which preferably cause an improvement in the above-mentioned properties of the OLEDs.

In the prior art, triarylamines are known as class of materials which are well suitable for use in layers with hole transporting function. Triarylamines with many different structural elements are known, for example fluorene amines and spirobifluorenyl amines.

According to the present invention, it has been found that the performance of electronic devices, in particular OLED devices, is improved by using silafluorene amines which have an amine group which is attached in at least one of positions 1 and 4 on the silafluorene. With such silafluorene amines, one or more of the following effects is achieved:

Increased device lifetime
Increased device efficiency
Decreased operating voltage
Improved processability of the material
Improved temperature stability of the material
Improved stability of the glassy state of the material.

Object of the present application are therefore compounds of a formula (I)

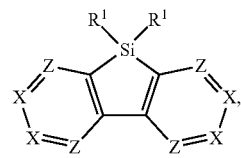

formula (I)

where the following applies to the variable groups:

Z is, identically or differently on each occurrence, selected from $CR^4$ and N, where at least one group Z is $CR^4$;

X is, identically or differently on each occurrence, selected from $CR^2$ and N;

$R^1$ is selected, identically or differently at each occurrence, from H, D, F, straight-chain alkyl or alkoxy groups having 1 to 20 C atoms, branched or cyclic alkyl or alkoxy groups having 3 to 20 C atoms, alkenyl or alkynyl groups having 2 to 20 C atoms, aromatic ring systems having 6 to 40 aromatic ring atoms, and heteroaromatic ring systems having 5 to 40 aromatic ring atoms; where two or more radicals $R^1$ may be connected to each other to form a ring; where the said alkyl, alkoxy, alkenyl and alkynyl groups and the said aromatic and heteroaromatic ring systems may in each case be substituted by one or more radicals $R^4$, and where one or more $CH_2$ groups in the said alkyl, alkoxy, alkenyl and alkynyl groups may in each case be replaced by $-R^4C=CR^4-$, $-C\equiv C-$, $Si(R^4)_2$, $C=O$, $C=NR^4$, $-C(=O)O-$, $-C(=O)NR^4-$, $NR^4$, $P(=O)(R^4)$, $-O-$, $-S-$, SO or $SO_2$;

$R^4$ and $R^2$ are selected, identically or differently at each occurrence, from H, D, F, $C(=O)R^4$, CN, $Si(R^4)_3$, $P(=O)(R^4)_2$, $OR^4$, $S(=O)R^4$, $S(=O)_2R^4$, straight-chain alkyl or alkoxy groups having 1 to 20 C atoms, branched or cyclic alkyl or alkoxy groups having 3 to 20 C atoms, alkenyl or alkynyl groups having 2 to 20 C atoms, aromatic ring systems having 6 to 40 aromatic ring atoms, and heteroaromatic ring systems having 5 to 40 aromatic ring atoms; where two or more radicals $R^4$ and/or $R^2$ may be connected to each other to form a ring; where the said alkyl, alkoxy, alkenyl and alkynyl groups and the said aromatic and heteroaromatic ring systems may in each case be substituted by one or more radicals $R^4$, and where one or more $CH_2$ groups in the said alkyl, alkoxy, alkenyl and alkynyl groups may in each case be replaced by $-R^4C=CR^4-$, $-C\equiv C-$, $Si(R^4)_2$, $C=O$, $C=NR^4$, $-C(=O)O-$, $-C(=O)NR^4-$, $NR^4$, $P(=O)(R^4)$, $-O-$, $-S-$, SO or $SO_2$;

$R^4$ is selected, identically or differently at each occurrence, from H, D, F, $C(=O)R^5$, CN, $Si(R^5)_3$, $N(R^5)_2$, $P(=O)(R^5)_2$, $OR^5$, $S(=O)R^5$, $S(=O)_2R^5$, straight-chain alkyl or alkoxy groups having 1 to 20 C atoms, branched or cyclic alkyl or alkoxy groups having 3 to 20 C atoms, alkenyl or alkynyl groups having 2 to 20 C atoms, aromatic ring systems having 6 to 40 aromatic ring atoms, and heteroaromatic ring systems having 5 to 40 aromatic ring atoms; where two or more radicals $R^4$ may be connected to each other to form a ring; where the said alkyl, alkoxy, alkenyl and alkynyl groups and the said aromatic and heteroaromatic ring systems may in each case be substituted by one or more radicals $R^5$, and where one or more $CH_2$ groups in the said alkyl, alkoxy, alkenyl and alkynyl groups may in each case be replaced by $-R^5C=CR^5-$, $-C\equiv C-$, $Si(R^5)_2$, $C=O$, $C=NR^5$, $-C(=O)O-$, $-C(=O)NR^5-$, $NR^5$, $P(=O)(R^5)$, $-O-$, $-S-$, SO or $SO_2$; $R^5$ is selected, identically or differently at each occurrence, from H, D, F, CN, alkyl groups having 1 to 20 C atoms, aromatic ring systems having 6 to 40 C atoms, or heteroaromatic ring systems having 5 to 40 aromatic ring atoms; where two or more radicals $R^5$ may be connected to each other to form a ring; and where the said alkyl groups, aromatic ring systems and heteroaromatic ring systems may be substituted by F and CN;

provided that a) at least one radical $R^4$ is replaced by a group according to formula (A)

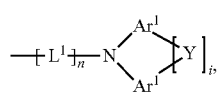

formula (A)

and/or b) at least one hydrogen atom or at least one substituent $R^4$ of at least one group $R^1$ is replaced by a group according to formula (A);

where the group according to formula (A) is attached via the free bond on the left of the structure of formula (A), and where the variables in formula (A) are defined as follows:

$Ar^1$ is selected, identically or differently on each occurrence, from aromatic ring systems having 6 to 40 aromatic ring atoms, and from heteroaromatic ring systems having 5 to 40 aromatic ring atoms, each of which may be substituted by one or more radicals $R^3$;

$L^1$ is selected, identically or differently on each occurrence, from aromatic ring systems having 6 to 30 aromatic ring atoms and from heteroaromatic ring systems having 5 to 30 aromatic ring atoms, each of which may be substituted by one or more radicals $R^3$;

Y is selected from a single bond, $C(R^3)_2$, $Si(R^3)_2$, $BR^3$, $NR^3$, O, and S; $R^3$ is selected, identically or differently at each occurrence, from H, D, F, $C(=O)R^4$, CN, $Si(R^4)_3$, $N(R^4)_2$, $P(=O)(R^4)_2$, $OR^4$, $S(=O)R^4$, $S(=O)_2R^4$, straight-chain alkyl or alkoxy groups having 1 to 20 C atoms, branched or cyclic alkyl or alkoxy groups having 3 to 20 C atoms, alkenyl or alkynyl groups having 2 to 20 C atoms, aromatic ring systems having 6 to 40 aromatic ring atoms, and heteroaromatic ring systems having 5 to 40 aromatic ring atoms; where two or more radicals $R^3$ may be connected to each other to form a ring; where the said alkyl, alkoxy, alkenyl and alkynyl groups and the said aromatic and heteroaromatic ring systems may in each case be substituted by one or more radicals $R^4$, and where one or more $CH_2$ groups in the said alkyl, alkoxy, alkenyl and alkynyl groups may in each case be replaced by —$R^4C=CR^4$—, —C≡C—, $Si(R^4)_2$, C=O, C=$NR^4$, —C(=O)O—, —C(=O)$NR^4$—, $NR^4$, $P(=O)(R^4)$, —O—, —S—, SO or $SO_2$;

i is 0 or 1;

n is 0, 1, 2 or 3.

The following definitions apply to the chemical groups used as general definitions. They only apply insofar as no more specific definitions are given.

An aryl group in the sense of this invention contains 6 to 40 aromatic ring atoms, of which none is a heteroatom. An aryl group here is taken to mean either a simple aromatic ring, for example benzene, or a condensed aromatic polycycle, for example naphthalene, phenanthrene, or anthracene. A condensed aromatic polycycle in the sense of the present application consists of two or more simple aromatic rings condensed with one another.

A heteroaryl group in the sense of this invention contains 5 to 40 aromatic ring atoms, at least one of which is a heteroatom. The heteroatoms are preferably selected from N, O and S. A heteroaryl group here is taken to mean either a simple heteroaromatic ring, such as pyridine, pyrimidine or thiophene, or a condensed heteroaromatic polycycle, such as quinoline or carbazole. A condensed heteroaromatic polycycle in the sense of the present application consists of two or more simple heteroaromatic rings condensed with one another.

An aryl or heteroaryl group, which may in each case be substituted by the above-mentioned radicals and which may be linked to the aromatic or heteroaromatic ring system via any desired positions, is taken to mean, in particular, groups derived from benzene, naphthalene, anthracene, phenanthrene, pyrene, dihydropyrene, chrysene, perylene, fluoranthene, benzanthracene, benzophenanthrene, tetracene, pentacene, benzopyrene, furan, benzofuran, isobenzofuran, dibenzofuran, thiophene, benzothiophene, isobenzothiophene, dibenzothiophene, pyrrole, indole, isoindole, carbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazinimidazole, quinoxalinimidazole, oxazole, benzoxazole, naphthoxazole, anthroxazole, phenanthroxazole, isoxazole, 1,2-thiazole, 1,3-thiazole, benzothiazole, pyridazine, benzopyridazine, pyrimidine, benzopyrimidine, quinoxaline, pyrazine, phenazine, naphthyridine, azacarbazole, benzocarboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4,5-tetrazine, 1,2,3,4-tetrazine, 1,2,3,5-tetrazine, purine, pteridine, indolizine and benzothiadiazole.

An aromatic ring system in the sense of this invention contains 6 to 40 C atoms in the ring system and does not comprise any heteroatoms as aromatic ring atoms. An aromatic ring system in the sense of this application therefore does not comprise any heteroaryl groups. An aromatic ring system in the sense of this invention is intended to be taken to mean a system which does not necessarily contain only aryl groups, but instead in which, in addition, a plurality of aryl groups may be connected by a non-aromatic unit such as one or more optionally substituted C, Si, N, O or S atoms. The non-aromatic unit in such case comprises preferably less than 10% of the atoms other than H, relative to the total number of atoms other than H of the whole aromatic ring system. Thus, for example, systems such as 9,9'-spirobifluorene, 9,9'-diarylfluorene, triarylamine, diaryl ether, and stilbene are also intended to be taken to be aromatic ring systems in the sense of this invention, as are systems in which two or more aryl groups are connected, for example, by a linear or cyclic alkyl, alkenyl or alkynyl group or by a silyl group. Furthermore, systems in which two or more aryl groups are linked to one another via single bonds are also taken to be aromatic ring systems in the sense of this invention, such as, for example, systems such as biphenyl and terphenyl.

A heteroaromatic ring system in the sense of this invention contains 5 to 40 aromatic ring atoms, at least one of which is a heteroatom. The heteroatoms are preferably selected from N, O or S. A heteroaromatic ring system is defined as an aromatic ring system above, with the difference that it must obtain at least one heteroatom as one of the aromatic ring atoms. It thereby differs from an aromatic ring system according to the definition of the present application, which cannot comprise any heteroatom as aromatic ring atom.

An aromatic ring system having 6 to 40 aromatic ring atoms or a heteroaromatic ring system having 5 to 40 aromatic ring atoms is in particular a group which is derived from the above mentioned aryl or heteroaryl groups, or from biphenyl, terphenyl, quaterphenyl, fluorene, spirobifluorene, dihydrophenanthrene, dihydropyrene, tetrahydropyrene, indenofluorene, truxene, isotruxene, spirotruxene, spiroisotruxene, and indenocarbazole.

For the purposes of the present invention, a straight-chain alkyl group having 1 to 20 C atoms or a branched or cyclic alkyl group having 3 to 20 C atoms or an alkenyl or alkynyl group having 2 to 20 C atoms, in which, in addition, individual H atoms or $CH_2$ groups may be substituted by the groups mentioned above under the definition of the radicals, is preferably taken to mean the radicals methyl, ethyl, n-propyl, i-propyl, n-butyl, i-butyl, s-butyl, t-butyl, 2-methylbutyl, n-pentyl, s-pentyl, cyclopentyl, neopentyl, n-hexyl, cyclohexyl, neohexyl, n-heptyl, cycloheptyl, n-octyl, cyclooctyl, 2-ethylhexyl, trifluoromethyl, pentafluoroethyl, 2,2,2-trifluoroethyl, ethenyl, propenyl, butenyl, pentenyl, cyclopentenyl, hexenyl, cyclohexenyl, heptenyl, cycloheptenyl, octenyl, cyclooctenyl, ethynyl, propynyl, butynyl, pentynyl, hexynyl or octynyl.

An alkoxy or thioalkyl group having 1 to 20 C atoms is preferably taken to mean methoxy, trifluoromethoxy, ethoxy, n-propoxy, i-propoxy, n-butoxy, i-butoxy, s-butoxy, t-butoxy, n-pentoxy, s-pentoxy, 2-methylbutoxy, n-hexoxy, cyclohexyloxy, n-heptoxy, cycloheptyloxy, n-octyloxy, cyclooctyloxy, 2-ethylhexyloxy, pentafluoroethoxy, 2,2,2-trifluoroethoxy, methylthio, ethylthio, n-propylthio, i-propylthio, n-butylthio, i-butylthio, s-butylthio, t-butylthio, n-pentylthio, s-pentylthio, n-hexylthio, cyclohexylthio, n-heptylthio, cycloheptylthio, n-octylthio, cyclooctylthio, 2-ethylhexylthio, trifluoromethylthio, pentafluoroethylthio, 2,2,2-trifluoroethylthio, ethenylthio, propenylthio, butenylthio, pentenylthio, cyclopentenylthio, hexenylthio, cyclohexenylthio, heptenylthio, cycloheptenylthio, octenylthio, cyclooctenylthio, ethynylthio, propynylthio, butynylthio, pentynylthio, hexynylthio, heptynylthio or octynylthio.

It is preferred that not more than two groups selected from groups Z and X, preferably not more than one group selected from groups Z and X, per aromatic ring in formula (I) is N. Furthermore, it is preferred that not more than two groups selected from groups Z and X in formula (I) are N. More preferred is that Z is $CR^4$. More preferred is that X is $CR^2$.

It is preferred that in formula (I), at least one radical $R^4$ is replaced by a group according to formula (A), as defined above. It is more preferred that exactly one or exactly two radicals $R^4$ are replaced by a group according to formula (A), as defined above. It is most preferred that in formula (I), exactly one radical $R^4$ is replaced by a group according to formula (A), as defined above.

$R^1$ is preferably selected, at each occurrence, from F, straight-chain alkyl groups having 1 to 20 C atoms, branched or cyclic alkyl groups having 3 to 20 C atoms, aromatic ring systems having 6 to 40 aromatic ring atoms, and heteroaromatic ring systems having 5 to 40 aromatic ring atoms; where two or more radicals $R^1$ may be connected to each other to form a ring; and where the said alkyl groups and the said aromatic and heteroaromatic ring systems may in each case be substituted by one or more radicals $R^4$. If two or more radicals $R^1$ are connected to each other to form a ring, this ring is preferably a sila-cycloalkyl ring with the silicium atom to which the two radicals $R^1$ bond as the spiro atom, where the sila-cycloalkyl ring is preferably selected from sila-cyclopropyl, sila-cyclobutyl, sila-cyclopentyl, and sila-cyclohexyl, most preferably from sila-cyclopentyl and sila-cyclohexyl. Alternatively and equally preferably, if two or more radicals $R^1$ are connected to each other to form a ring, a sila-spirobifluorene is formed as the compound of formula (I), with the silicium atom to which the two radicals $R^1$ bond as the central silicium atom of the sila-spirobifluorene.

More preferably, $R^1$ is at each occurrence, identically or differently, selected from straight-chain alkyl groups having 1 to 10 C atoms, branched or cyclic alkyl groups having 3 to 10 C atoms, aromatic ring systems having 6 to 24 aromatic ring atoms, and heteroaromatic ring systems having 5 to 24 aromatic ring atoms, where the said alkyl groups and the said aromatic and heteroaromatic ring systems may in each case be substituted by one or more radicals $R^4$. Most preferably, $R^1$ is selected, identically or differently on each occurrence, from methyl, ethyl, propyl, butyl, pentyl, phenyl, biphenyl, terphenyl, fluorenyl, and naphthyl, each of which may be substituted by one or more radicals $R^4$, but is preferably unsubstituted.

$R^4$ preferably is, identically or differently on each occurrence, selected from H, D, F, CN, straight-chain alkyl groups having 1 to 20 C atoms, branched or cyclic alkyl groups having 3 to 20 C atoms, aromatic ring systems having 6 to 40 aromatic ring atoms, and heteroaromatic ring systems having 5 to 40 aromatic ring atoms; where two or more radicals $R^4$ may be connected to each other to form a ring; and where the said alkyl groups and the said aromatic and heteroaromatic ring systems may in each case be substituted by one or more radicals $R^4$. Most preferably, $R^4$ is H.

$R^2$ preferably is, identically or differently on each occurrence, selected from H, D, F, CN, straight-chain alkyl groups having 1 to 20 C atoms, branched or cyclic alkyl groups having 3 to 20 C atoms, aromatic ring systems having 6 to 40 aromatic ring atoms, and heteroaromatic ring systems having 5 to 40 aromatic ring atoms; where two or more radicals $R^2$ may be connected to each other to form a ring; and where the said alkyl groups and the said aromatic and heteroaromatic ring systems may in each case be substituted by one or more radicals $R^4$. Most preferably, $R^2$ is H.

In the case that two radicals $R^4$ and/or $R^2$ form a ring, it is preferable that a benzene ring is formed which is condensed onto the benzene ring to which the respective radicals $R^4$ and/or $R^2$ bond. Most preferably, in such case, a compound of one of the following formulae is formed:

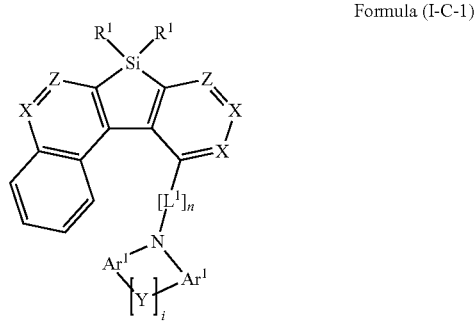

Formula (I-C-1)

Formula (I-C-2)
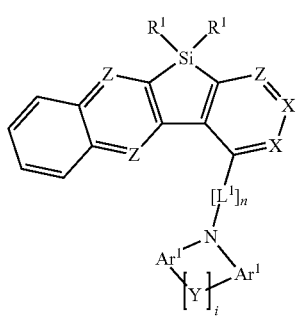

Formula (I-C-3)
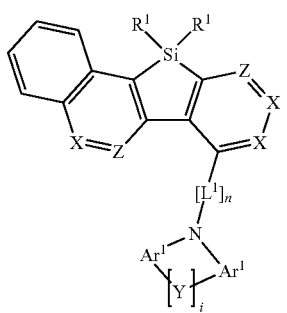

Formula (I-C-4)
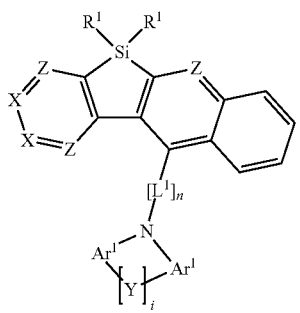

Formula (I-C-5)
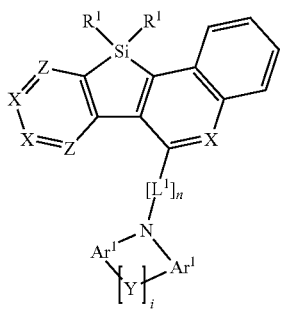

Formula (I-C-6)
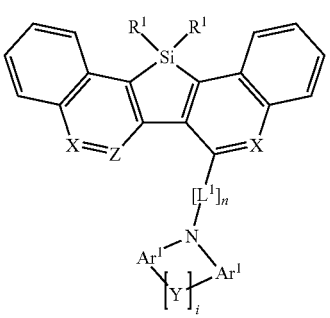

Formula (I-C-7)
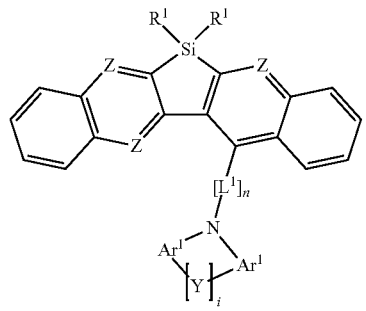

where the variables occurring are defined as above.

$R^3$ is selected, identically or differently at each occurrence, from H, D, F, ON, $N(R^4)_2$, straight-chain alkyl groups having 1 to 20 C atoms, branched or cyclic alkyl groups having 3 to 20 C atoms, aromatic ring systems having 6 to 40 aromatic ring atoms, and heteroaromatic ring systems having 5 to 40 aromatic ring atoms; where two or more radicals $R^3$ may be connected to each other to form a ring; and where the said alkyl groups and the said aromatic and heteroaromatic ring systems may in each case be substituted by one or more radicals $R^4$.

$R^4$ is selected, identically or differently at each occurrence, from H, D, F, CN, $N(R^5)_2$, straight-chain alkyl groups having 1 to 20 C atoms, branched or cyclic alkyl groups having 3 to 20 C atoms, aromatic ring systems having 6 to 40 aromatic ring atoms, and heteroaromatic ring systems having 5 to 40 aromatic ring atoms; where two or more radicals $R^4$ may be connected to each other to form a ring; and where the said alkyl groups and the said aromatic and heteroaromatic ring systems may in each case be substituted by one or more radicals $R^5$.

$Ar^1$ is preferably selected, identically or differently on each occurrence, from aromatic ring systems having 6 to 24 aromatic ring atoms, and from heteroaromatic ring systems having 5 to 24 aromatic ring atoms, each of which may be substituted by one or more radicals $R^3$. Particularly preferably, $Ar^1$ is selected from phenyl, biphenyl, branched terphenyl, non-branched terphenyl, branched quaterphenyl, non-branched quaterphenyl, fluorenyl, naphthyl, anthracenyl, pyridyl, quinolinyl, dibenzofuranyl, dibenzothiophenyl, carbazolyl, fluorenyl-phenylenyl, dibenzofuranyl-phenylenyl, dibenzothiophenyl-phenylenyl, phenanthrenyl und triphenylyl, each of which may be substituted by one or more radicals $R^3$.

Particularly preferably, $Ar^1$ is selected, identically or differently on each occurrence, from the following groups Ar1-1
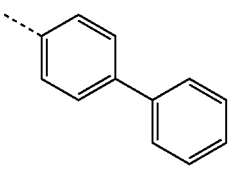

Ar1-3
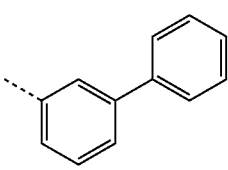

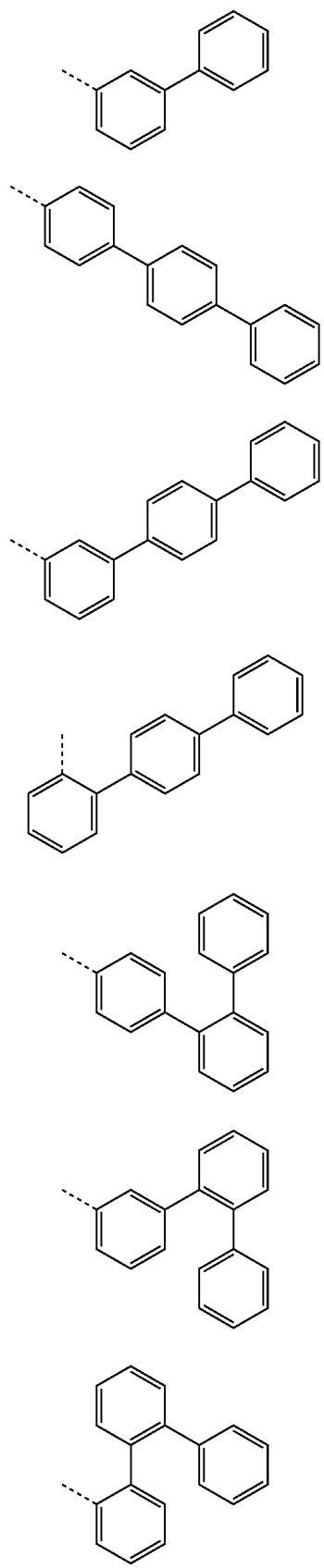

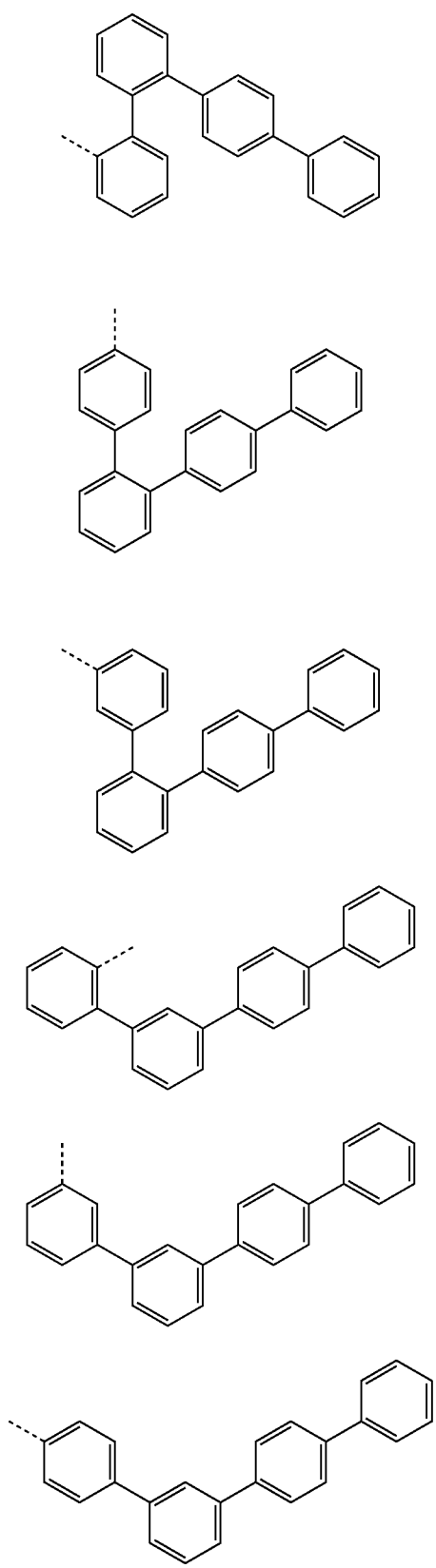
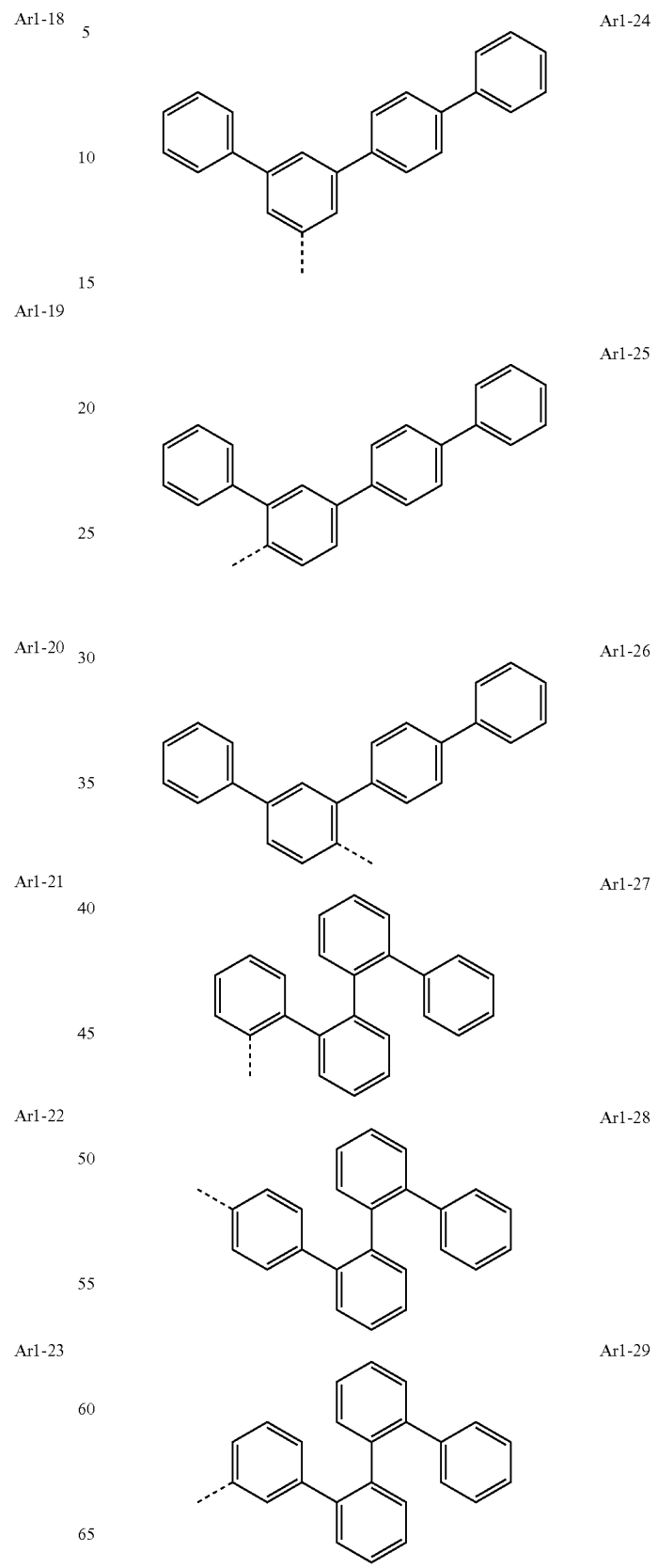

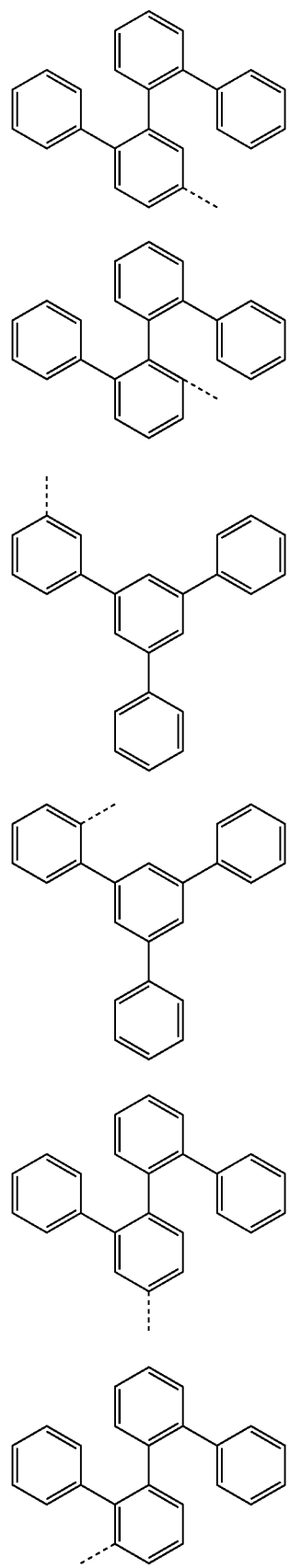
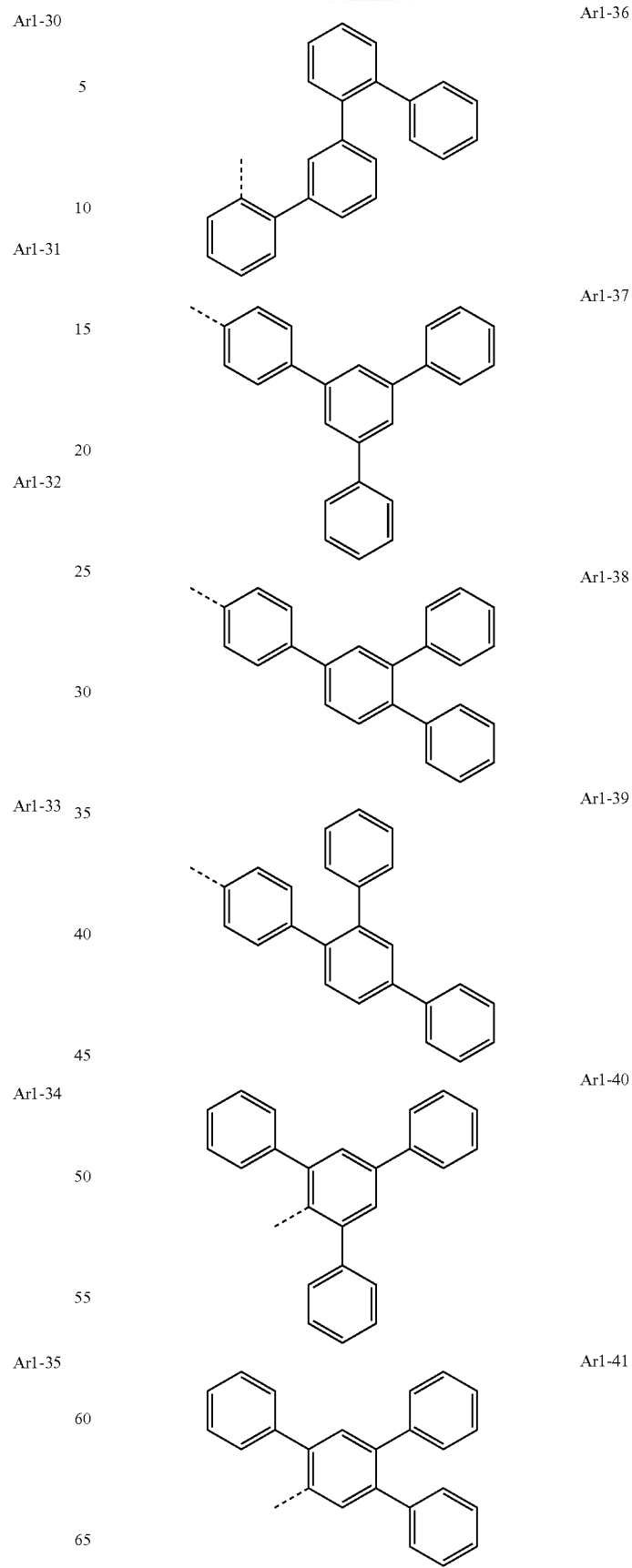

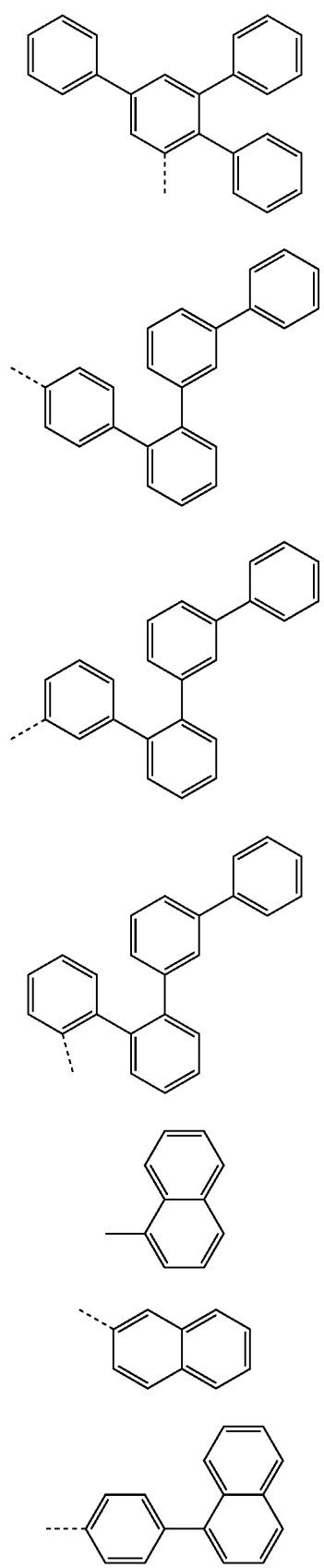
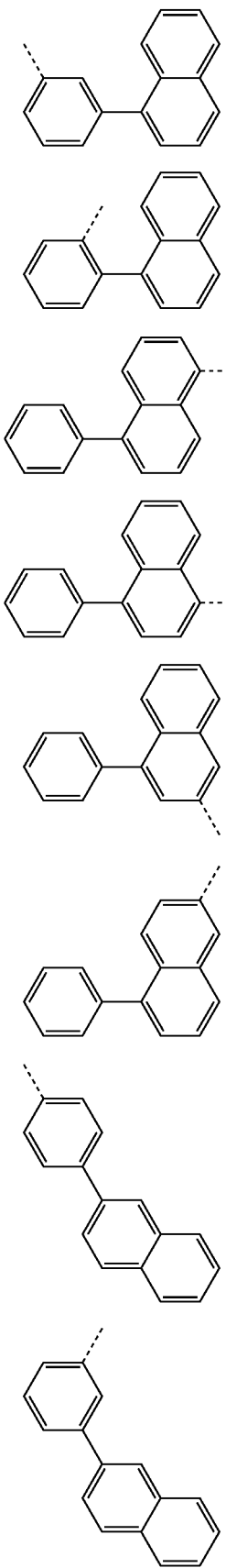

-continued
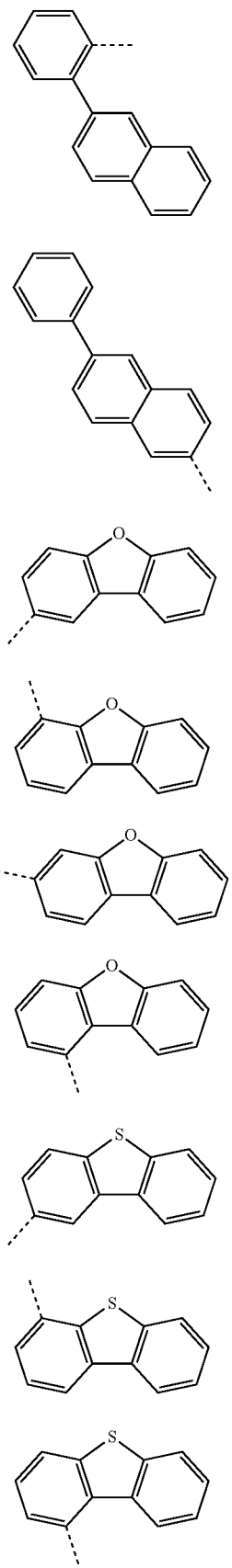
Ar1-57
Ar1-58
Ar1-59
Ar1-60
Ar1-61
Ar1-62
Ar1-63
Ar1-64
Ar1-65
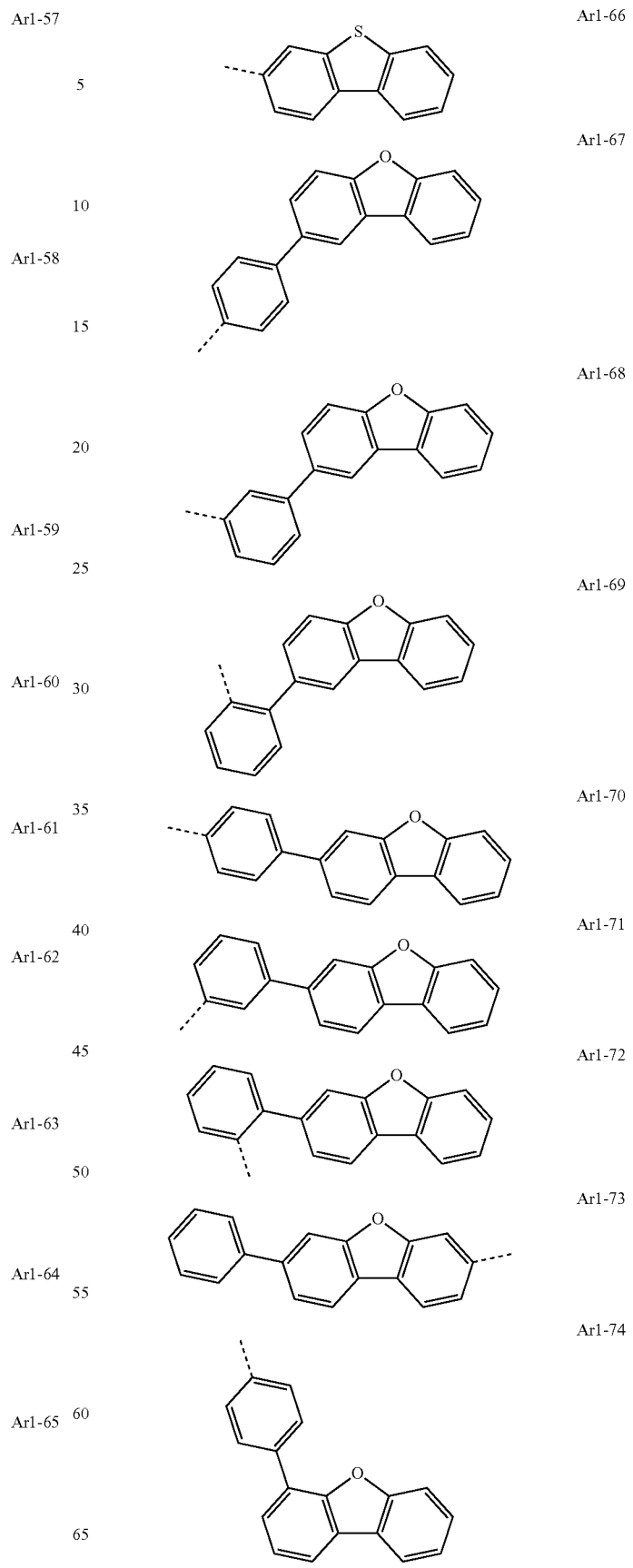
Ar1-66
Ar1-67
Ar1-68
Ar1-69
Ar1-70
Ar1-71
Ar1-72
Ar1-73
Ar1-74

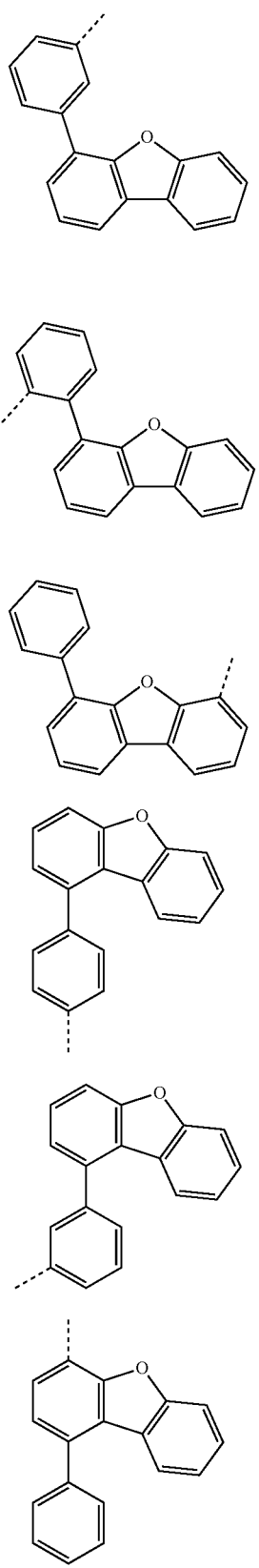
Ar1-75
Ar1-76
Ar1-77
Ar1-78
Ar1-79
Ar1-80
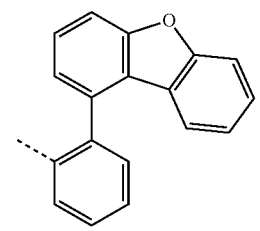
Ar1-81
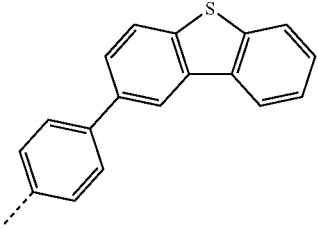
Ar1-82
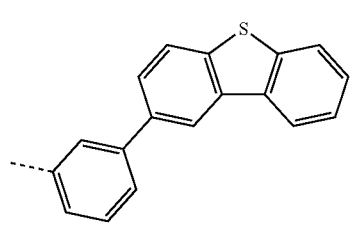
Ar1-83
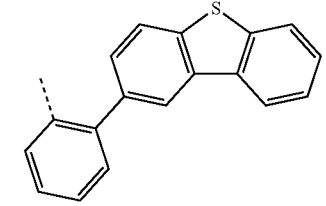
Ar1-84
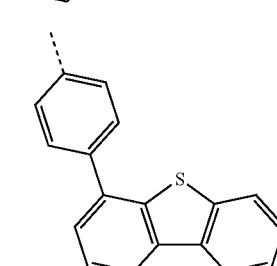
Ar1-85
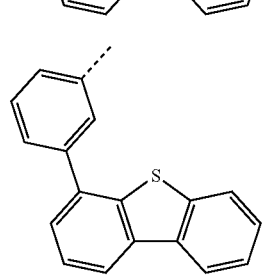
Ar1-86
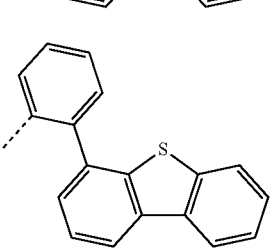
Ar1-87

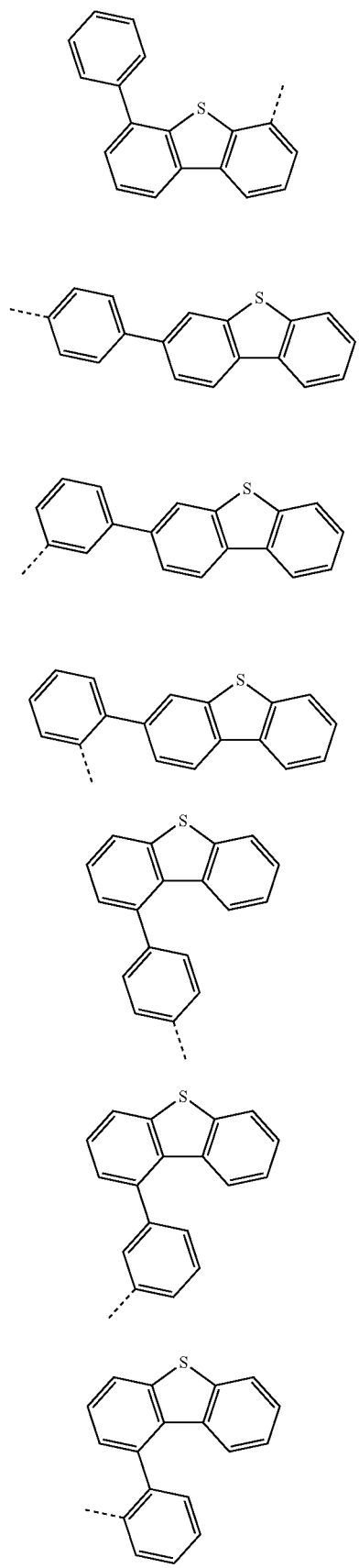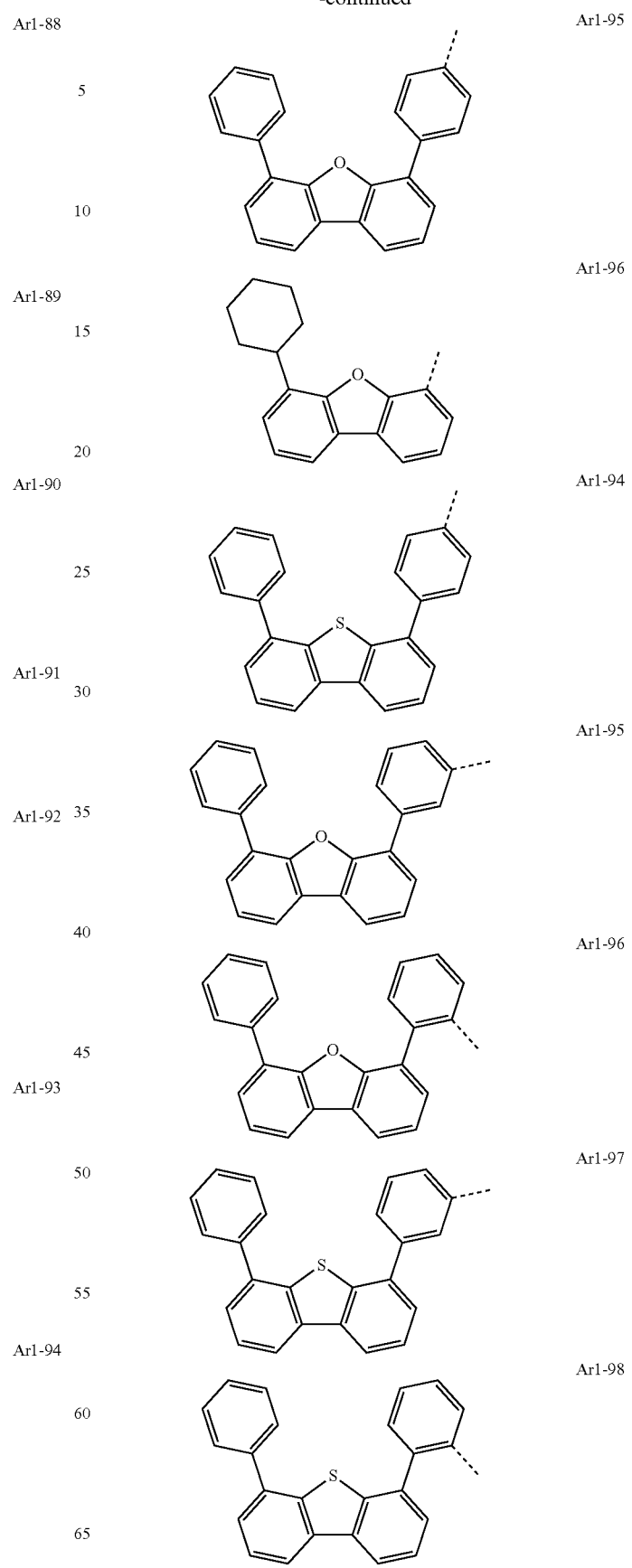

Ar1-99 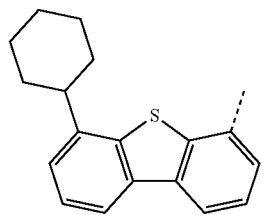
Ar1-100 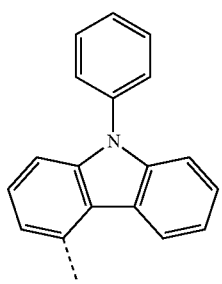
Ar1-101 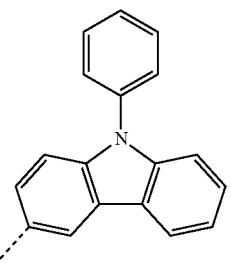
Ar1-102 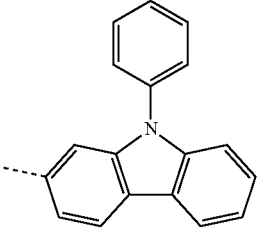
Ar1-103 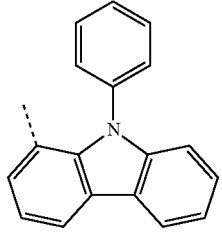
Ar1-104 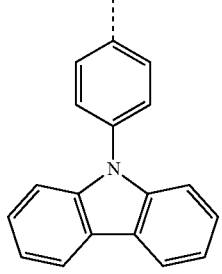
Ar1-105 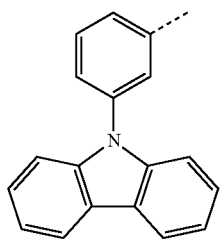
Ar1-106 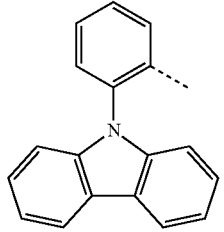
Ar1-107 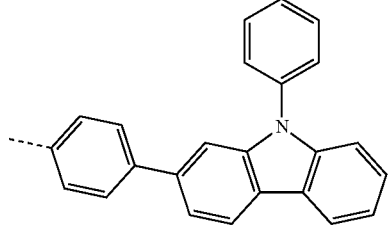
Ar1-108 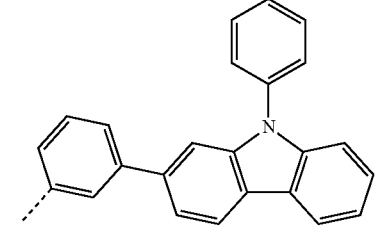
Ar1-109 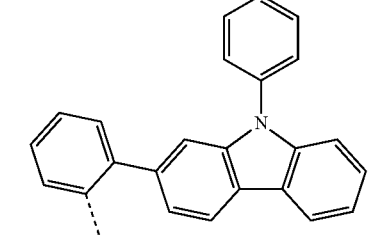
Ar1-110 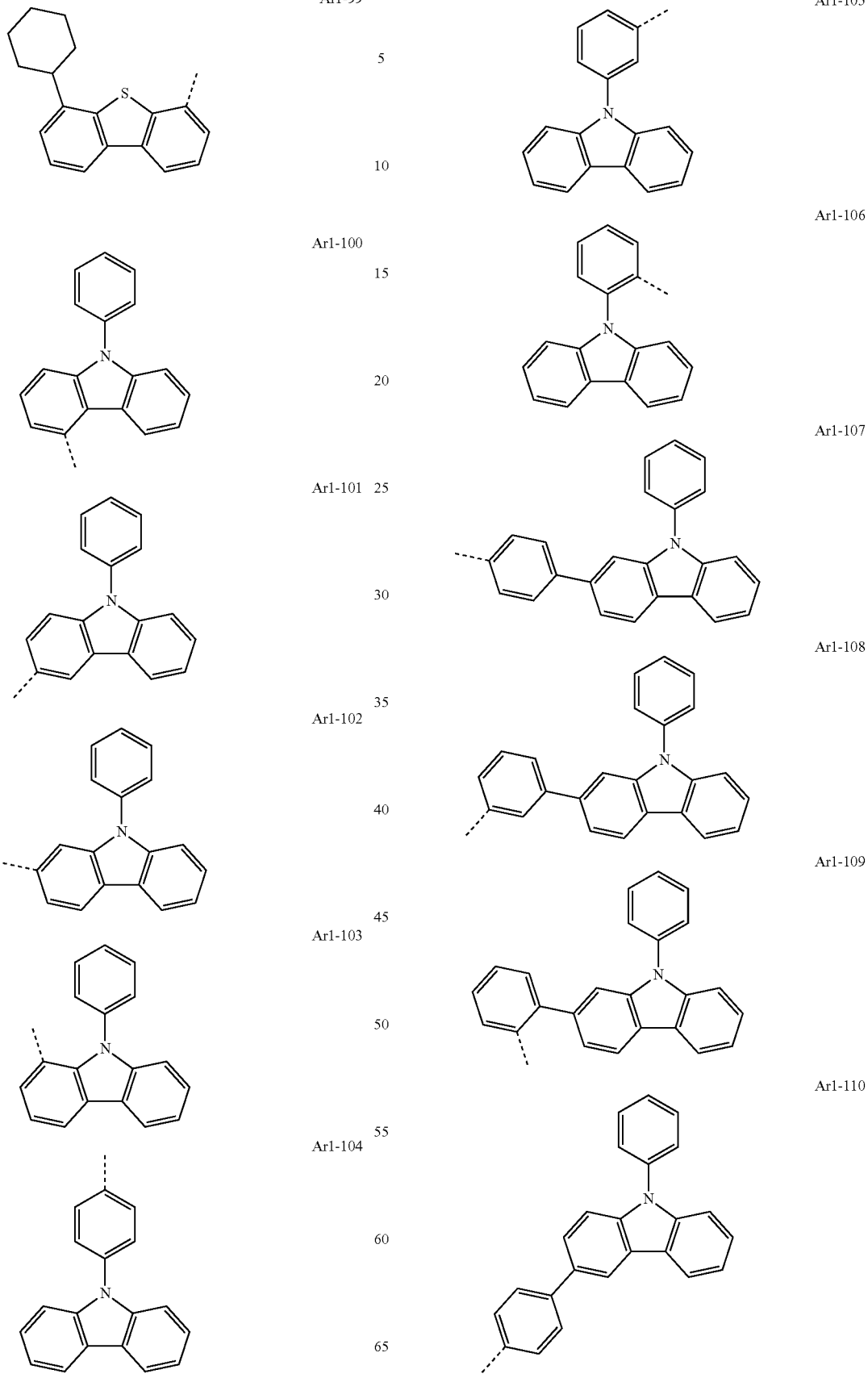

-continued
Ar1-111
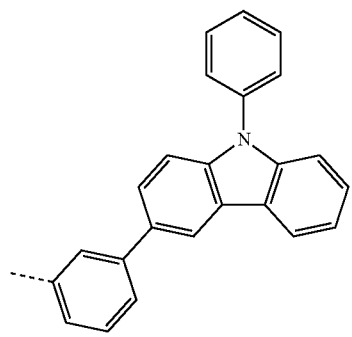
Ar1-112
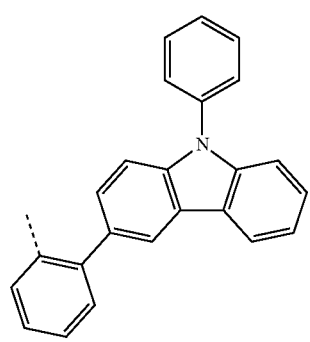
Ar1-113
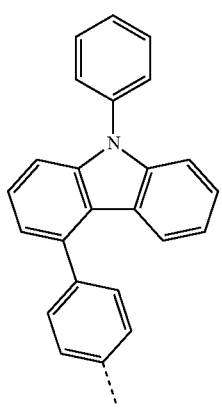
Ar1-114
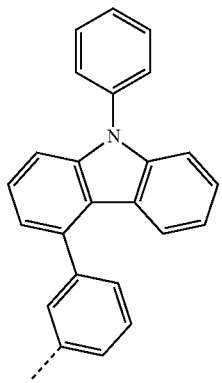
-continued
Ar1-115
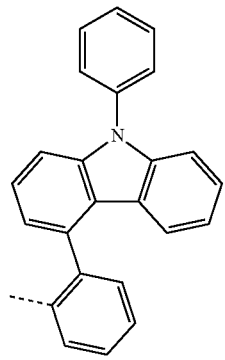
Ar1-116
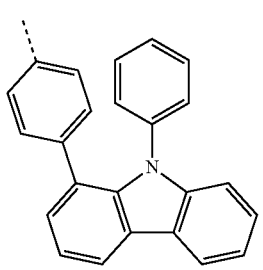
Ar1-117
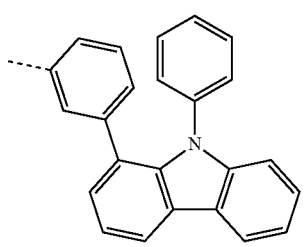
Ar1-118
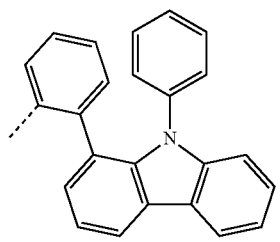
Ar1-119
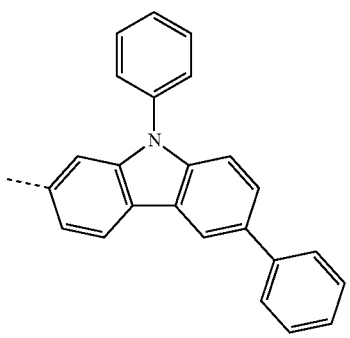

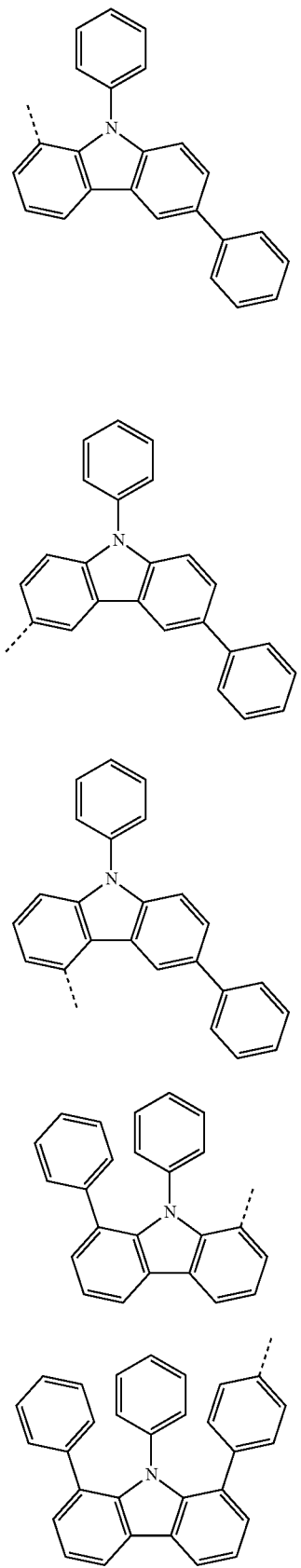
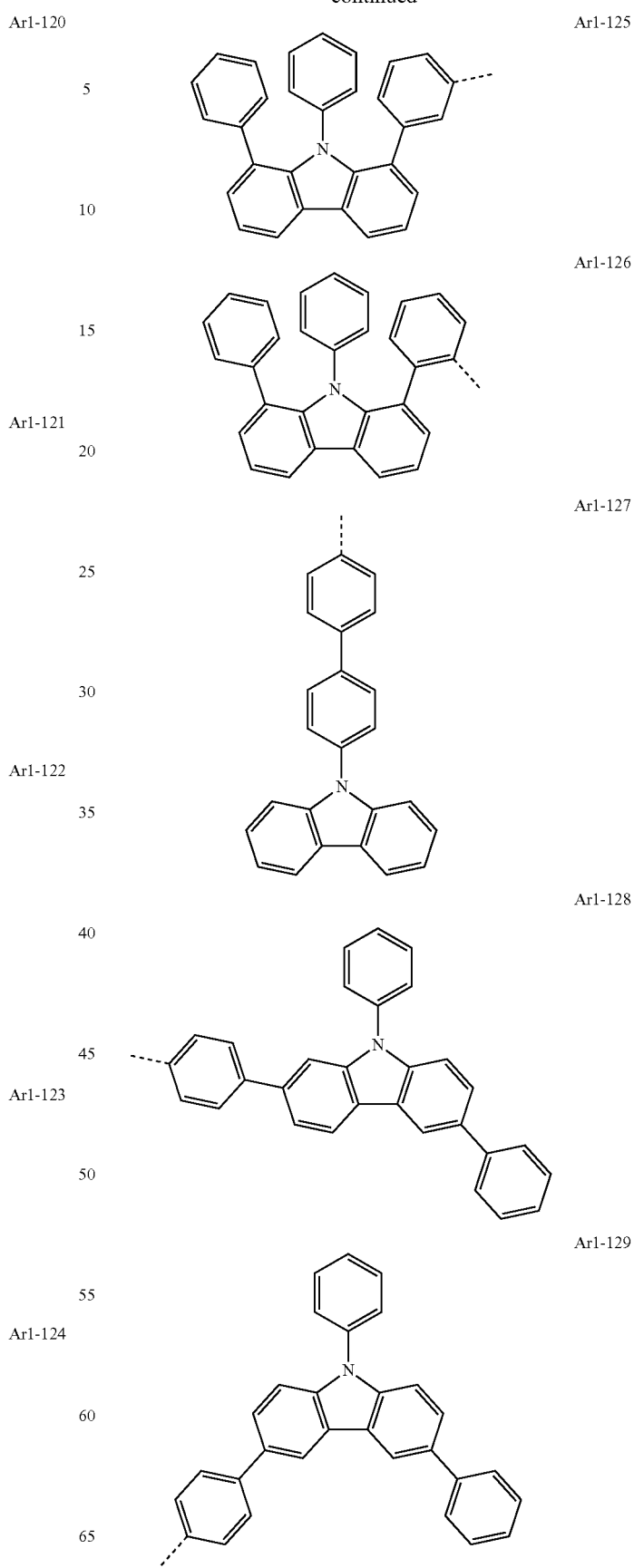

Ar1-130
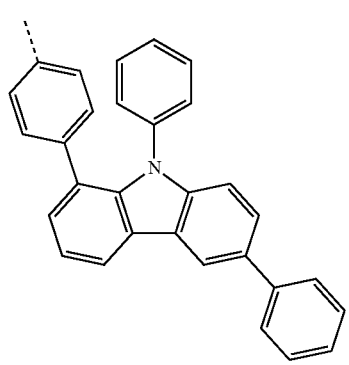
Ar1-131
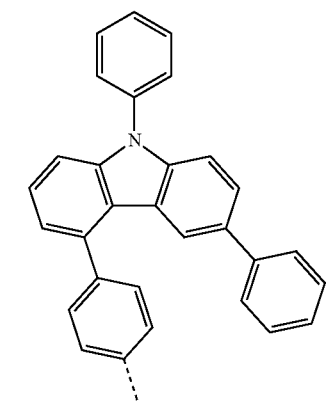
Ar1-132
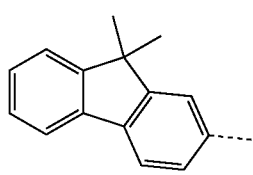
Ar1-133
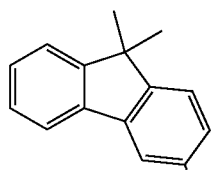
Ar1-134
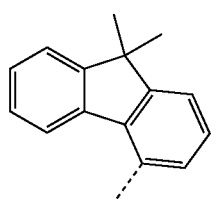
Ar1-135
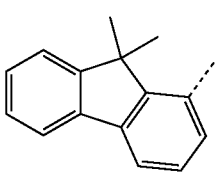
Ar1-136
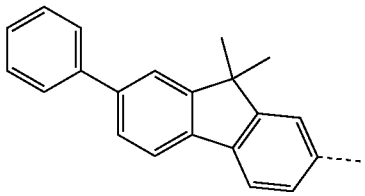
Ar1-137
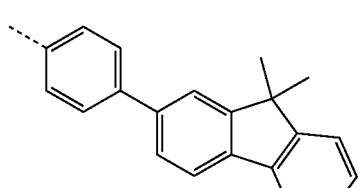
Ar1-138
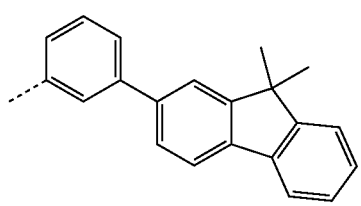
Ar1-139
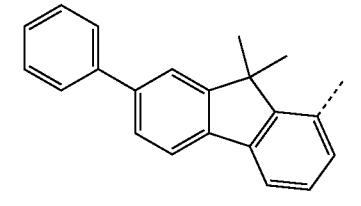
Ar1-140
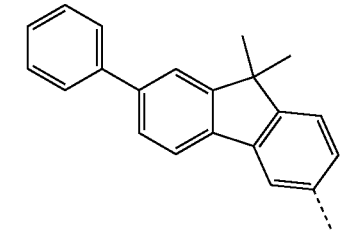
Ar1-141
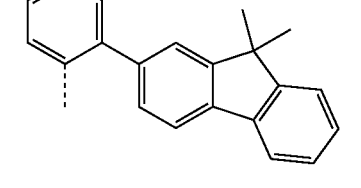
Ar1-142
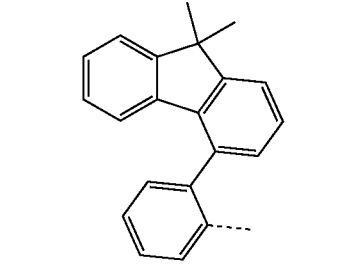

Ar1-143
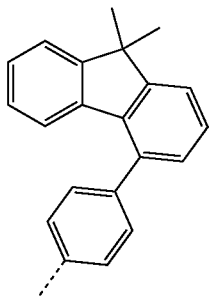
Ar1-144
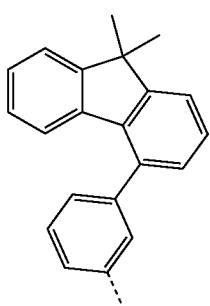
Ar1-145
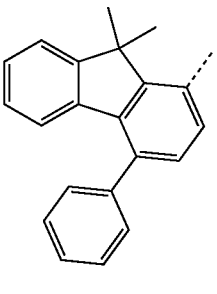
Ar1-146
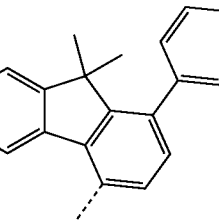
Ar1-147
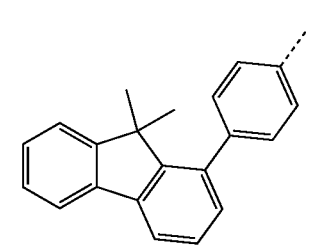
Ar1-148
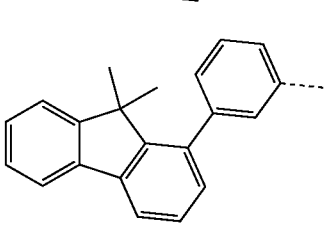
Ar1-149
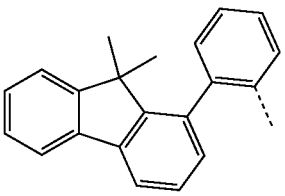
Ar1-150
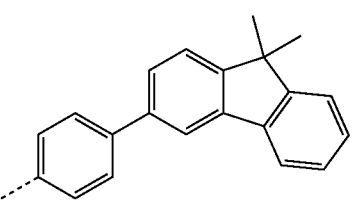
Ar1-151
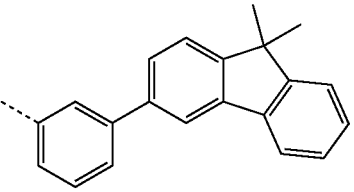
Ar1-152
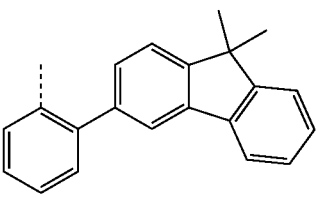
Ar1-153
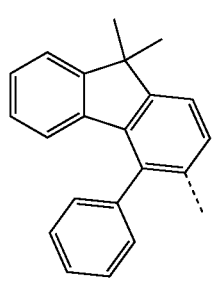
Ar1-154
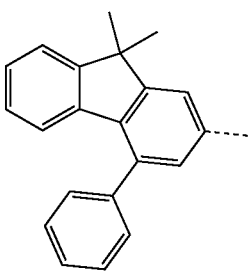
Ar1-155
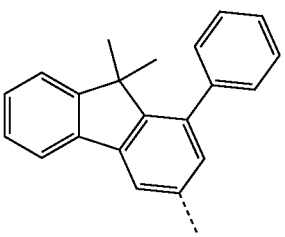

-continued
Ar1-156
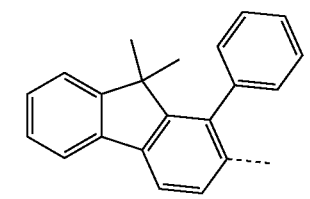
Ar1-157
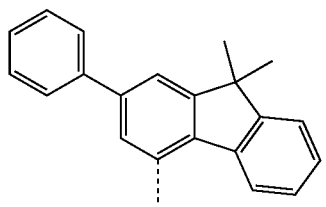
Ar1-158
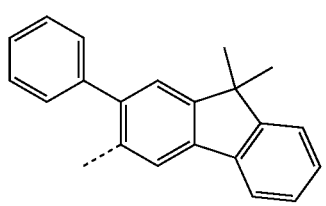
Ar1-159
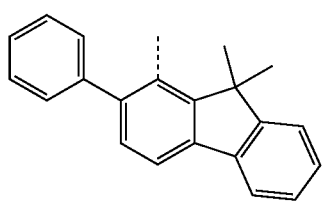
Ar1-160
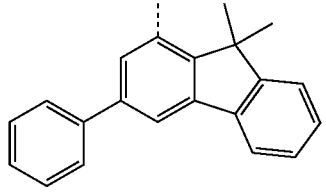
Ar1-161
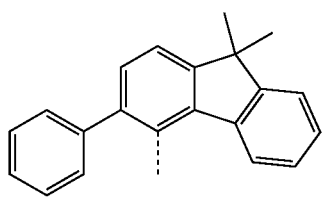
Ar1-162
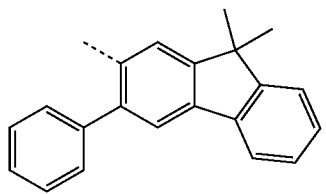
-continued
Ar1-163
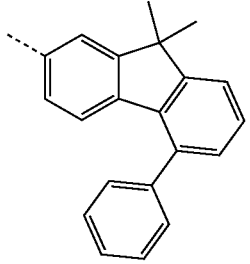
Ar1-164
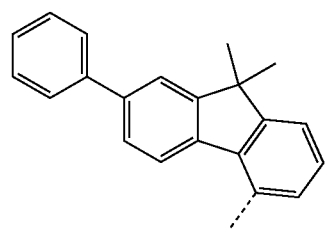
Ar1-165
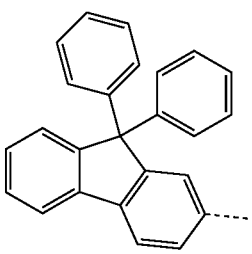
Ar1-166
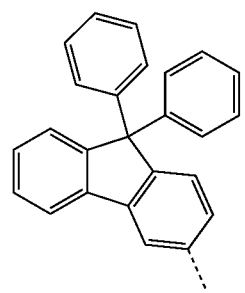
Ar1-167
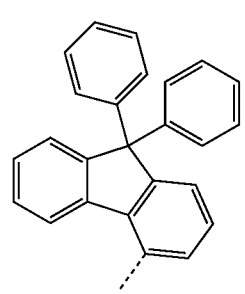
Ar1-168
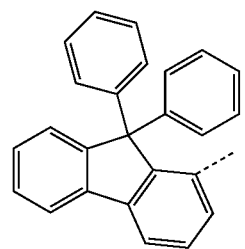

Ar1-169
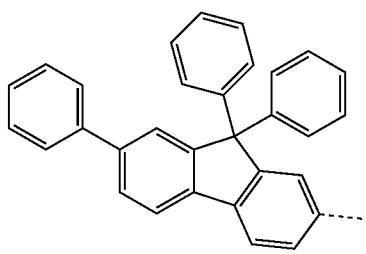
Ar1-170
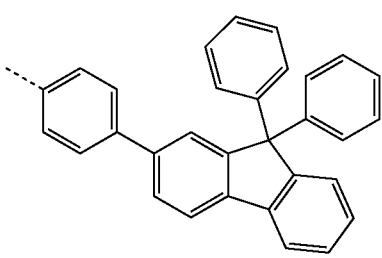
Ar1-171
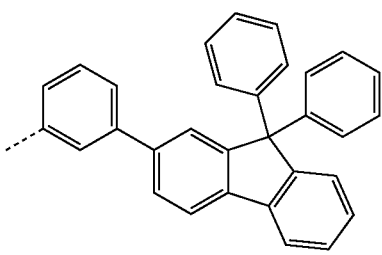
Ar1-172
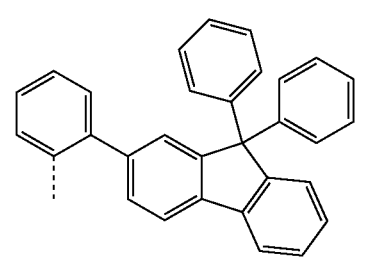
Ar1-173
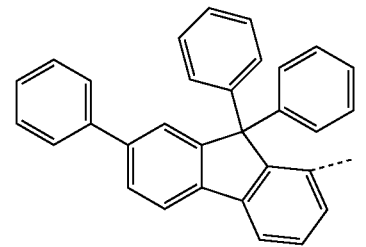
Ar1-174
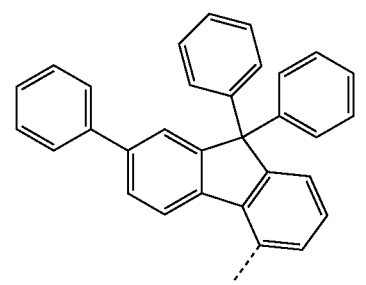
Ar1-175
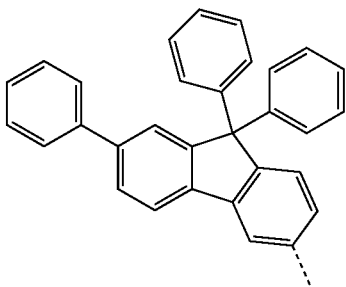
Ar1-176
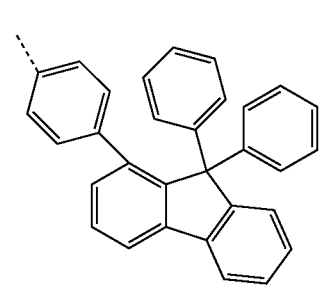
Ar1-177
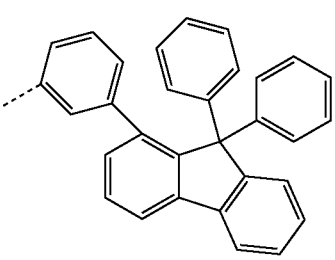
Ar1-178
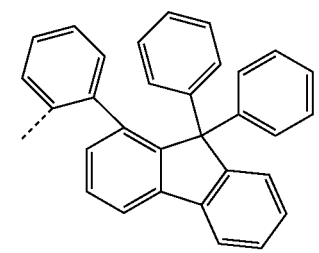
Ar1-179
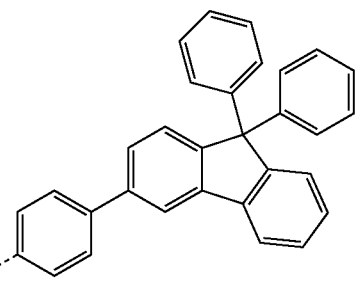

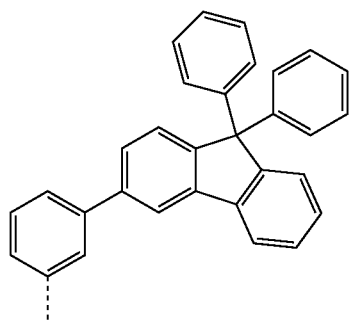 Ar1-180
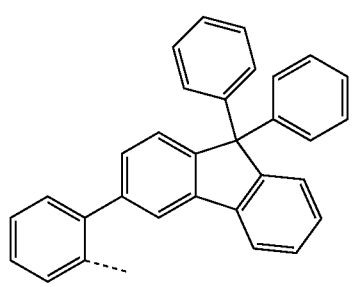 Ar1-181
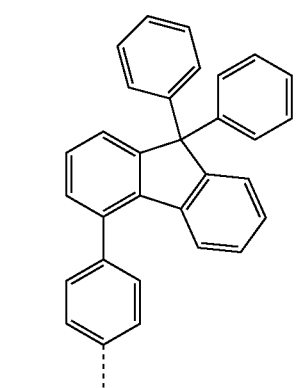 Ar1-182
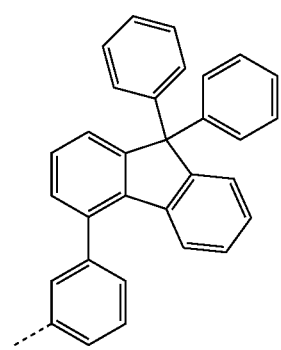 Ar1-183
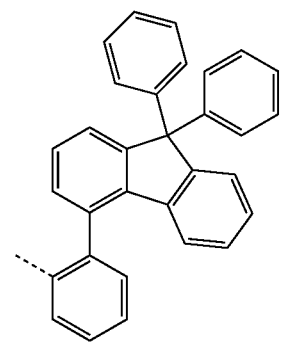 Ar1-184
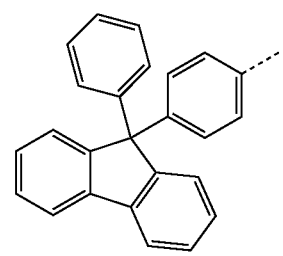 Ar1-185
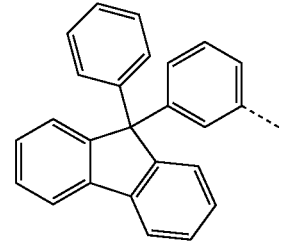 Ar1-186
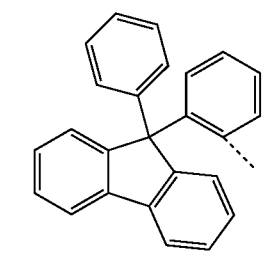 Ar1-187
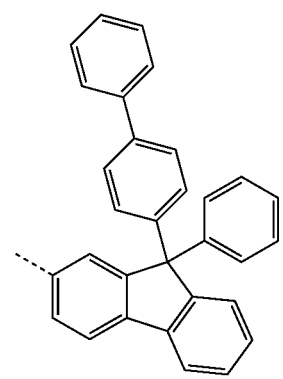 Ar1-188

-continued
Ar1-189
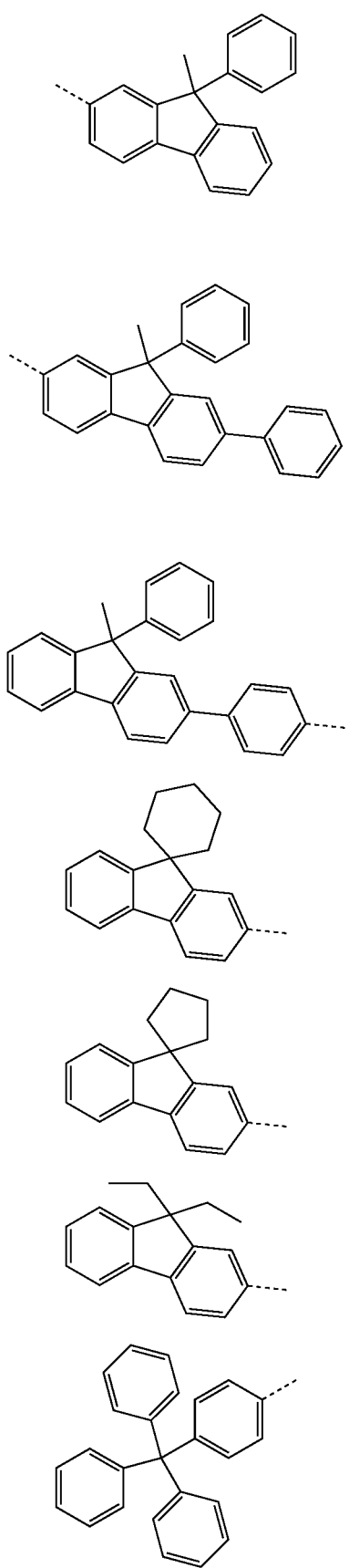
Ar1-190
Ar1-191
Ar1-192
Ar1-193
Ar1-194
Ar1-195
-continued
Ar1-196
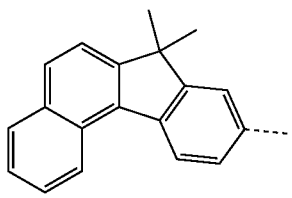
Ar1-197
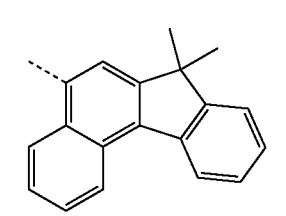
Ar1-198
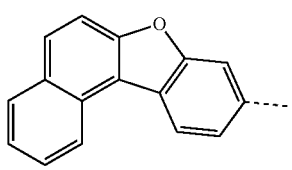
Ar1-199
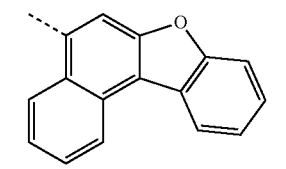
Ar1-200
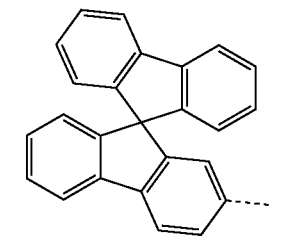
Ar1-201
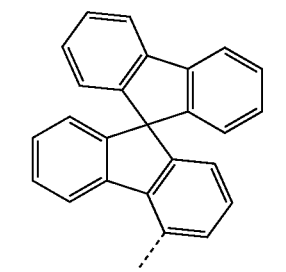
Ar1-202
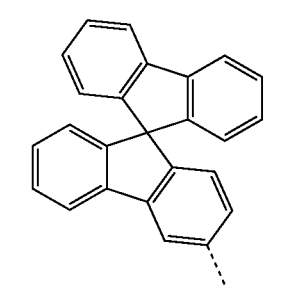

Ar1-203
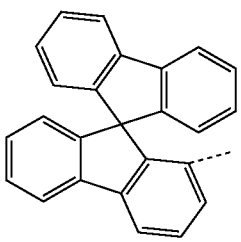
Ar1-204
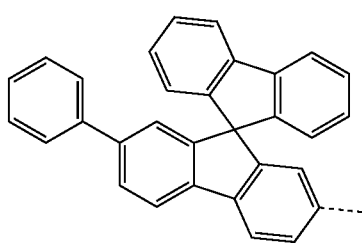
Ar1-205
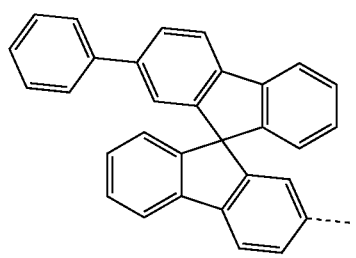
Ar1-206
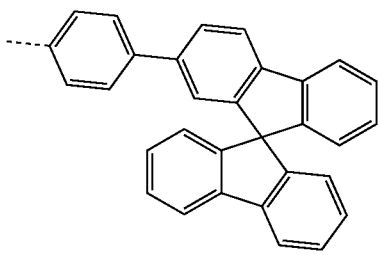
Ar1-207
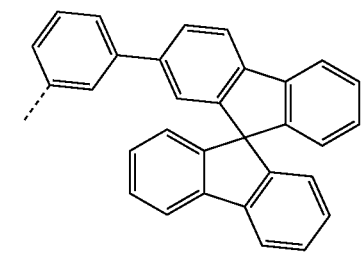
Ar1-208
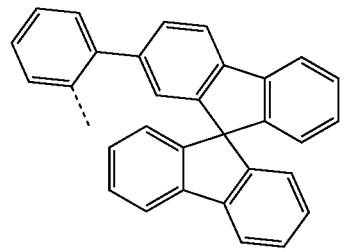
Ar1-209
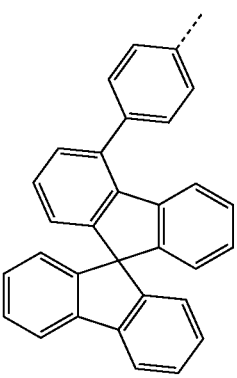
Ar1-210
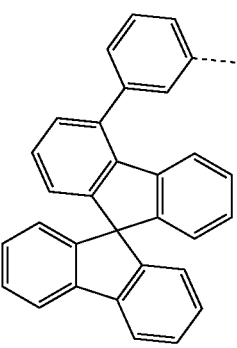
Ar1-211
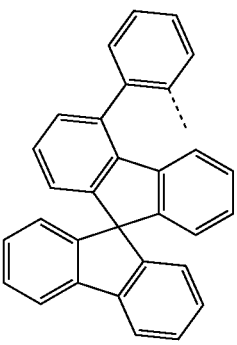
Ar1-212
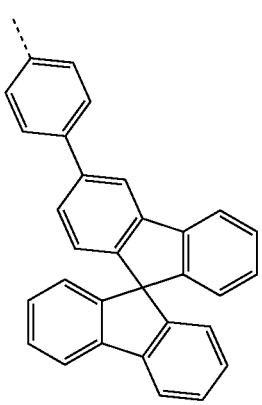

Ar1-213
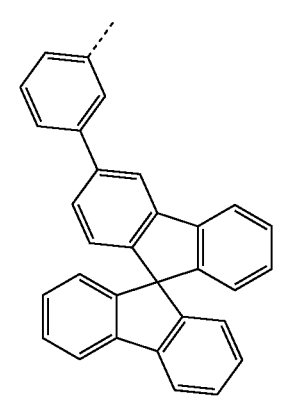
Ar1-214
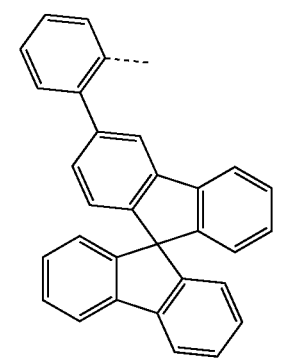
Ar1-215
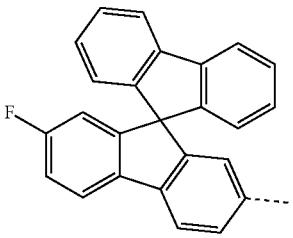
Ar1-216
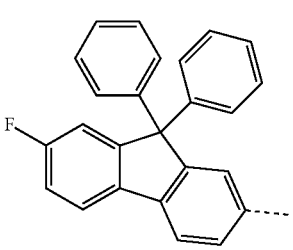
Ar1-217
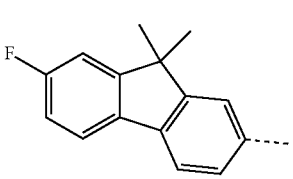
Ar1-218
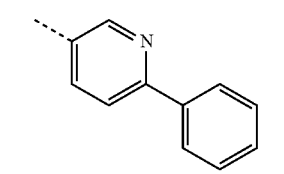
Ar1-219
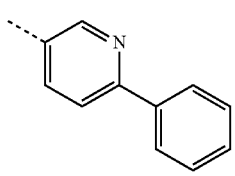
Ar1-220
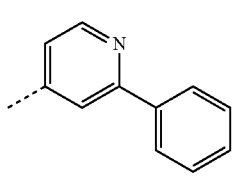
Ar1-221
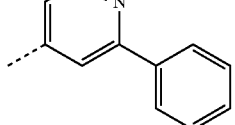
Ar1-222
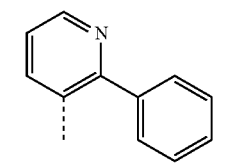
Ar1-223
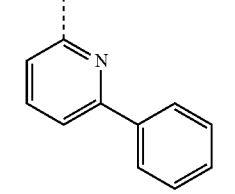
Ar1-224
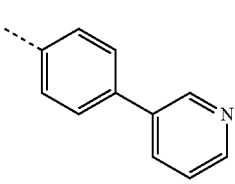
Ar1-225
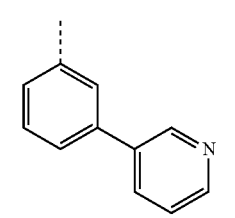
Ar1-226
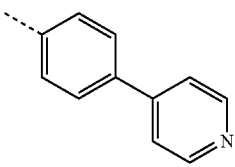

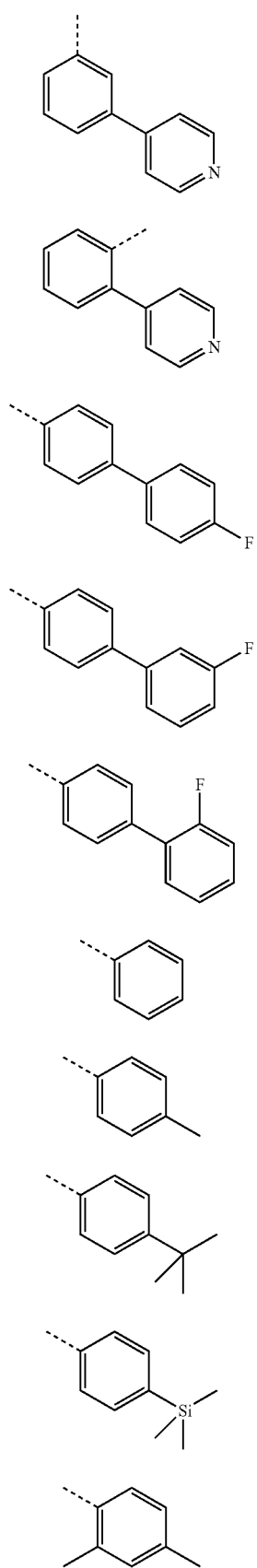
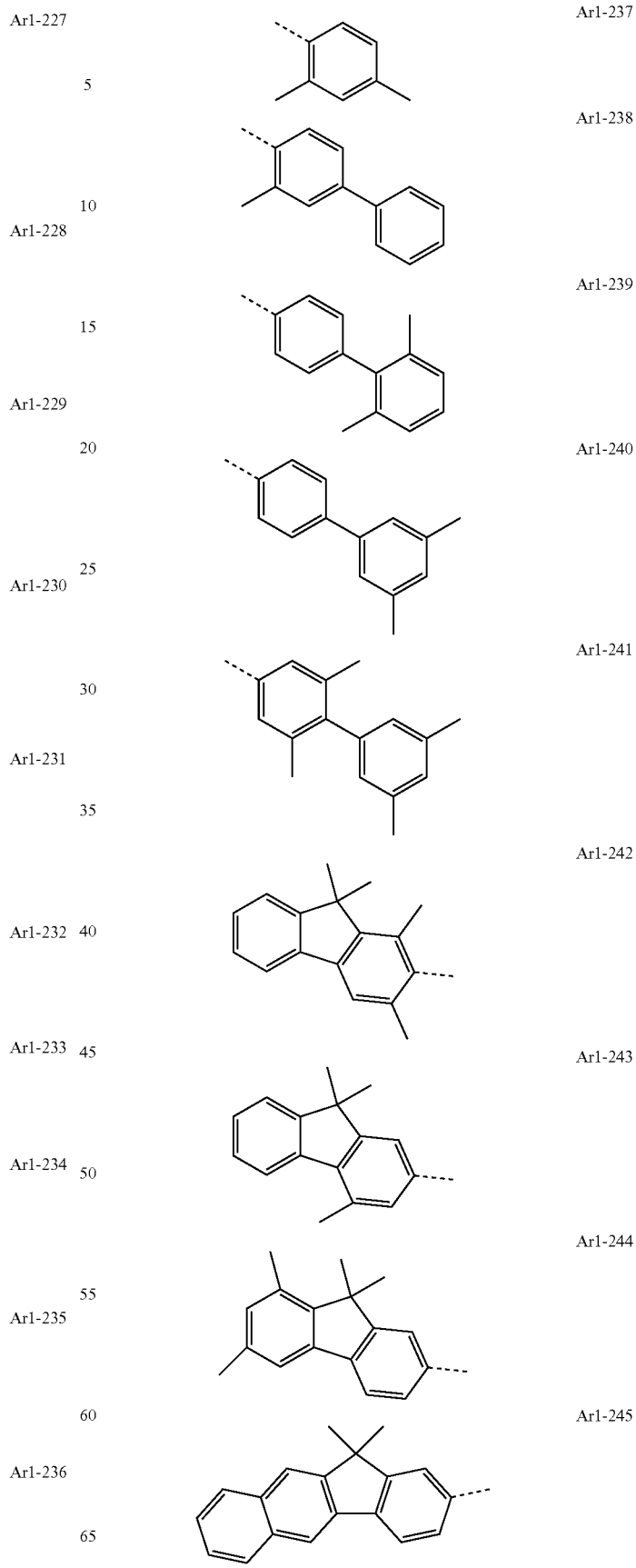

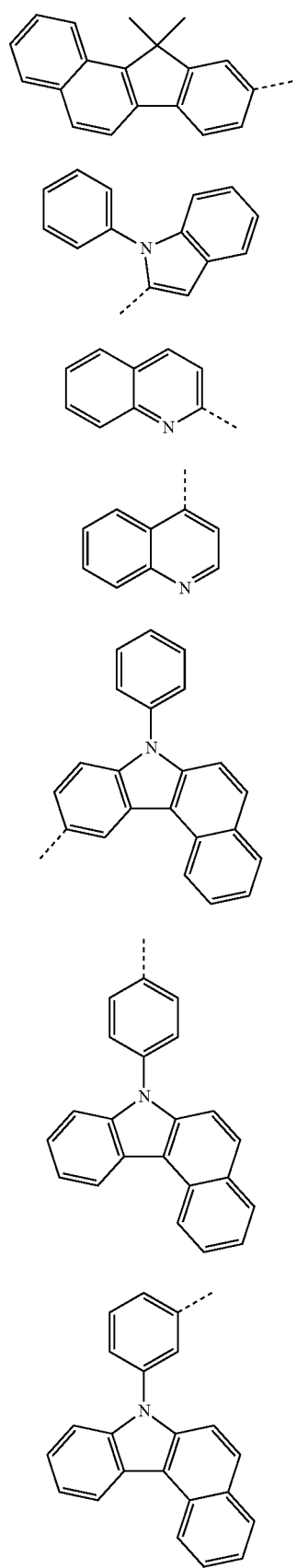
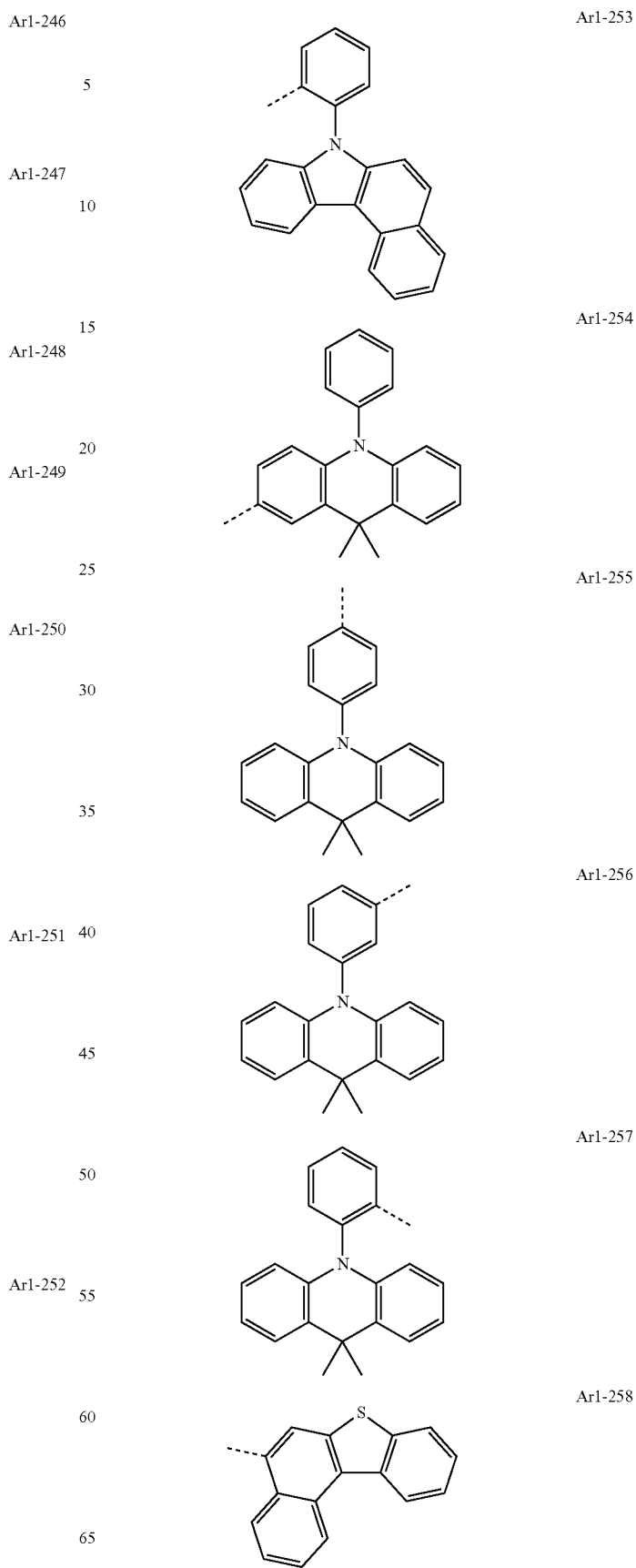

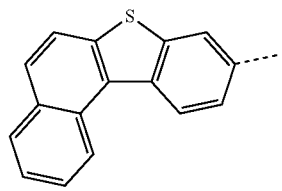
Ar1-259

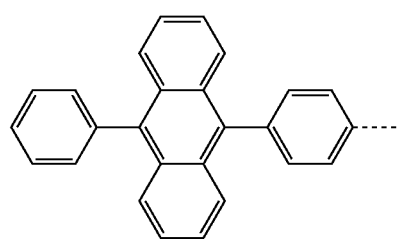
Ar1-260 which may be substituted with radicals R³ at the positions which are shown as unsubstituted above, but which are preferably unsubstituted in these positions, and which are bonded via the dotted bond to the rest of formula (A).

L¹ is preferably, identically or differently on each occurrence, selected from divalent groups derived from benzene, biphenyl, terphenyl, fluorene, spirobifluorene, indenofluorene, carbazole, dibenzofuran, and dibenzothiophene, each of which may be substituted by one or more radicals R³. Particularly preferably, L¹ is selected, identically or differently on each occurrence, from para-phenylene, meta-phenylene, orthophenylene, para-biphenylene, meta-biphenylene, and ortho-biphenylene, each of which may be substituted by one or more radicals R³.

L¹ is preferably, identically or differently on each occurrence, selected from the following groups:

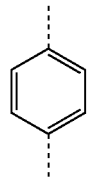
L-1

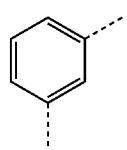
L-2

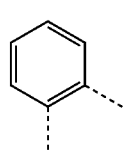
L-3

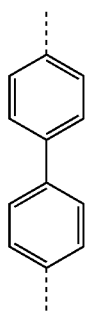
L-4

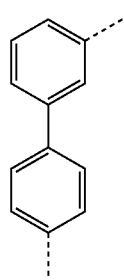
L-5

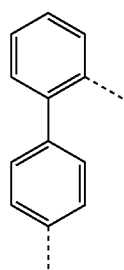
L-6

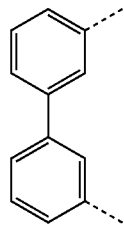
L-7

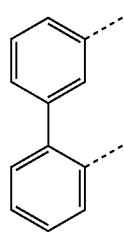
L-8

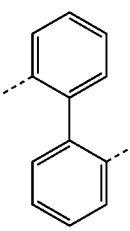
L-9

-continued
L-10 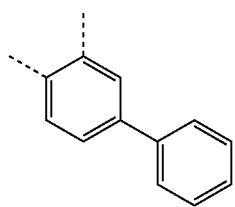
L-11 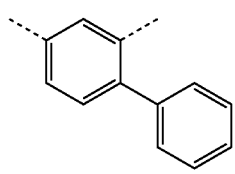
L-12 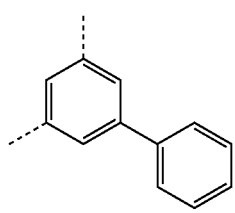
L-13 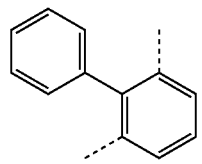
L-14 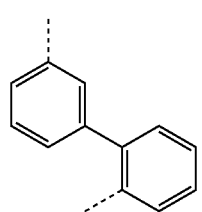
L-15 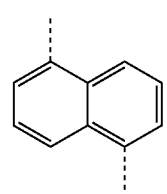
L-16 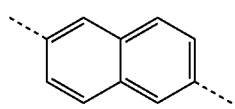
L-17 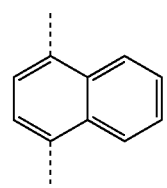
-continued
L-18 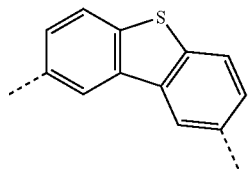
L-19 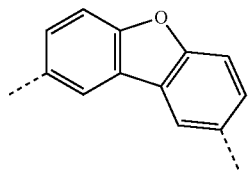
L-20 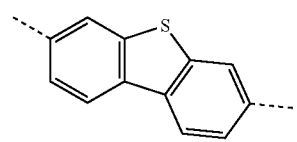
L-21 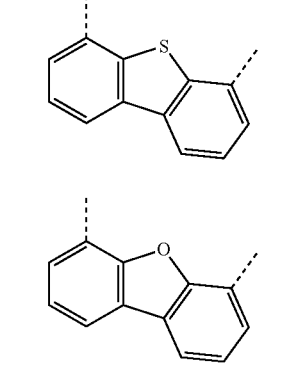
L-22 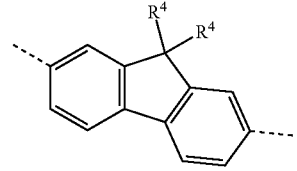
L-23 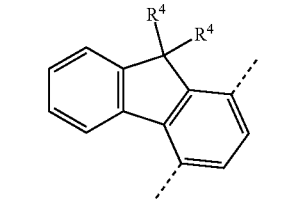
L-24 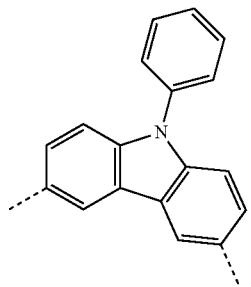
L-25

-continued

L-26 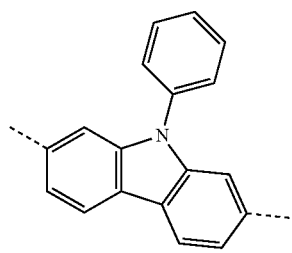

L-27 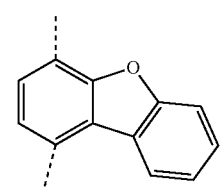

L-28 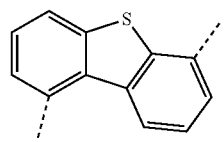

L-29 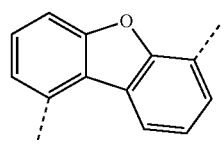

L-30 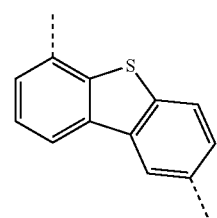

L-31 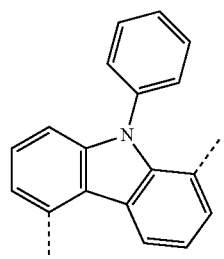

L-32 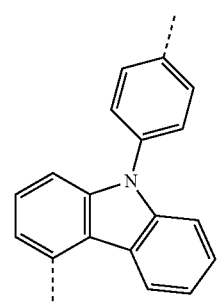

-continued

L-33 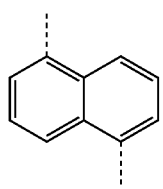

L-34 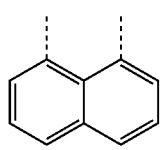

L-35 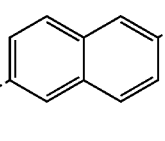

L-36 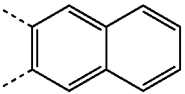

where the dotted bonds are the bonds to the rest of the formula (A), and where the groups may be substituted at each free position by a radical $R^3$, but are preferably unsubstituted at these positions.

Preferably, index n is 0 or 1, most preferably 0. Compounds of formula (I) where n is 0 have a lower HOMO, making them particularly suitable for use as electron blocking material.

Y is preferably a single bond, $C(R^3)_2$, $NR^3$, O or S, more preferably a single bond.

Index i is preferably 0.

Preferred embodiments of the compounds according to the invention conform to one of formulae (I-1) to (I-6)

Formula (I-1)
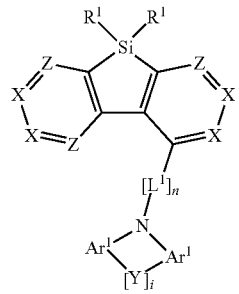

Formula (I-2)
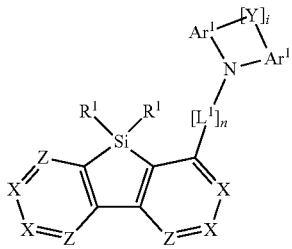

-continued

Formula (I-3)

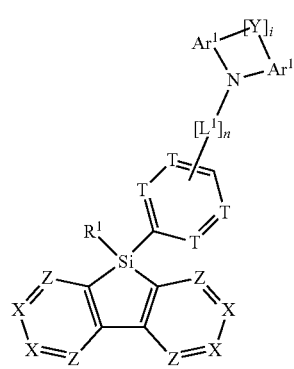

Formula (I-4)

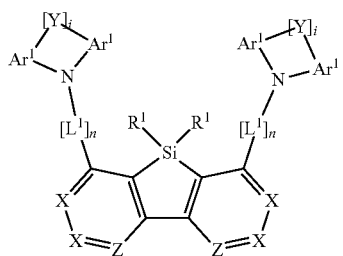

Formula (I-5)

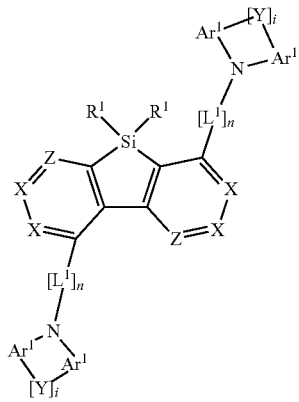

Formula (I-6)

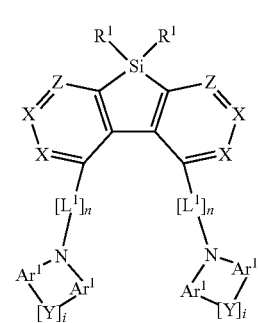

where the variables occurring are defined as above, and where radicals$^A$ are not replaced by groups according to formula (A), and where hydrogen atoms or substituents $R^4$ of groups $R^1$ are not replaced by groups according to formula (A), and where for formula (I-3), T is, identically or differently on each occurrence, $CR^4$ or N or C, where T is C only in the case where a group $-[L^1]_n-N(Ar^1)_2$ is bonded to this T.

In formula (I-3), preferably, T is $CR^4$ or C, where T is C only in the case where a group $-[L^1]_n-N(Ar^1)_2$ is bonded to this T. Furthermore, preferably, in formula (I-3), Z is preferably $CR^4$. Furthermore, preferably, in formula (I-3), X is $CR^2$.

Preferably, for the formulae (I-1) to (I-6) above, the preferred embodiments of the variables apply. Particularly preferably, Z is $CR^4$. Furthermore, particularly preferably, X is $CR^2$.

Preferred among formulae (I-1) to (I-6) are formulae (I-1) and (I-2), particularly preferred is formula (I-1).

Preferred compounds according to formula (I) are shown in the following:

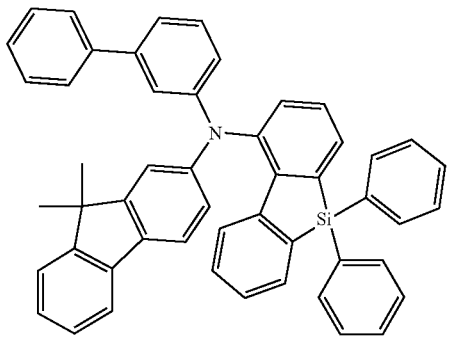

1

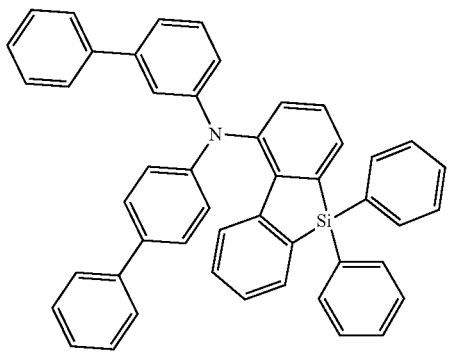

2

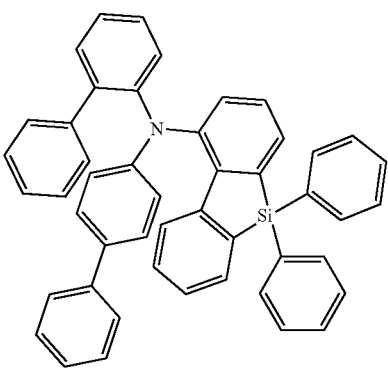

3

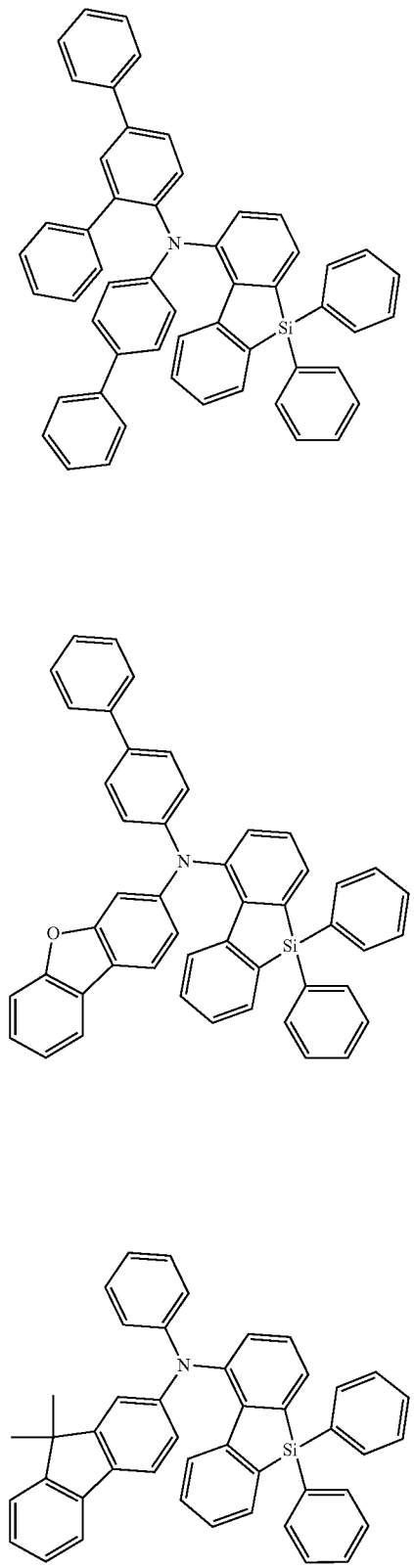
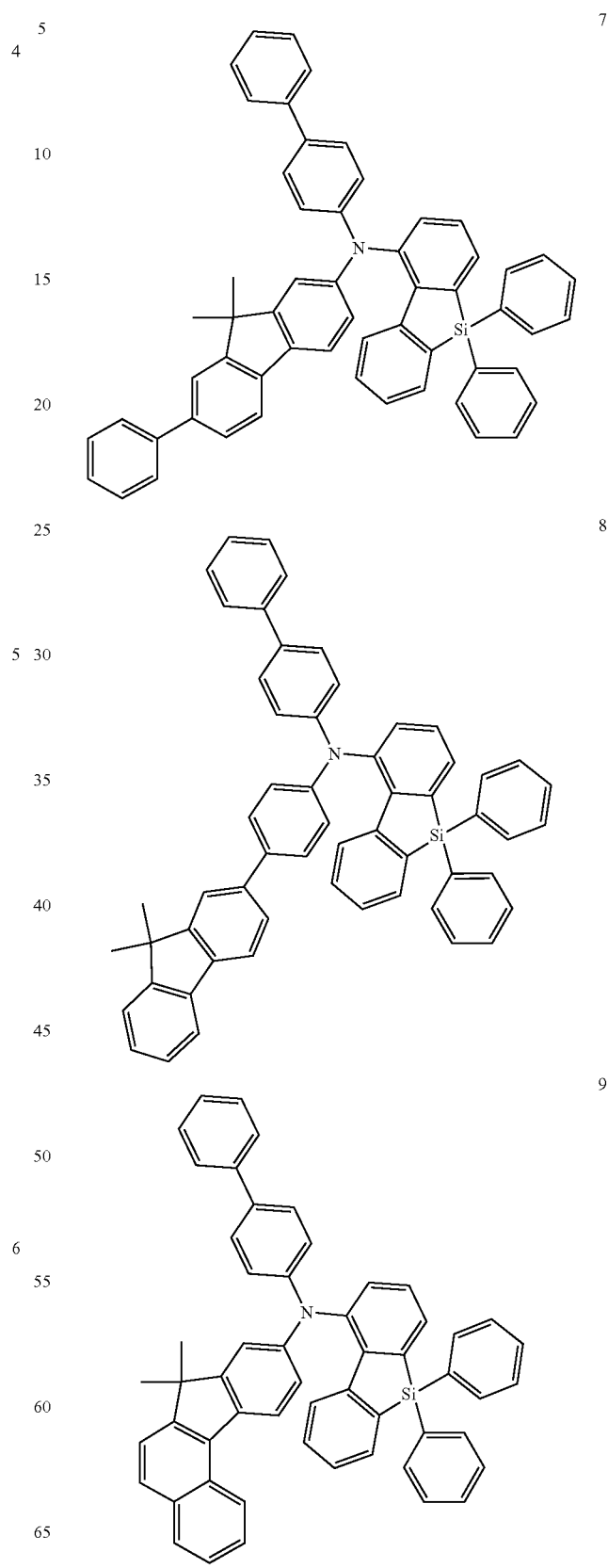

10
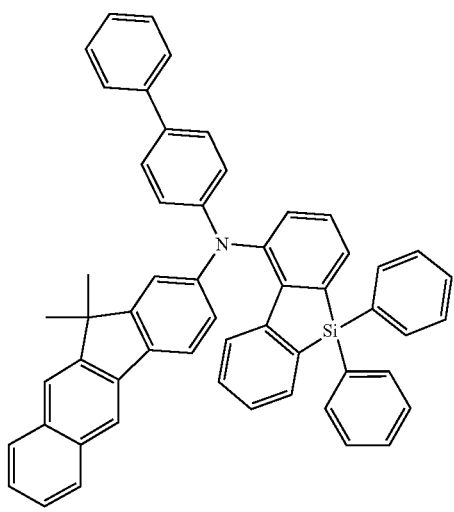
11
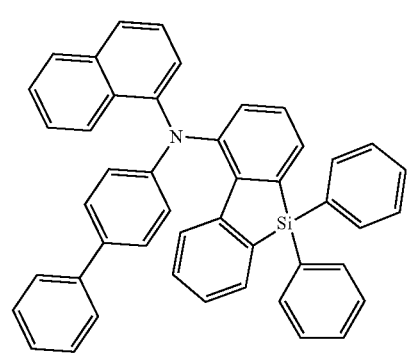
12
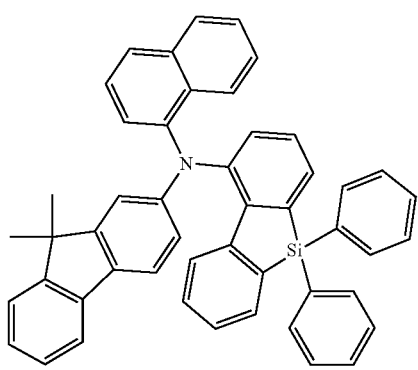
13
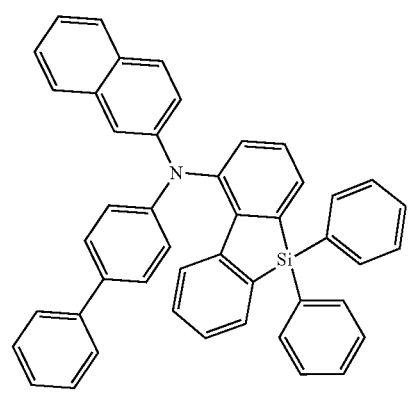
14
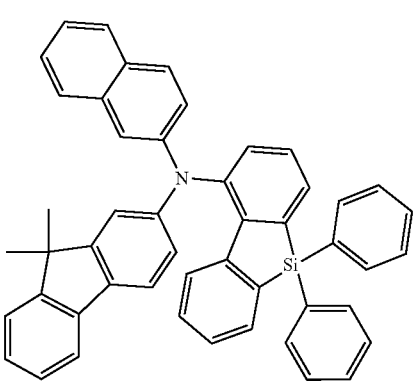
15
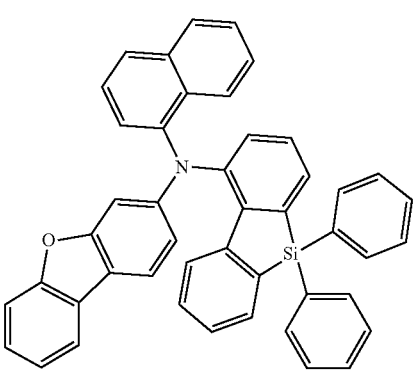
16
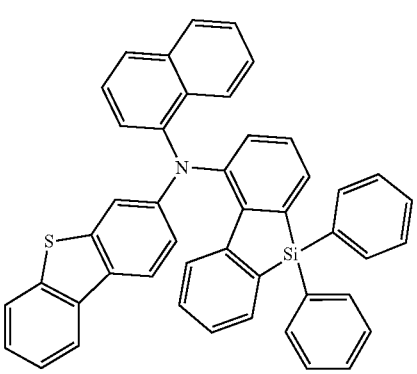
17
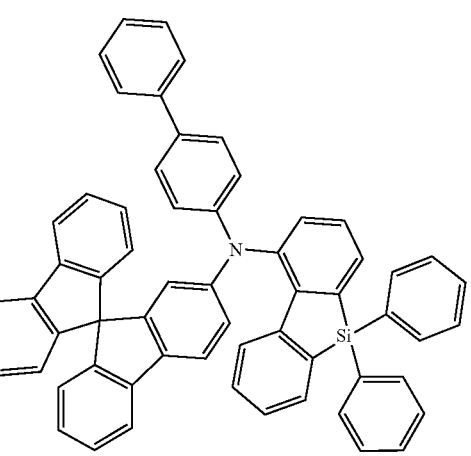

18
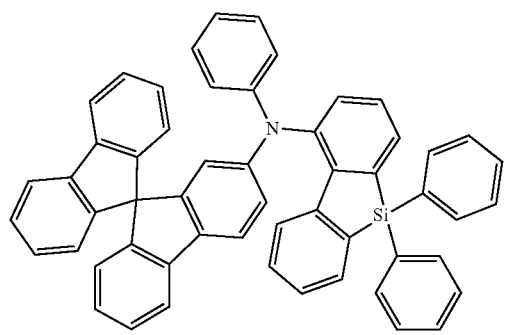
19
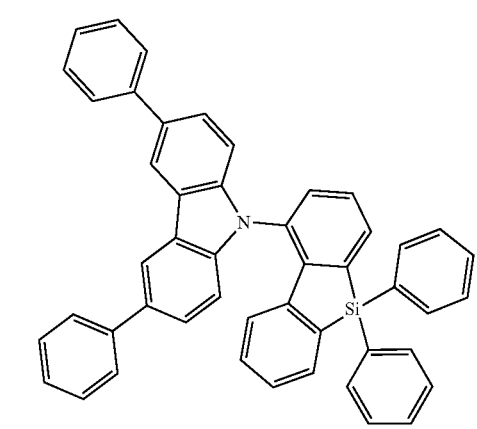
20
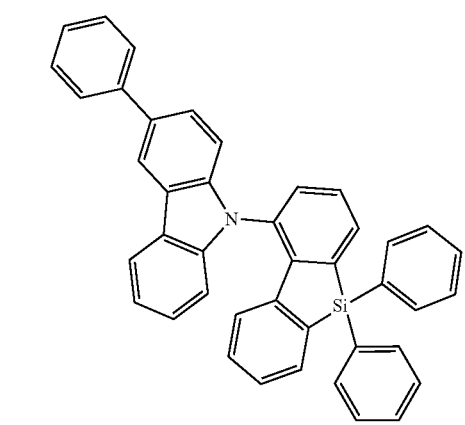
21
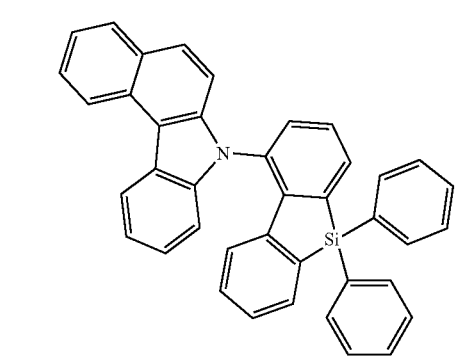
5
22
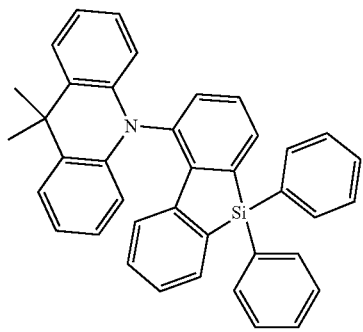
23
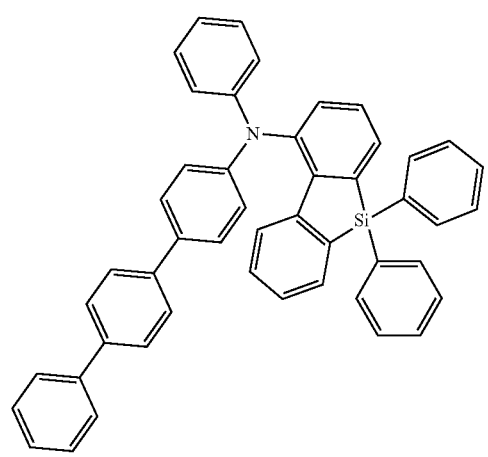
24
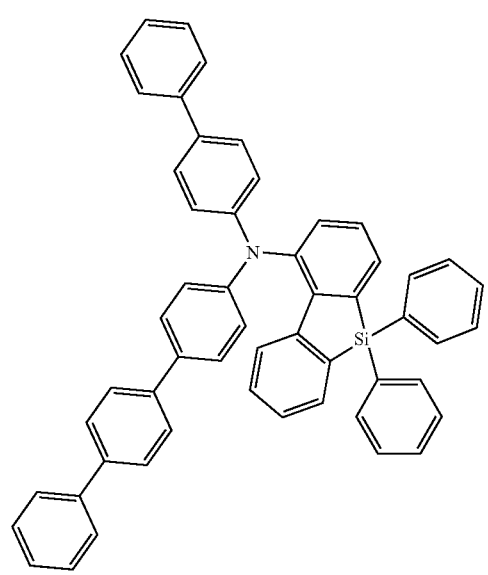

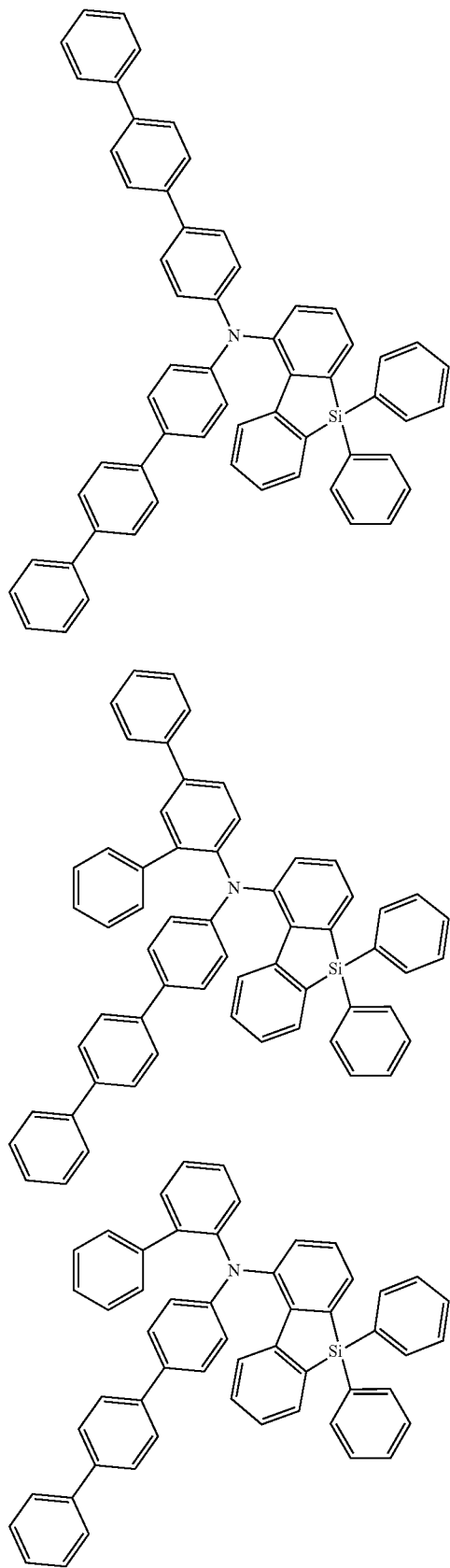
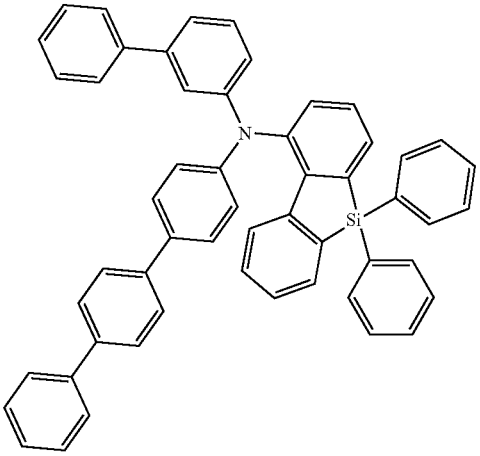
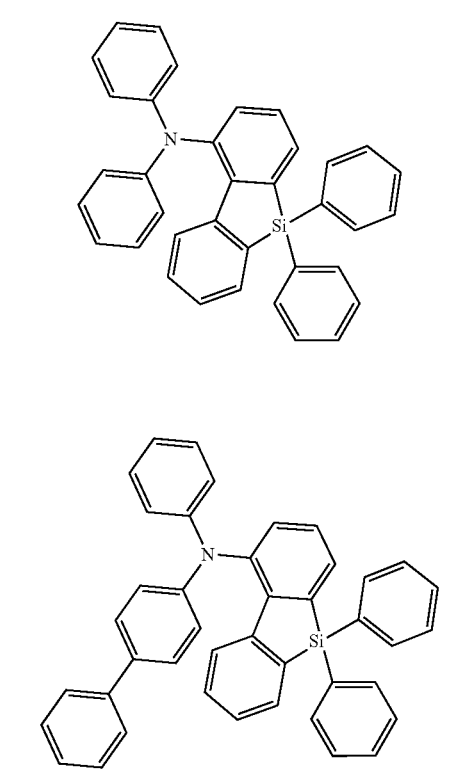

32
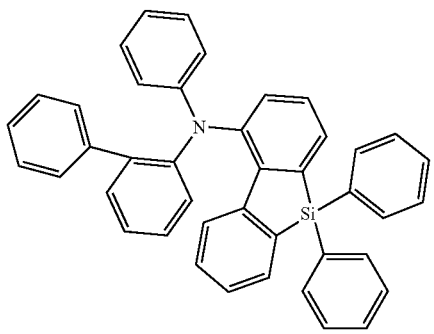
33
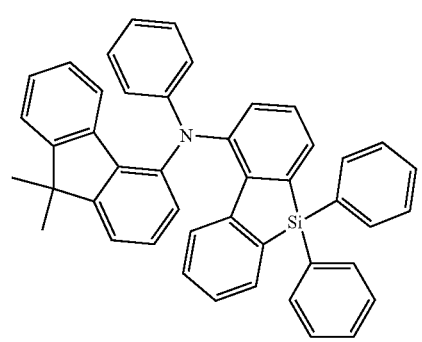
34
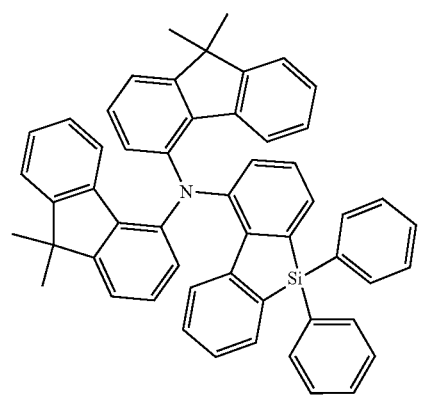
35
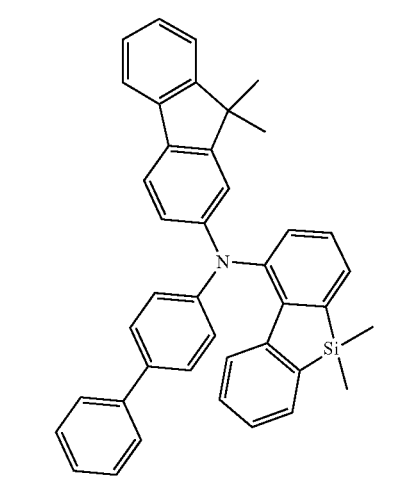
36
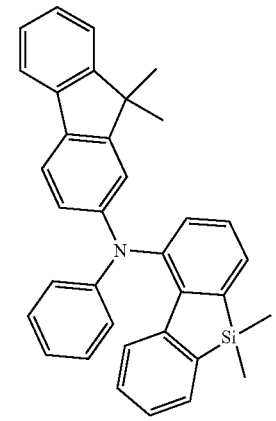
37
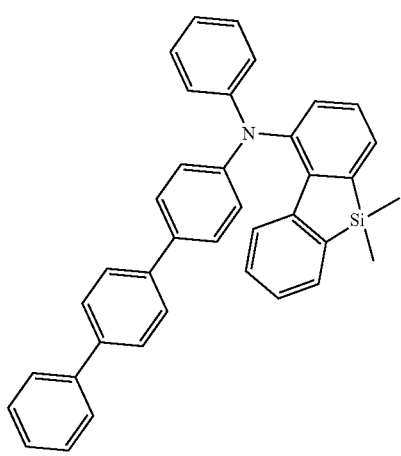
38
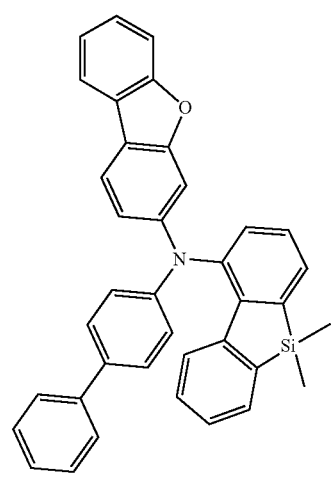

39
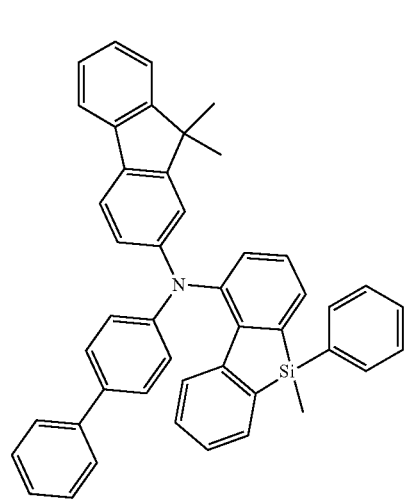
40
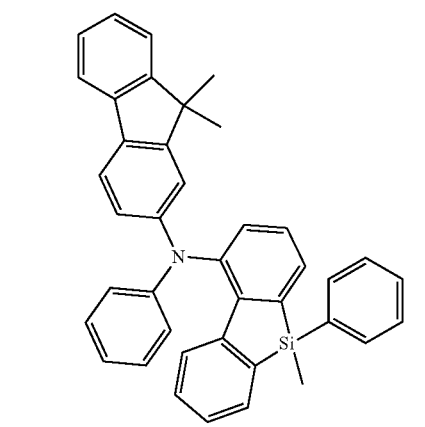
41
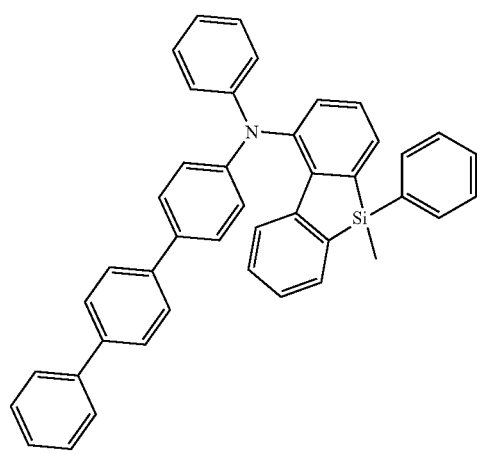
42
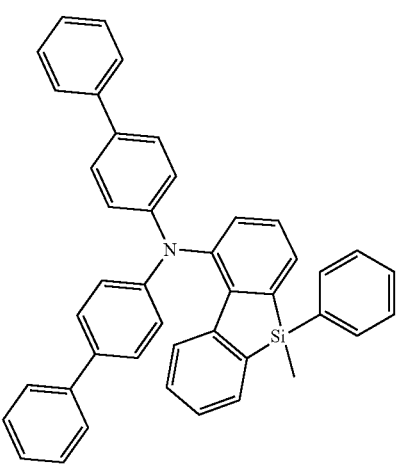
43
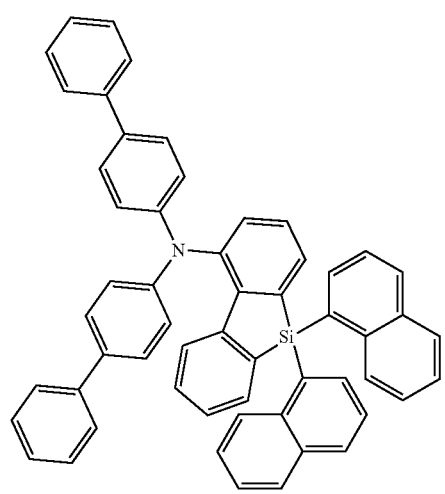
44
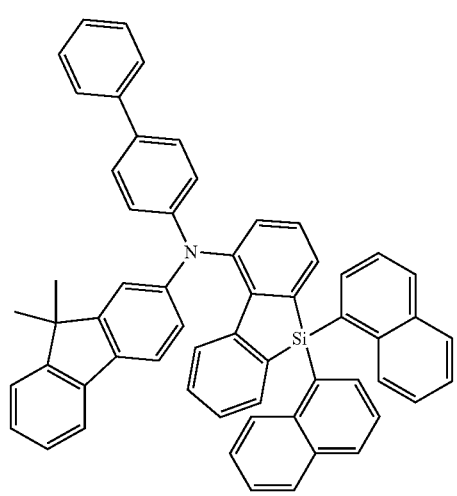

45
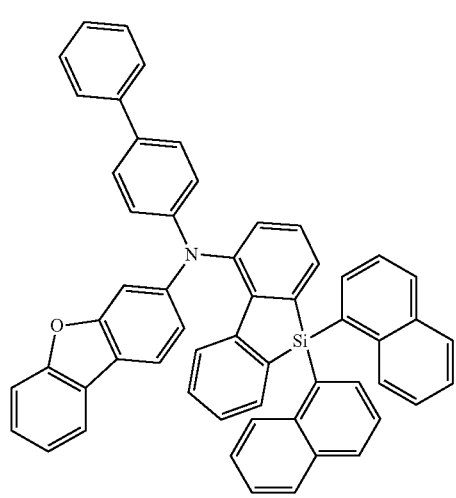
46
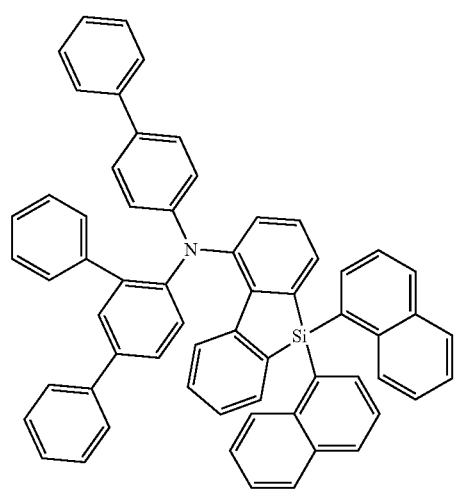
47
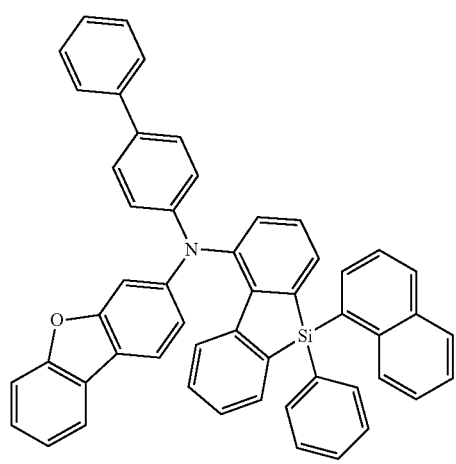
48
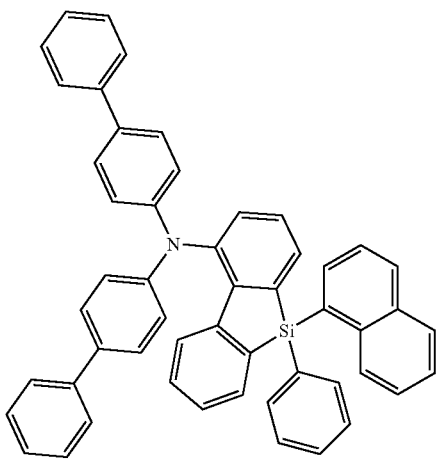
49
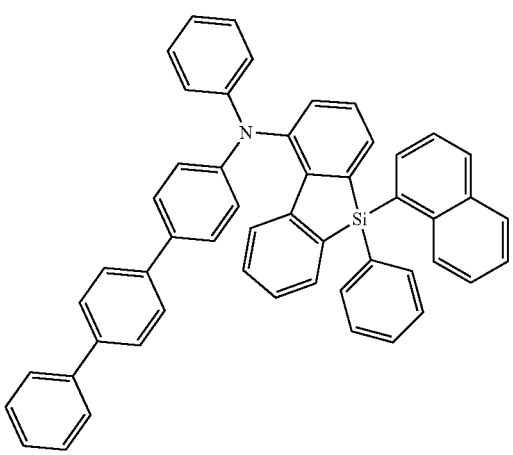
50
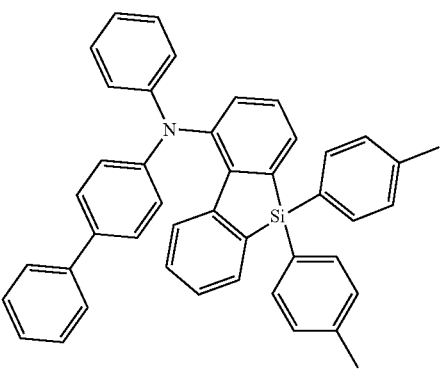

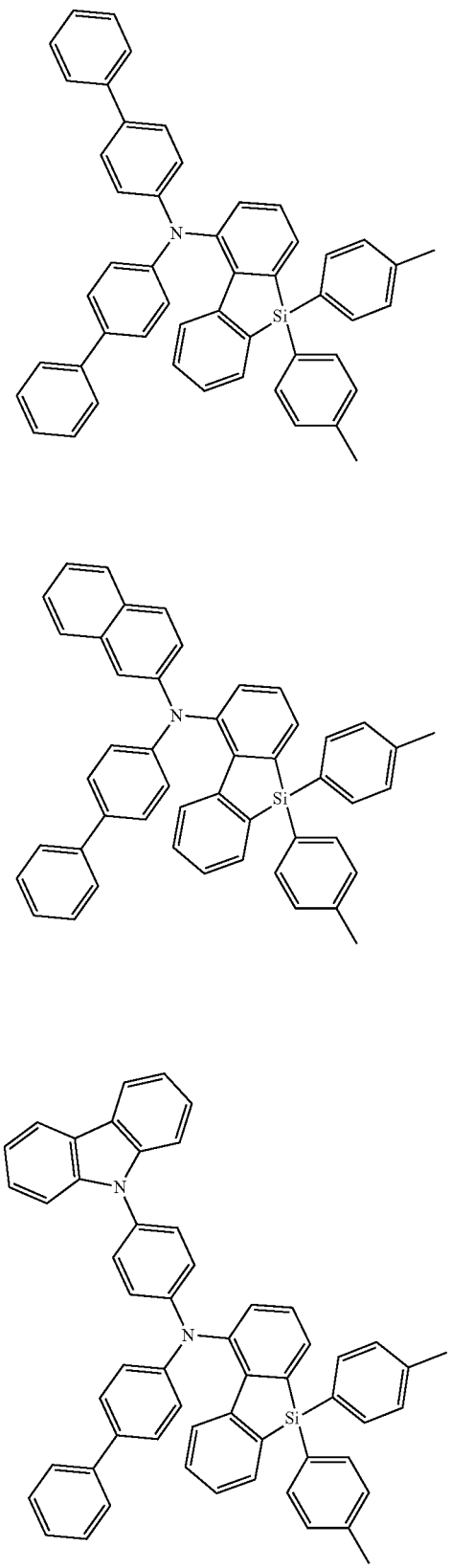
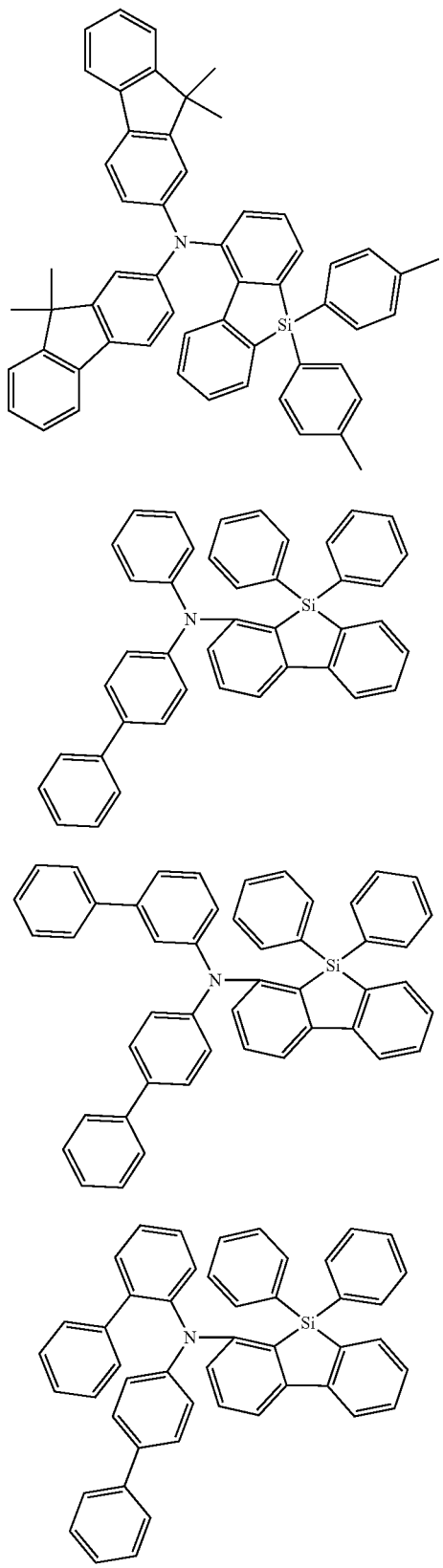

58
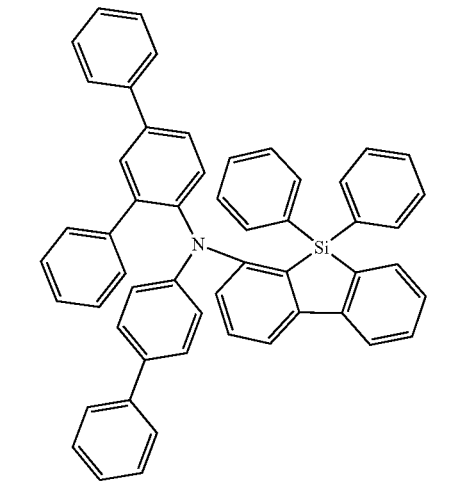
59
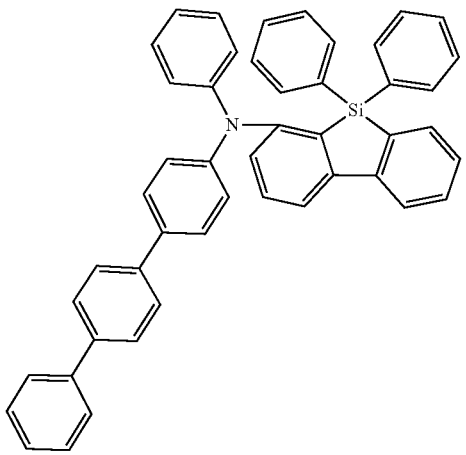
60
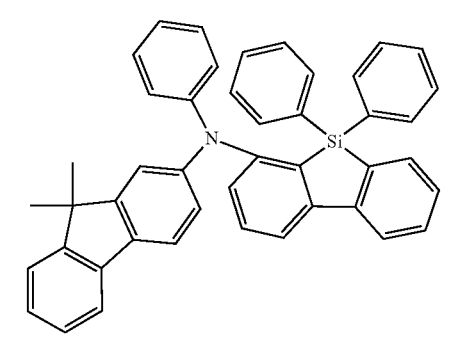
61
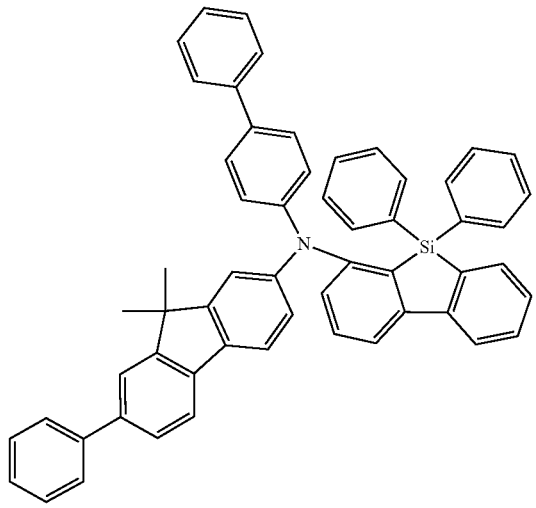
62
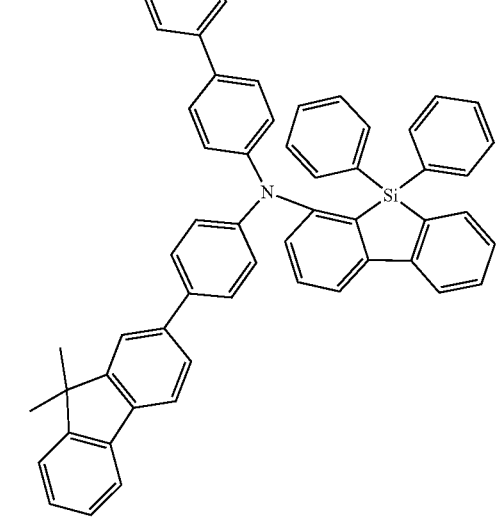
63
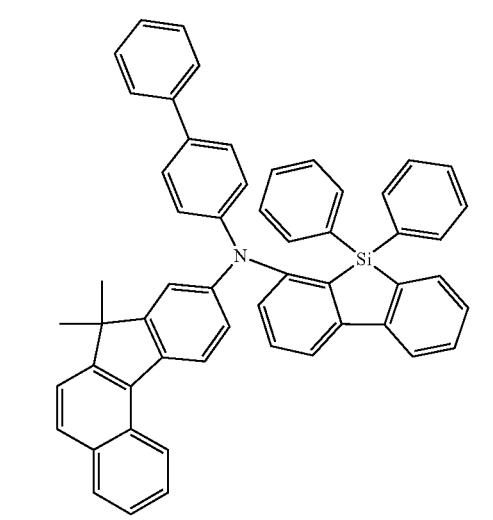

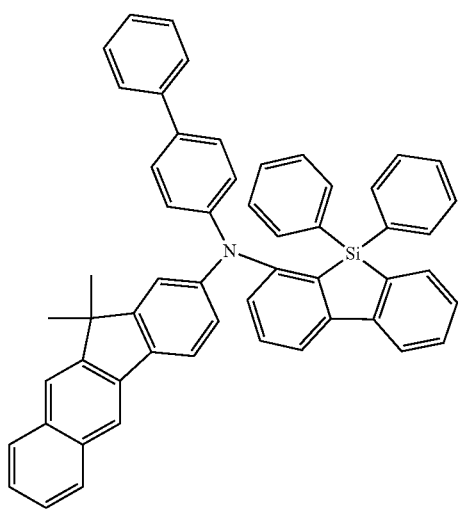
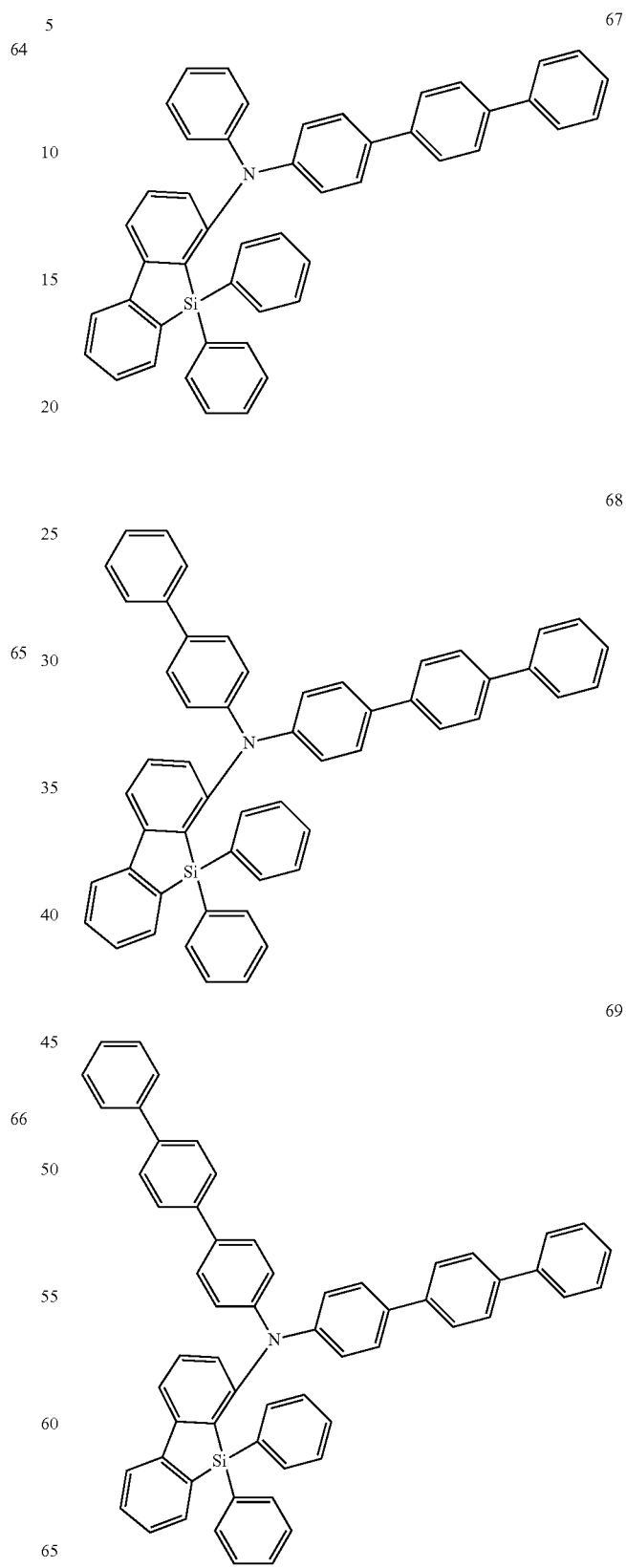

70
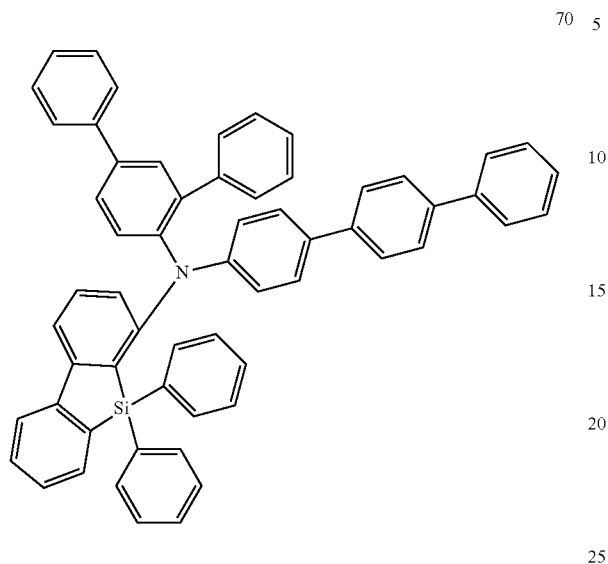
71
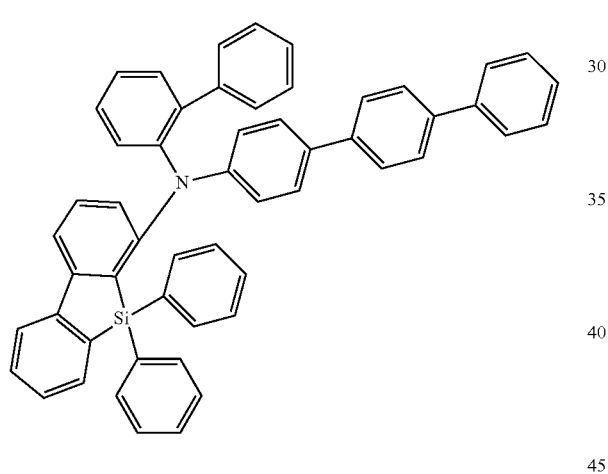
72
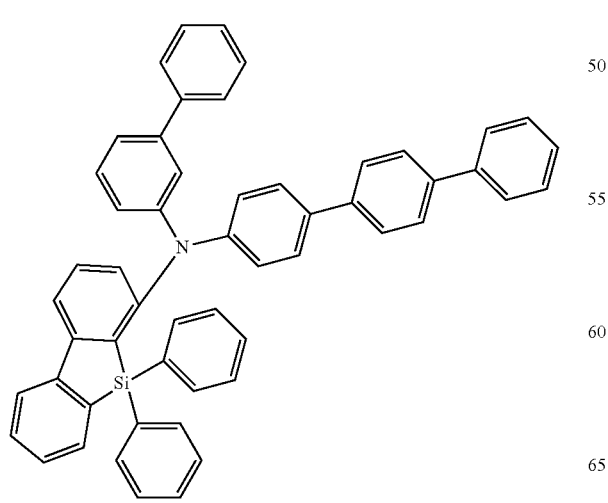
73
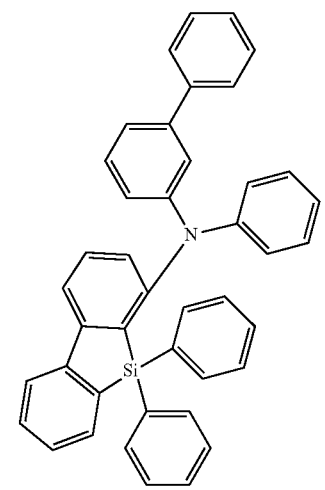
74
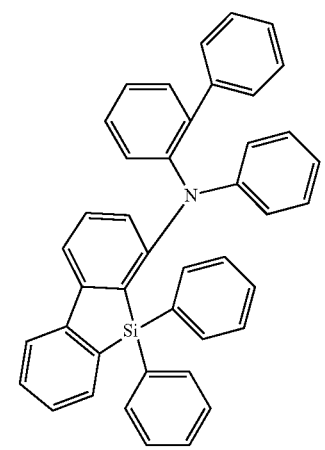
75
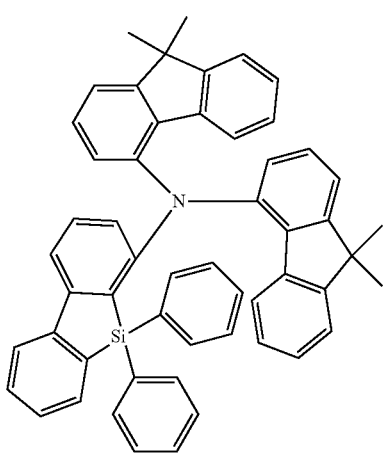

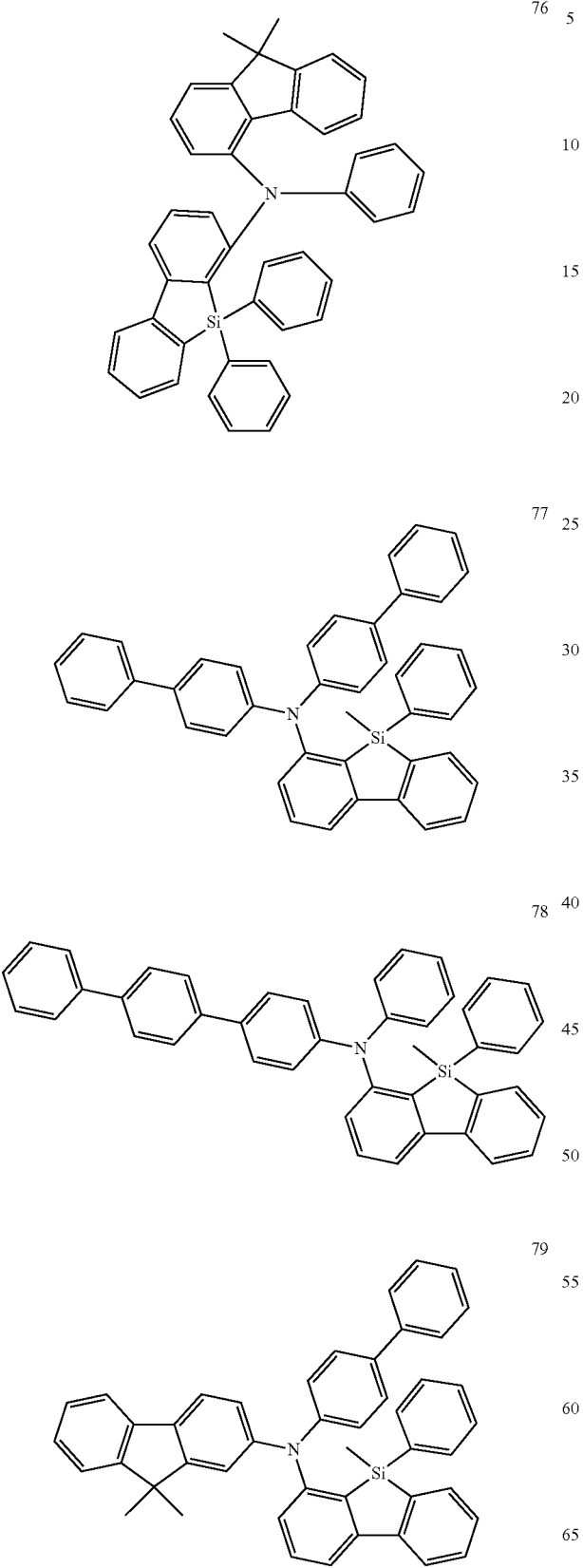
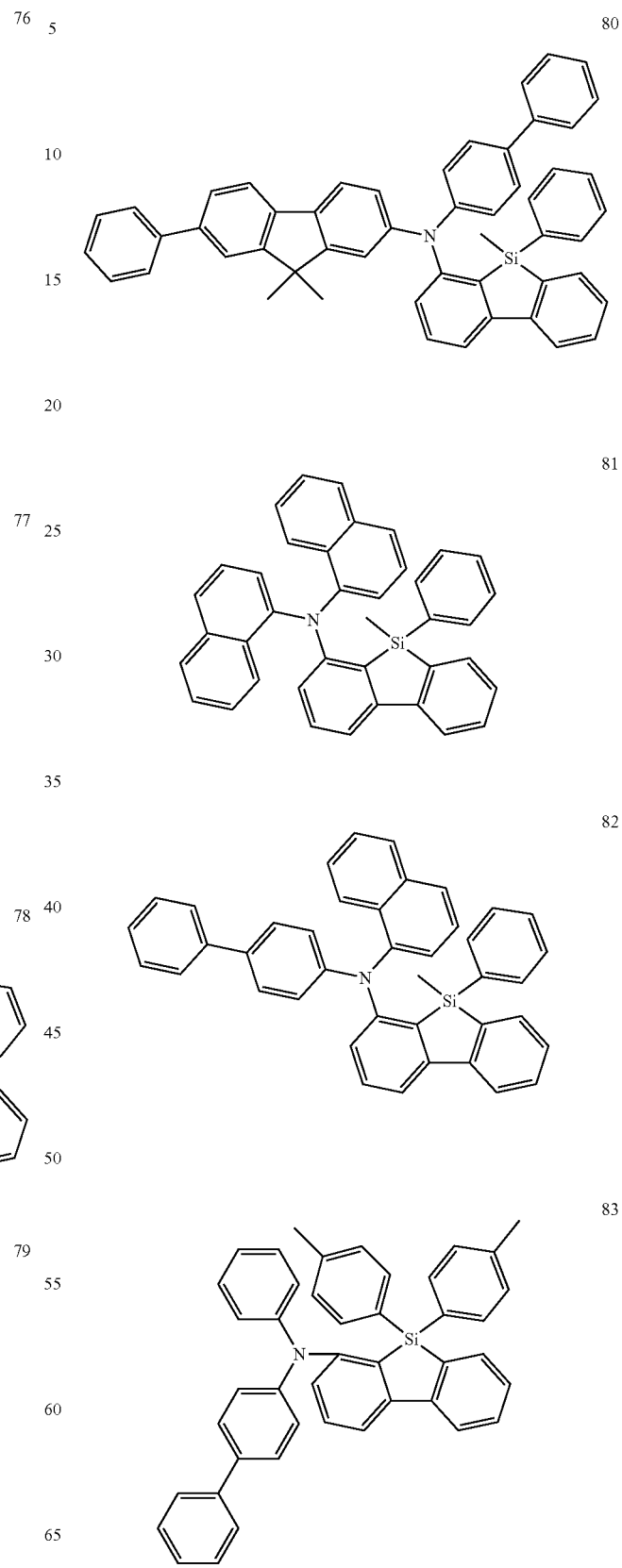

81
-continued
84
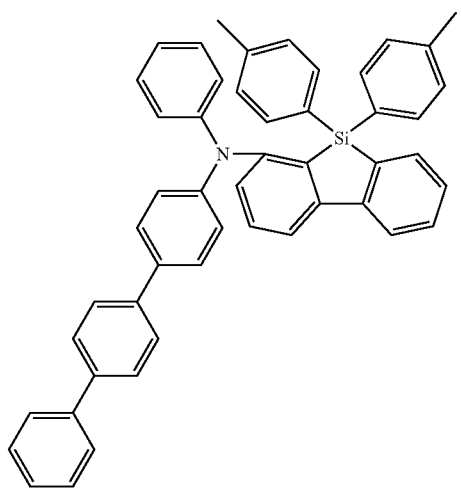
85
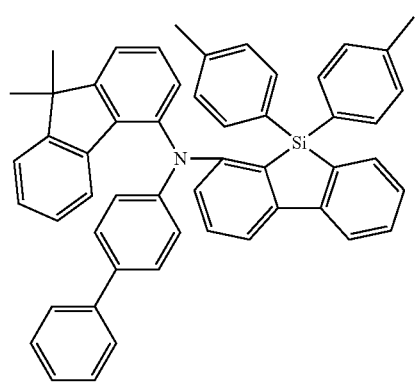
86
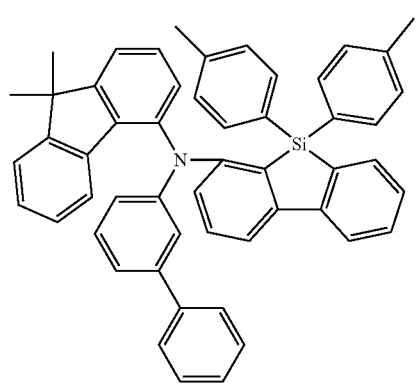
82
-continued
87
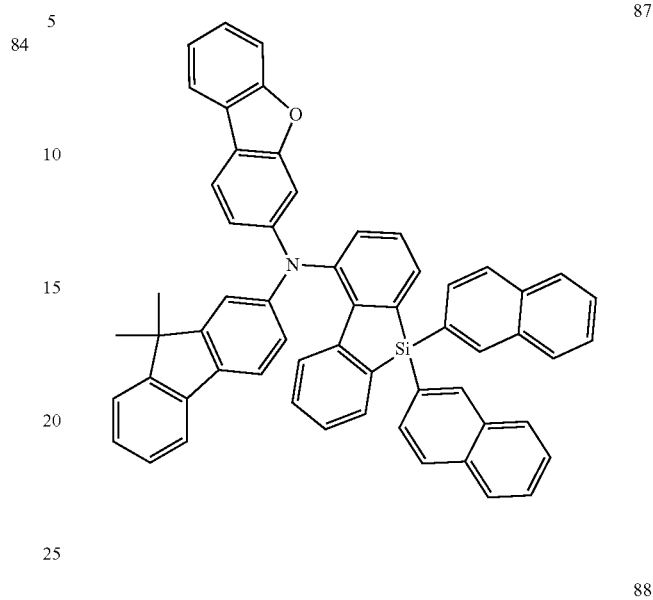
88
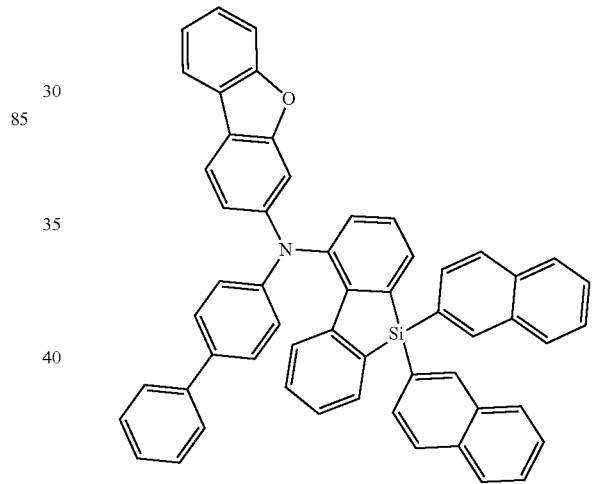
89
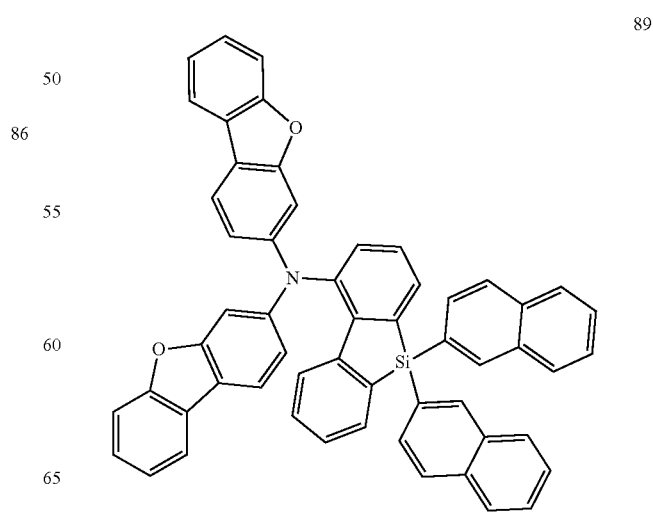

90
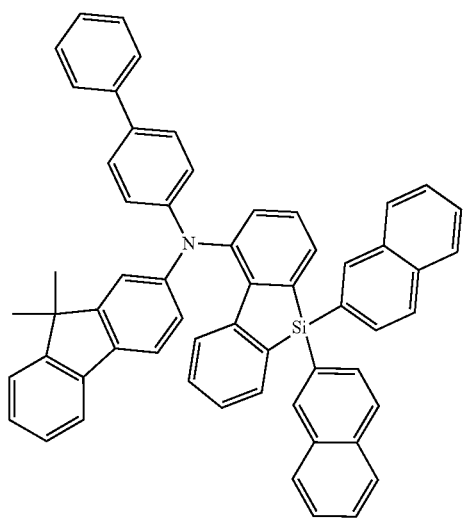
93
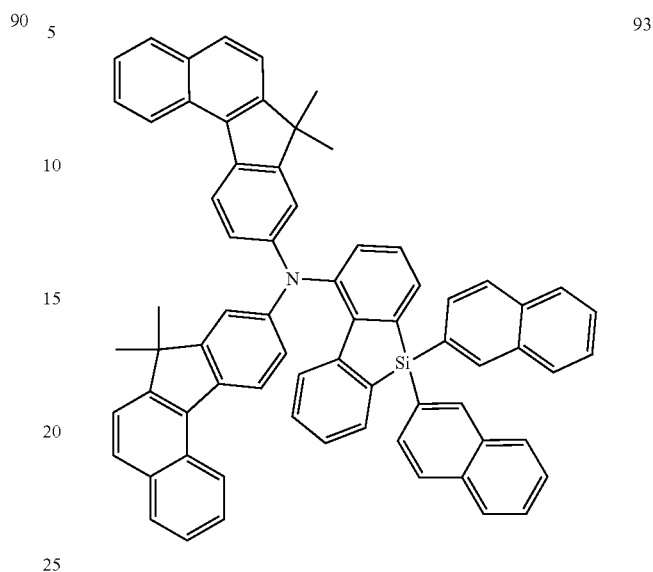
91
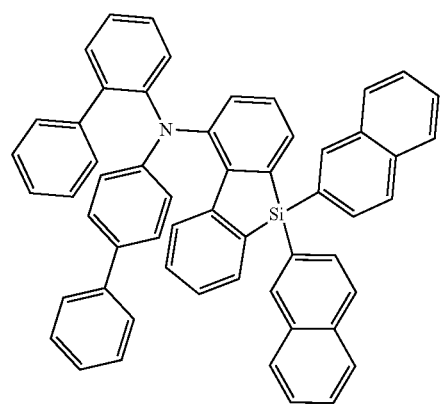
94
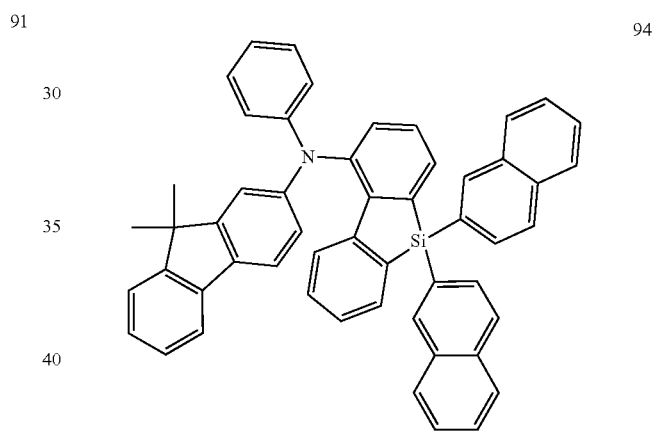
92
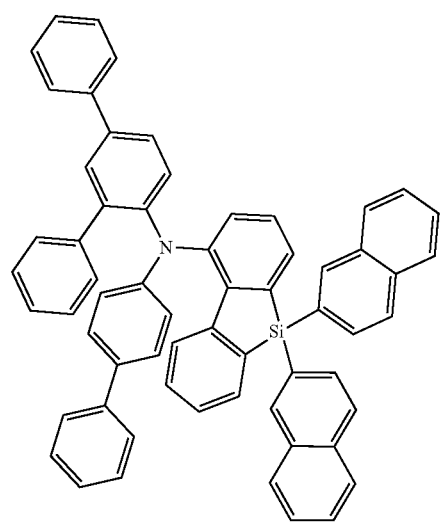
95
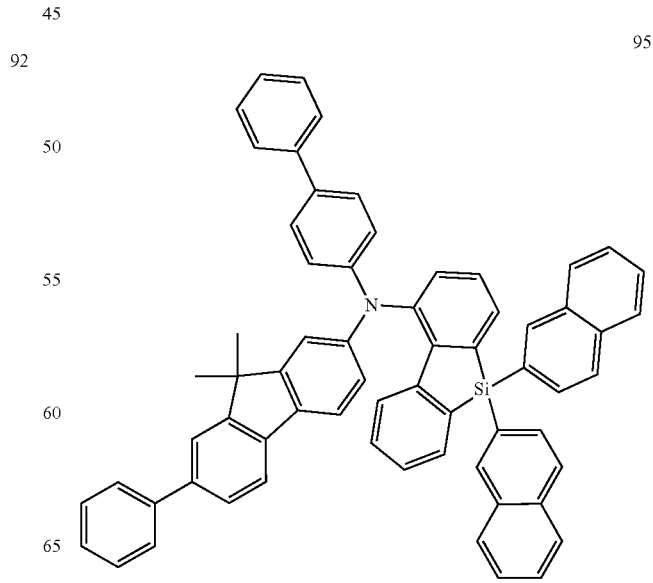

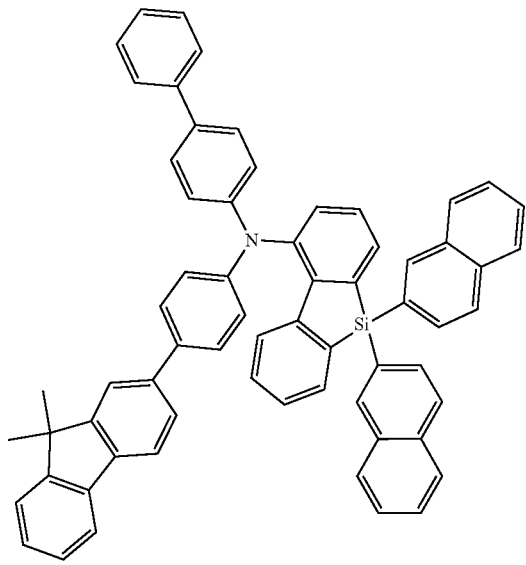
96
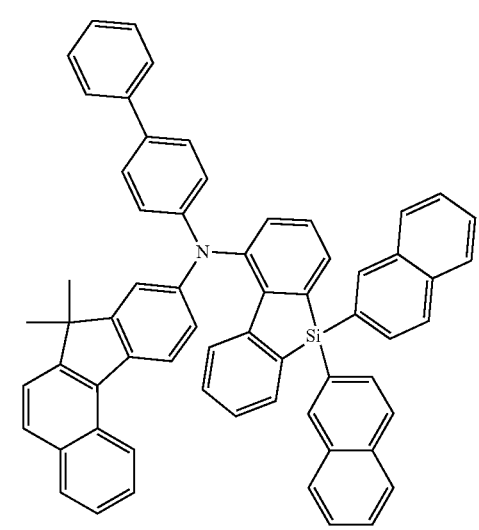
97
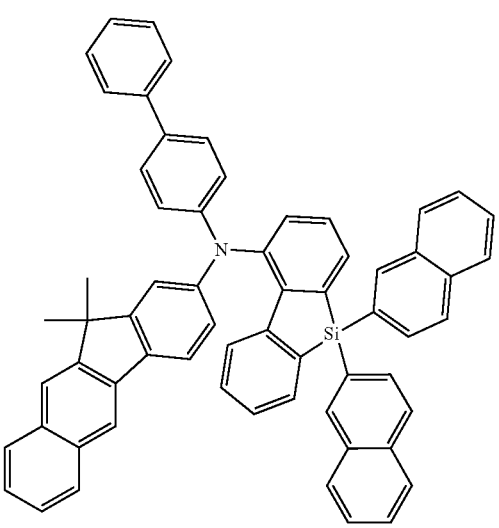
98
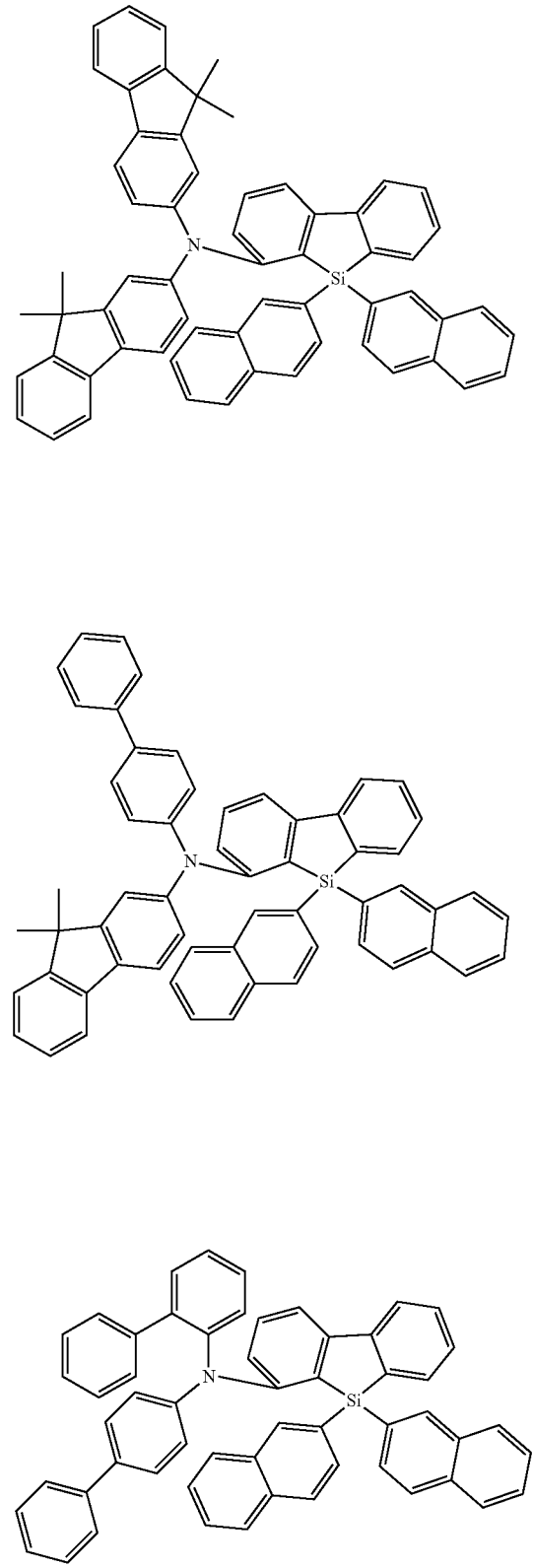

87
-continued
88
-continued
102
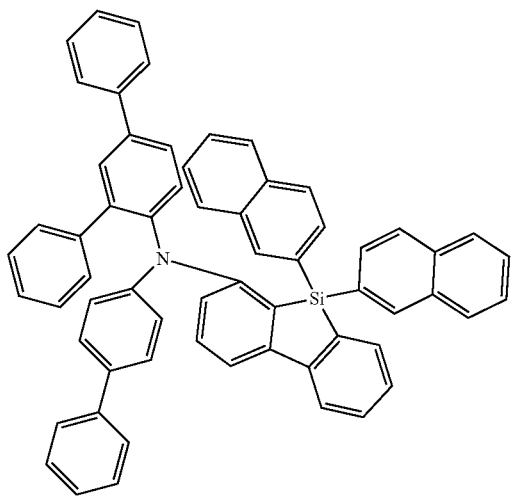
105
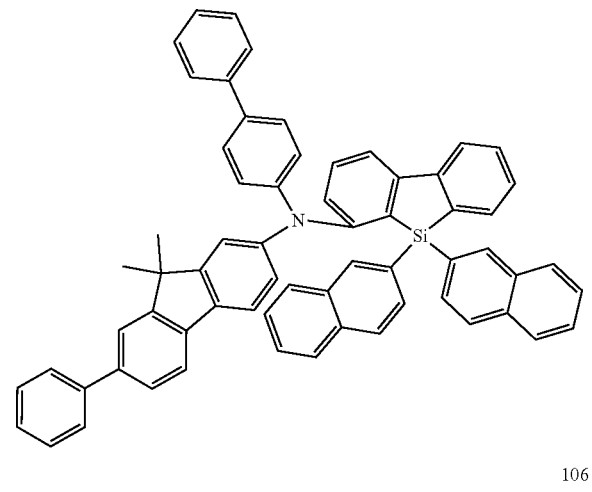
103
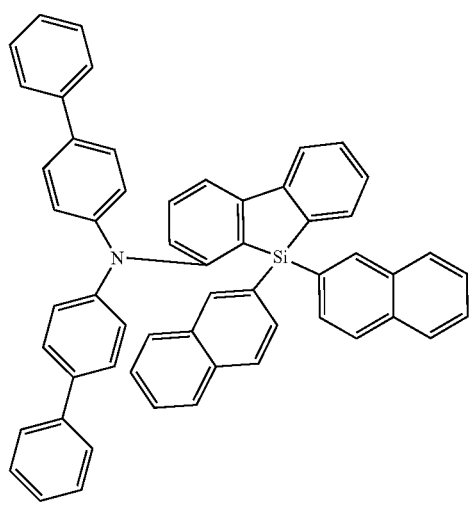
106
104
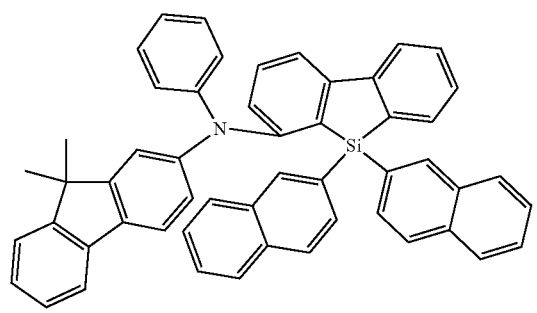
107
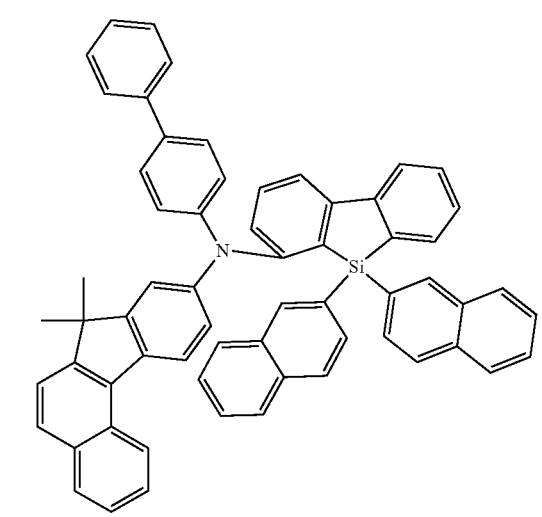

108
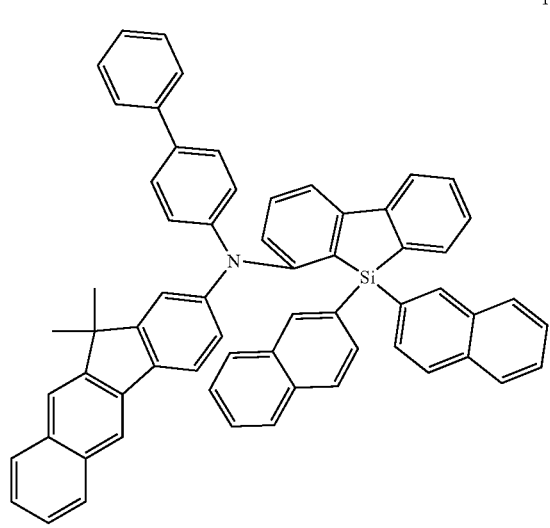
109
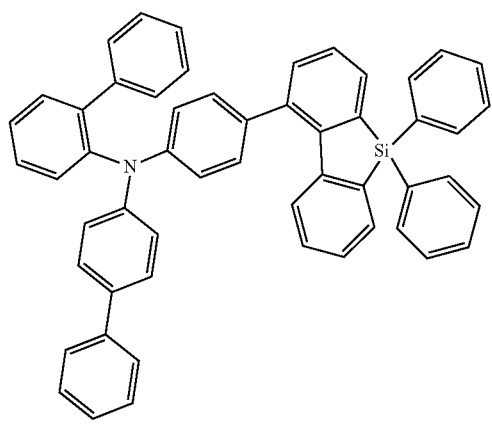
110
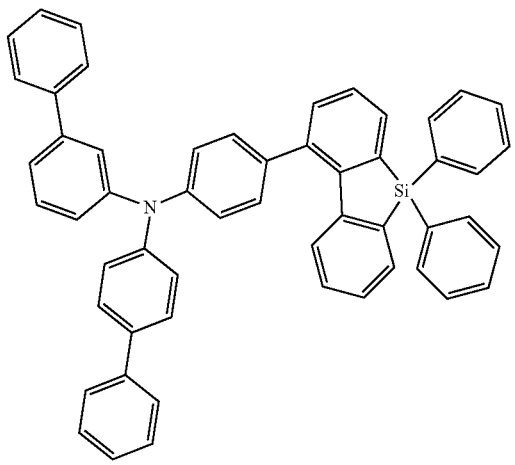
111
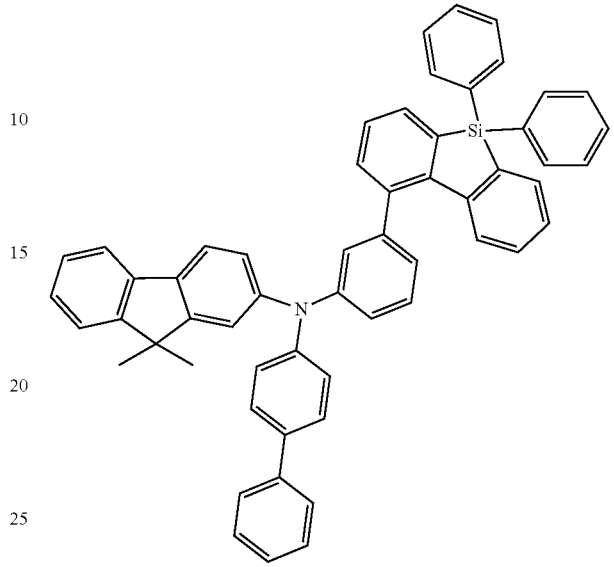
112
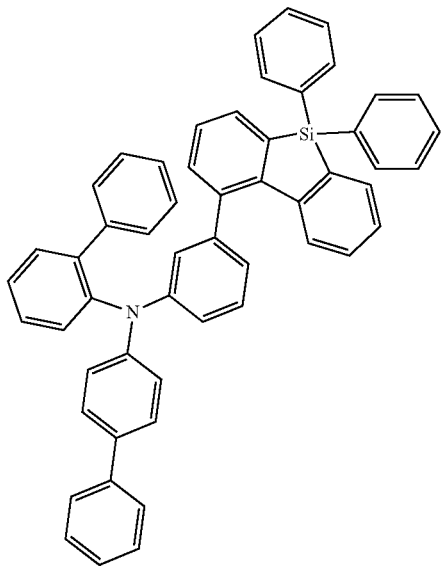
113
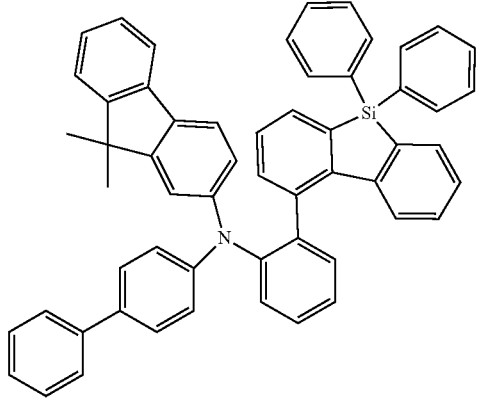

-continued
114
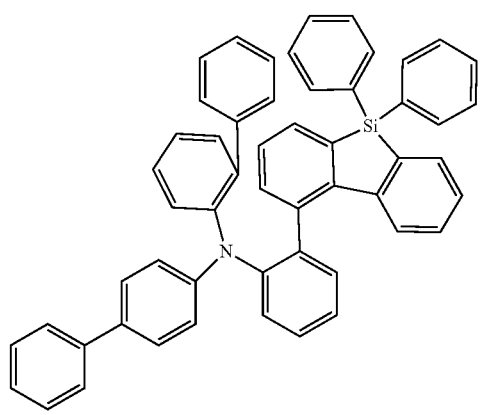
115
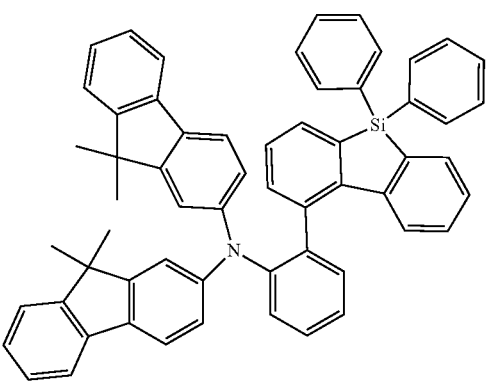
116
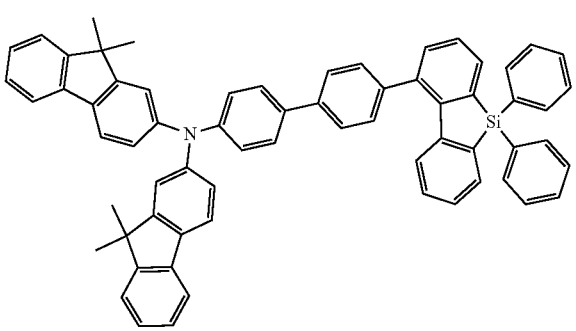
117
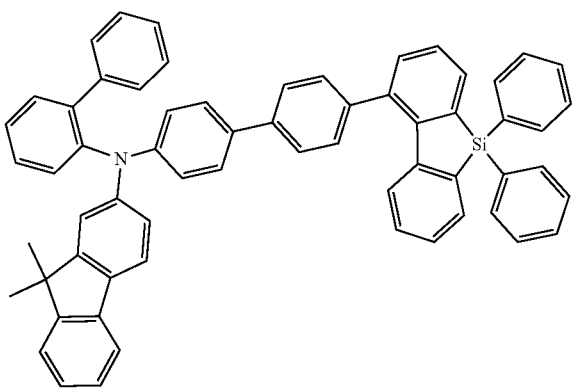
-continued
118
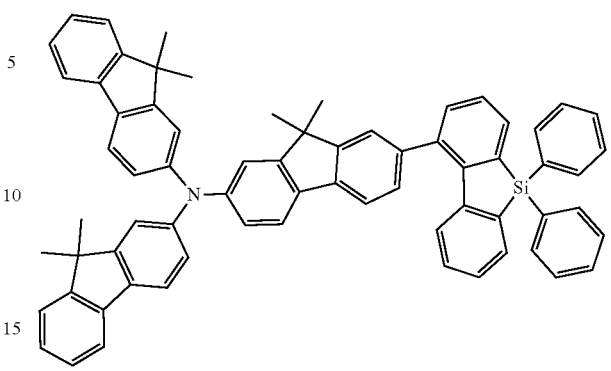
119
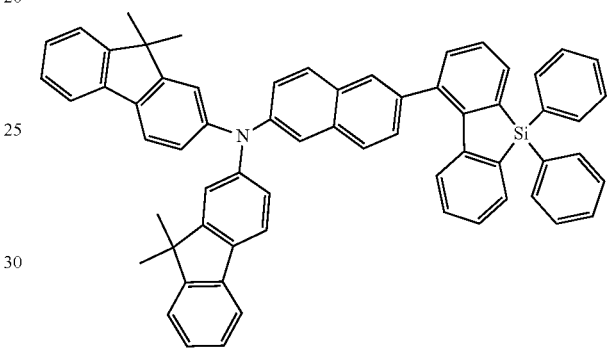
120
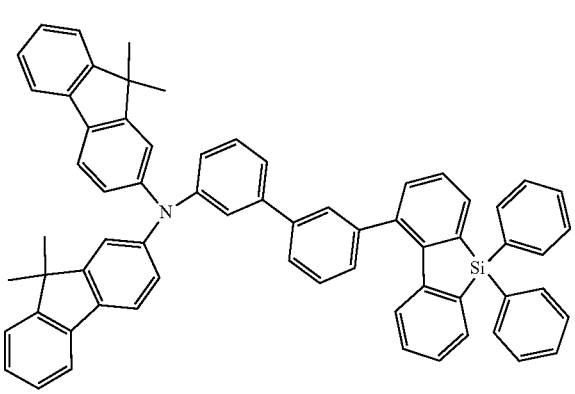
121
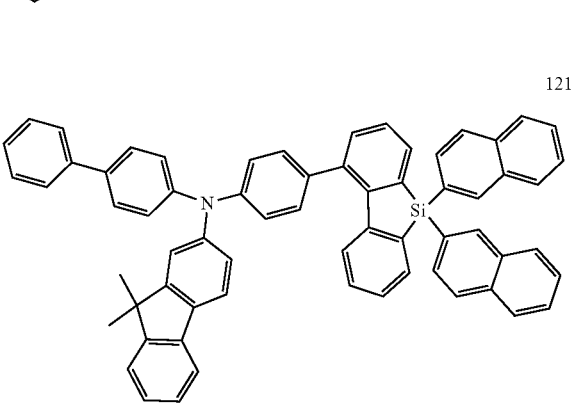

122
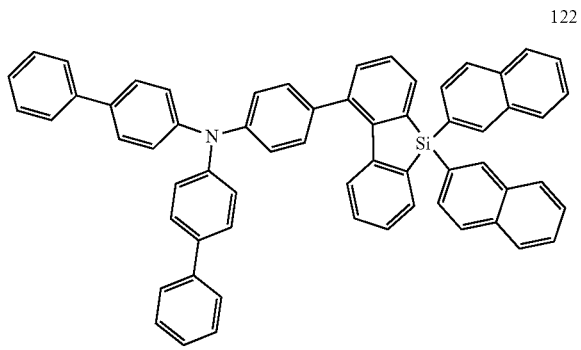
123
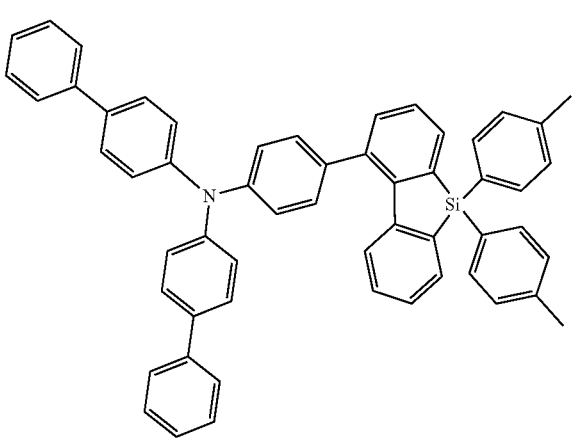
124
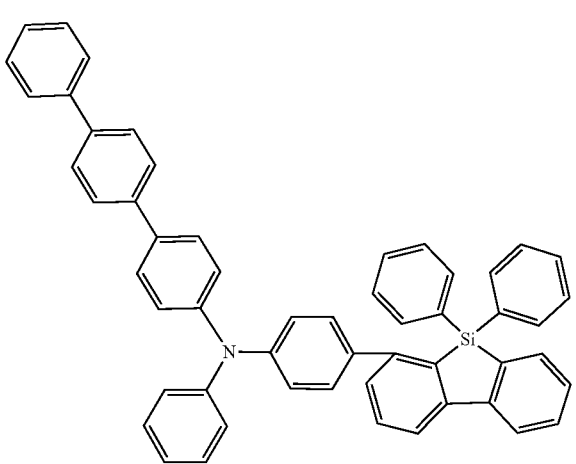
125
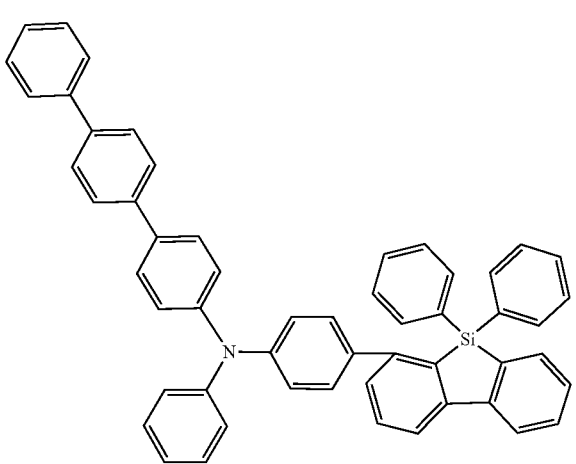
126
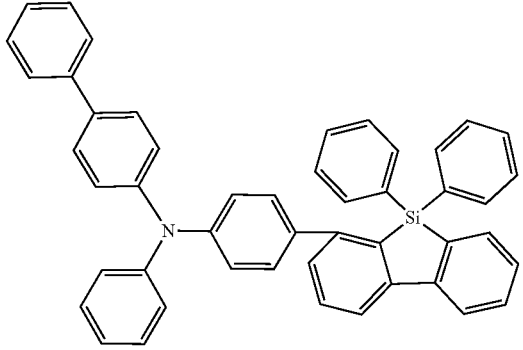
127
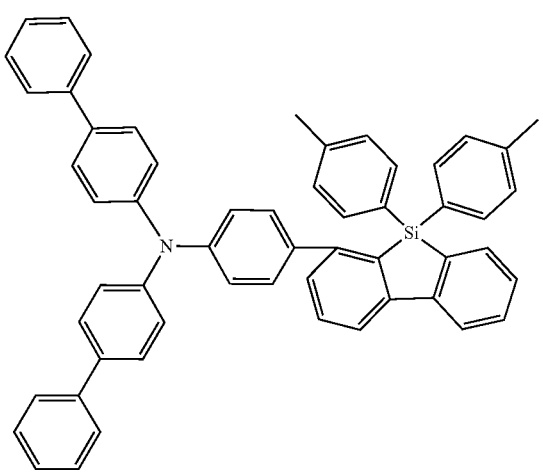
128
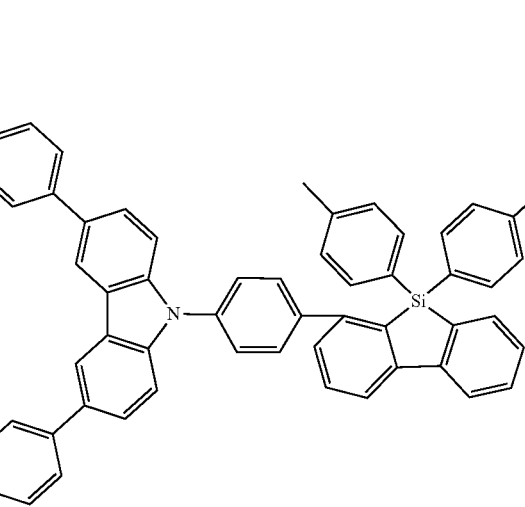

129
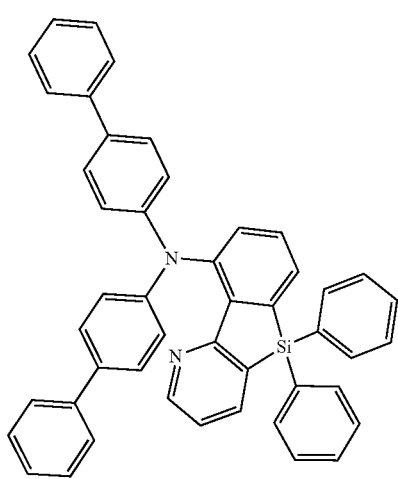
130
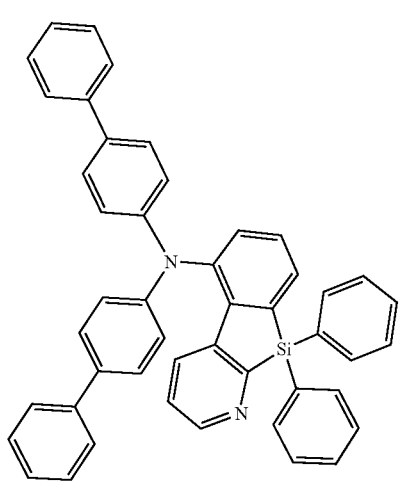
131
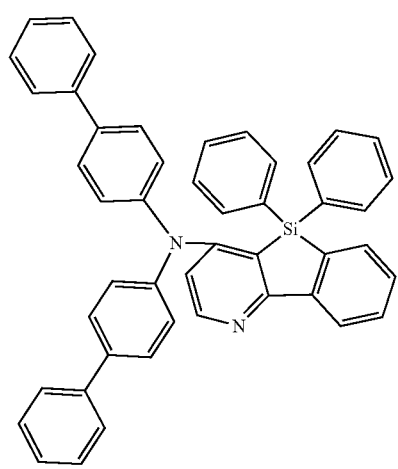
132
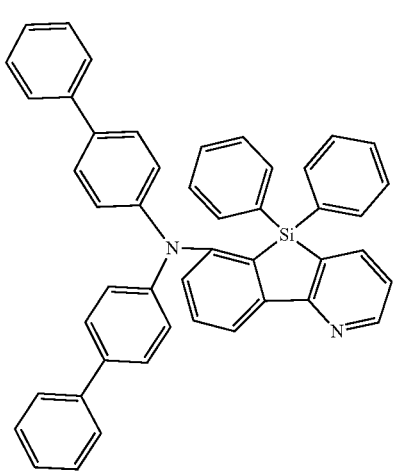
133
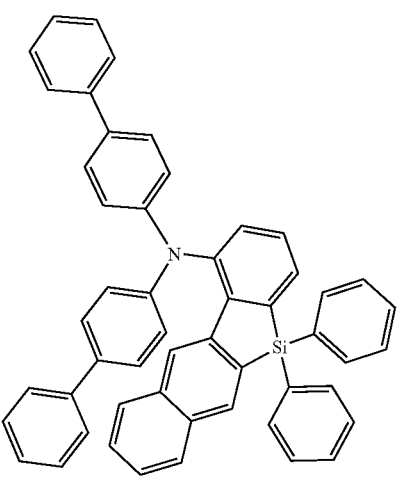
134
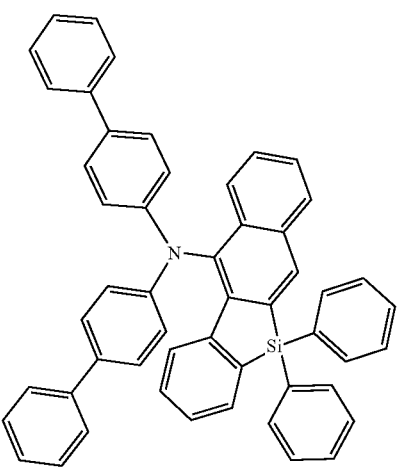

135
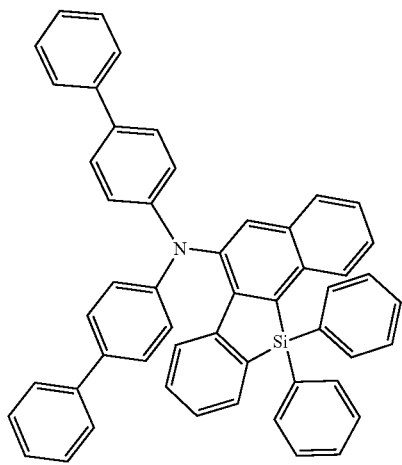
136
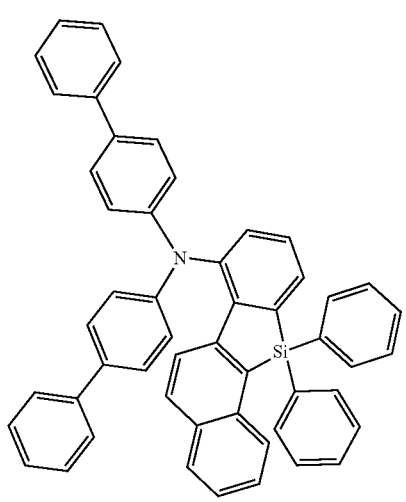
137
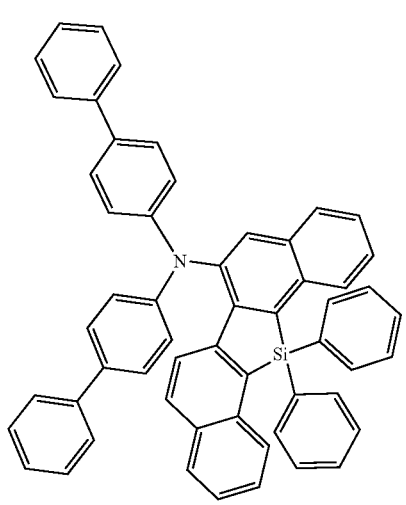
138
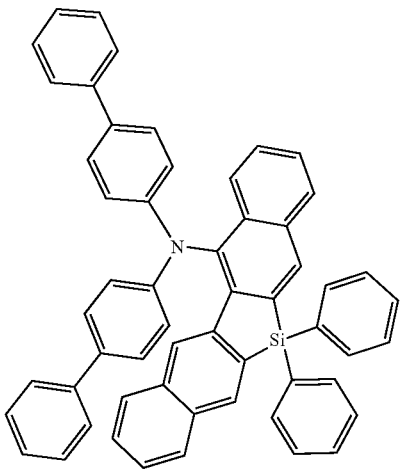
139
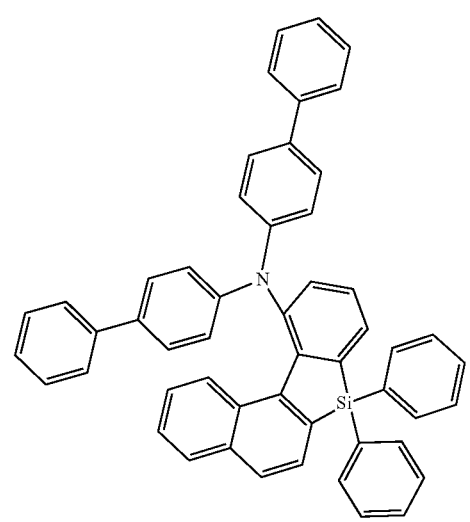
140
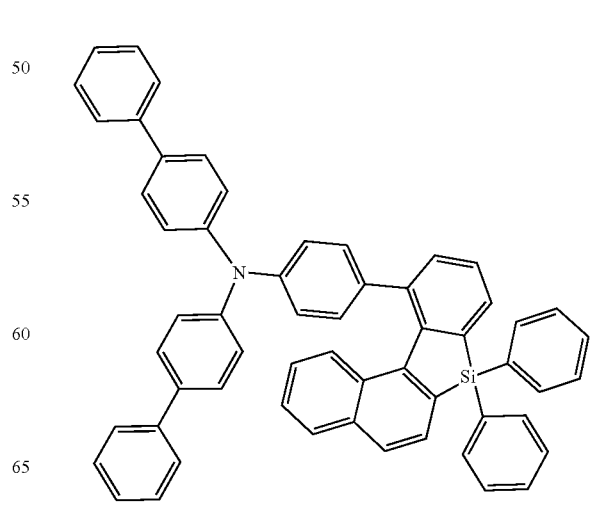

141
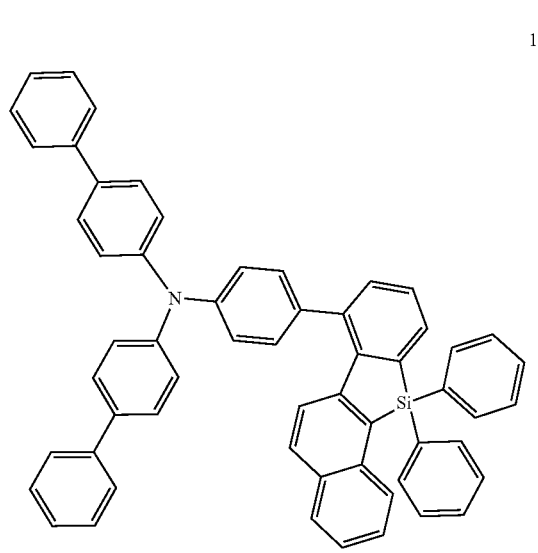
142
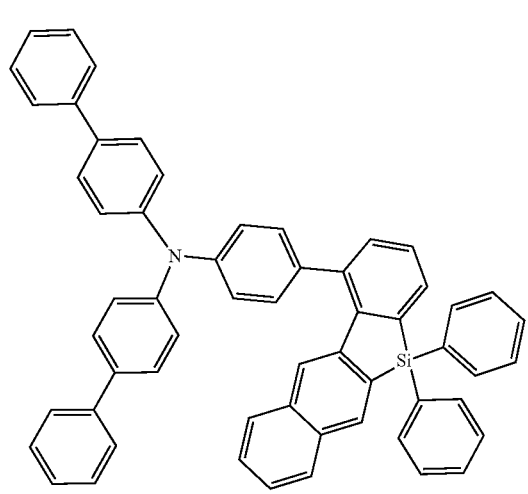
143
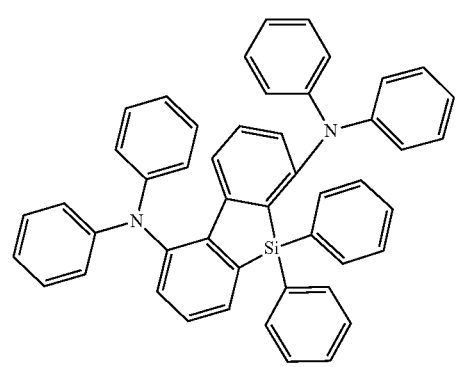
144
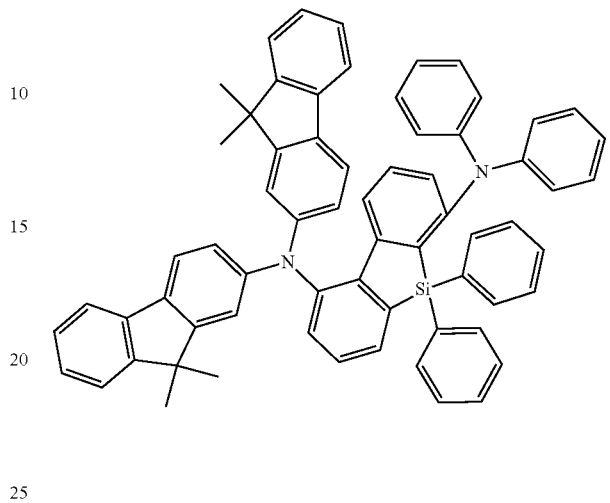
145
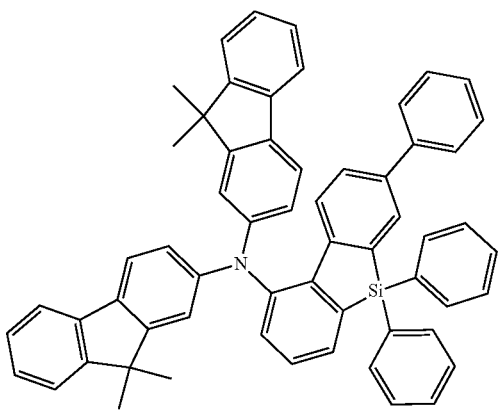
146

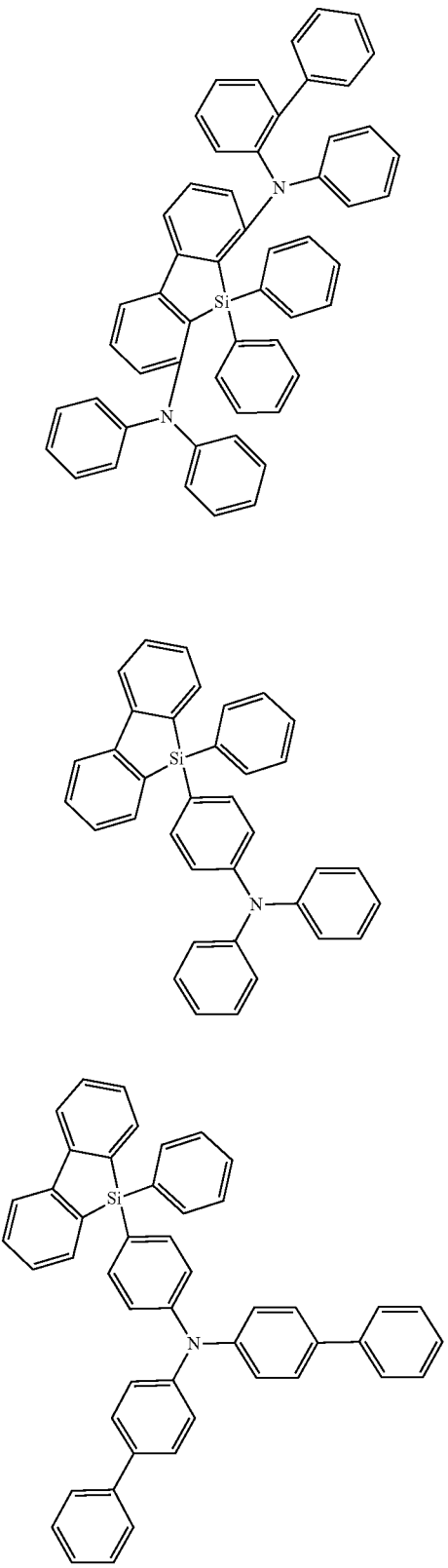
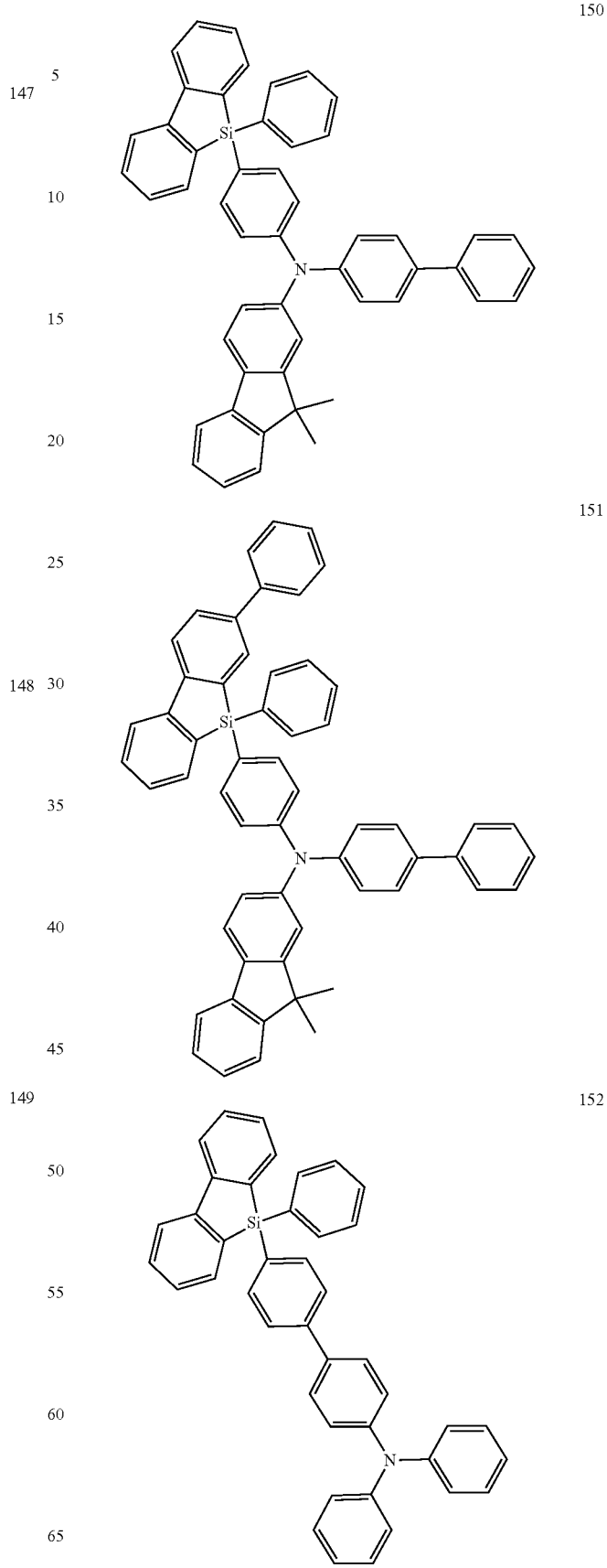

103
-continued

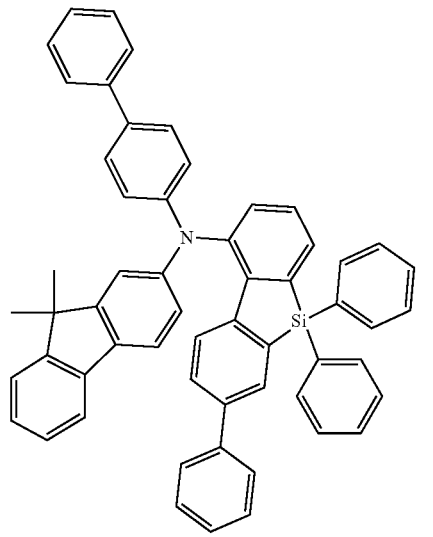
153

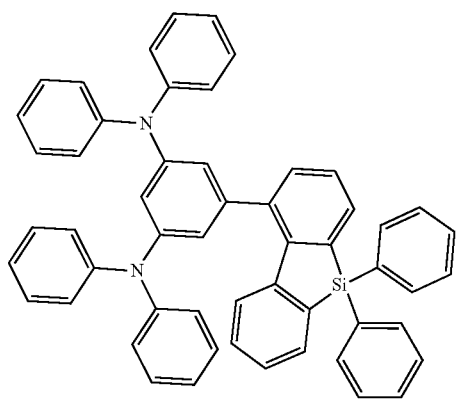
154

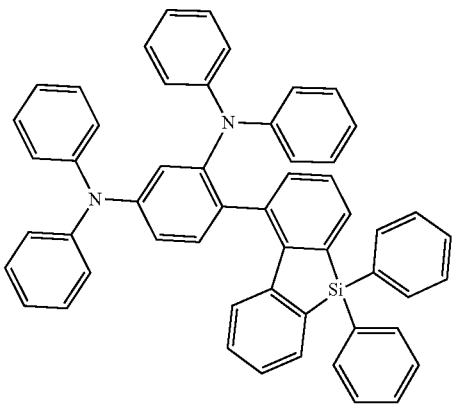
155

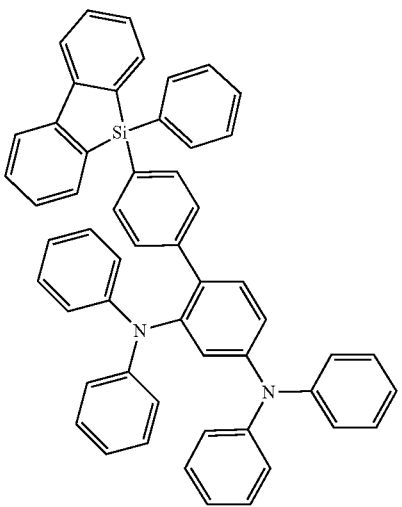
156

104
-continued

The compounds according to formula (I) can be prepared by standard reactions of synthetic organic chemistry, such as transition metal catalyzed coupling reactions, preferably Buchwald or Suzuki couplings.

A preferred procedure for synthesis of compounds according to formula (I) in which the amine group is attached to the 4-position of the sila-fluorenyl basic structure, is shown in Scheme 1.

Scheme 1

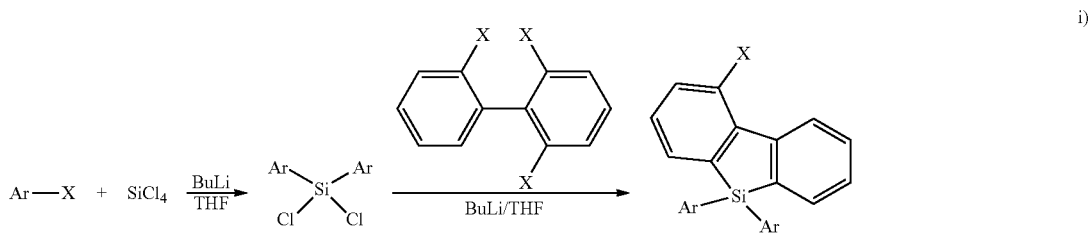

i)

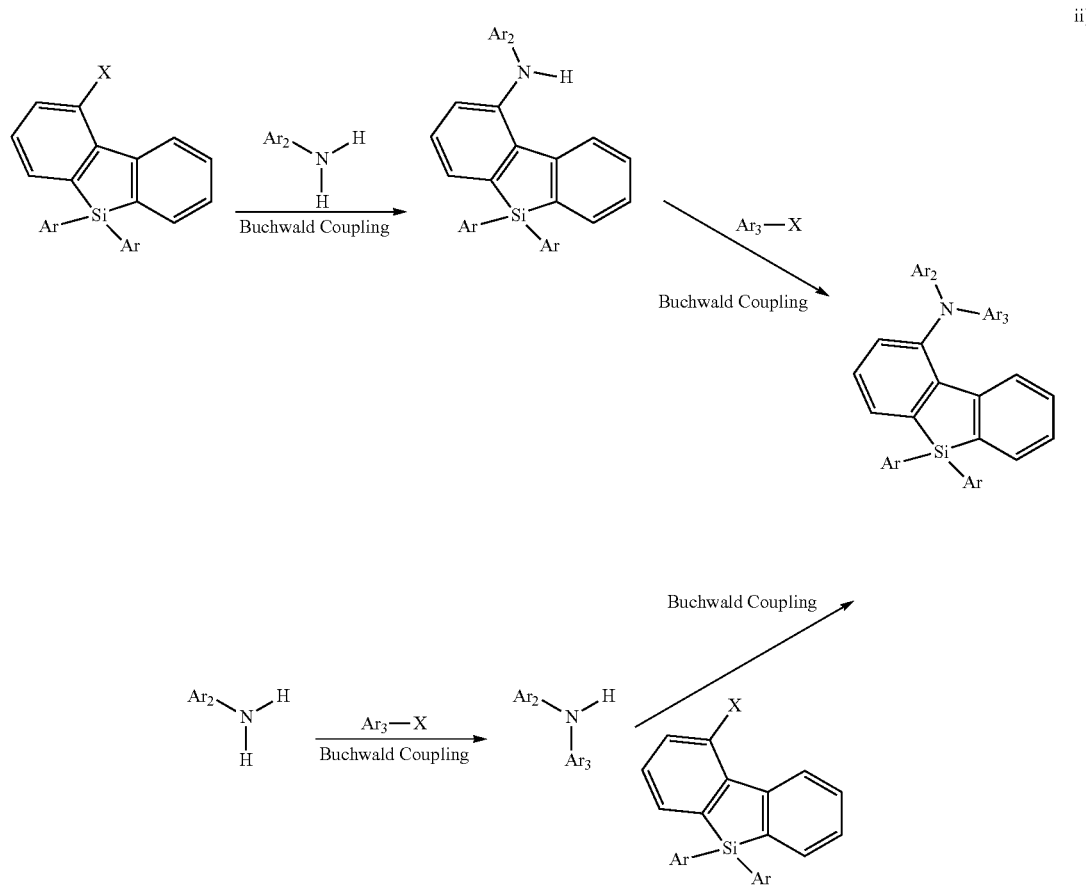

ii)

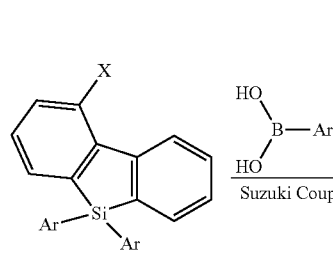

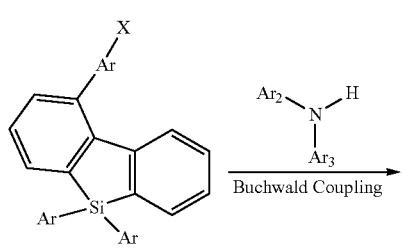

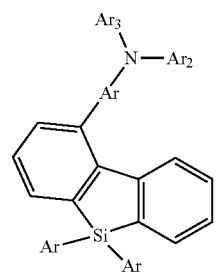

Ar, Ar₂, Ar₃ = aryl or heteroaryl group
X = halogen

In a first step, a bis-chlorinated diarylsilane is prepared. This intermediate is then reacted with a trishalogenated biphenyl derivative, to yield a 4-halogenated silafluorene. Preferably, this step is performed by bis-lithiation of the tris-halogenated biphenyl derivative with BuLi, followed by addition of the bis-chlorinated diarylsilane, to form the ring of the silafluorene. A silafluorene which is halogenated in the 4-position is formed in this step.

This compound is then coupled to a diarylamine group in a Buchwald reaction.

In an alternative reaction, according to a Scheme 1 b, the 4-halogenated silafluorene is first coupled with an aryl group in a Suzuki reaction, and then undergoes a Buchwald coupling with a diarylamine. By this method, silafluorene derivatives which have an amino group which is bonded via an arylene linker in the 4-position of the silafluorene can be prepared.

A preferred procedure for synthesis of compounds according to formula (I) in which the amine group is attached to the 1-position of the sila-fluorenyl basic structure, is shown in Scheme 2.

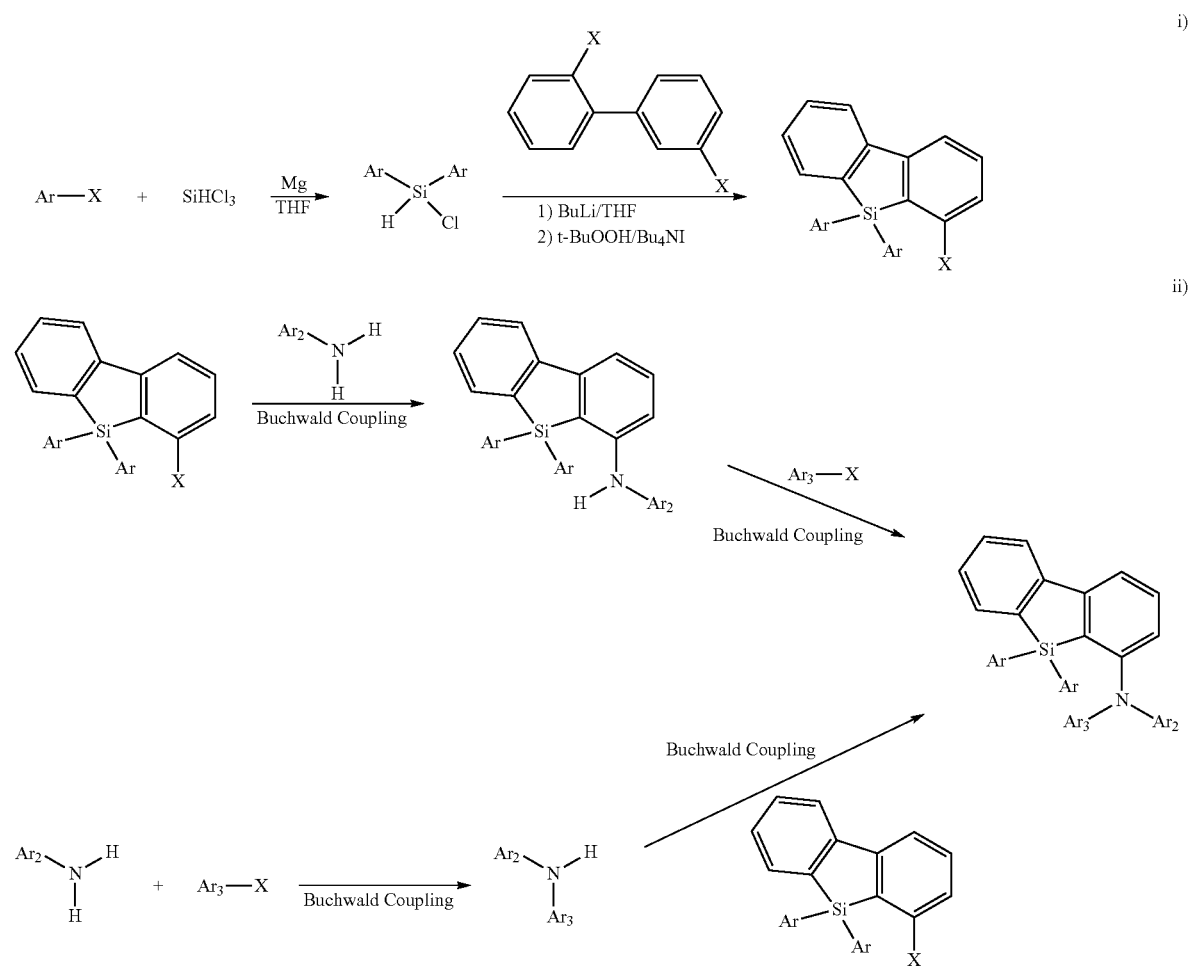

Ar, Ar$_2$, Ar$_3$ = aryl or heteroaryl group
X = halogen

-continued

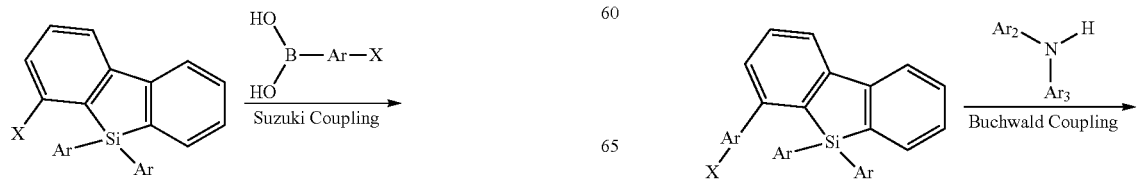

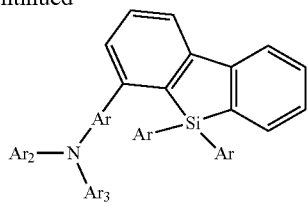

Ar, Ar₂, Ar₃ = aryl or heteroaryl group
X = halogen

In a first step, a mono-chlorinated diarylsilane is prepared. This intermediate is then reacted with a bis-halogenated biphenyl derivative, to yield a 1-halogenated diphenylsilafluorene. Preferably, this step is performed by lithiiation of the bis-halogenated biphenyl derivative with BuLi, followed by addition of the mono-chlorinated diarylsilane, followed by ring closure reaction under treatment with hydroperoxide and tetrabutylammonium iodide.

This compound is then coupled to a diarylamine group in a Buchwald reaction.

In an alternative reaction, according to a Scheme 2b, the 1-halogenated silafluorene is first coupled with an aryl group in a Suzuki reaction, and then undergoes a Buchwald coupling with a diarylamine. By this method, silafluorene derivatives which have an amino group which is coupled via an arylene linker in the 1-position of the silafluorene can be prepared.

A further embodiment of the present invention is therefore a process for preparation of a compound according to formula (I), characterized in that a mono- or dihalogenated silyl derivative is reacted with a halogenated biphenyl group to a silafluorene derivative.

Preferably, the silyl derivative is dihalogenated. Furthermore preferably, the biphenyl group is tris-halogenated. Furthermore preferably, the resulting silafluorene derivative has a halogen atom, preferably Cl, Br or I, in a position selected from 1- and 4-position, where the 4-position is preferred over the 1-position.

Preferably, in a second step, the resulting silafluorene is reacted in a Buchwald reaction or in a Suzuki reaction with a subsequent Buchwald reaction to the final compound of formula (I).

The compounds according to the invention described above, in particular compounds which are substituted by reactive leaving groups, such as fluorine, chlorine, bromine, iodine, tosylate, triflate, boronic acid or boronic acid ester, can be used as monomers for the preparation of corresponding oligomers, dendrimers or polymers. The oligomerisation or polymerisation here is preferably carried out via the halogen functionality or the boronic acid functionality.

The invention therefore furthermore relates to oligomers, polymers or dendrimers comprising one or more compounds of the formula (I), where the bond(s) to the polymer, oligomer or dendrimer may be localised at any desired positions in formula (I) substituted by $R^1$, $R^2$ or $R^3$. Depending on the linking of the compound of the formula (I), the compound is part of a side chain of the oligomer or polymer or part of the main chain. An oligomer in the sense of this invention is taken to mean a compound which is built up from at least three monomer units. A polymer in the sense of the invention is taken to mean a compound which is built up from at least ten monomer units. The polymers, oligomers or dendrimers according to the invention may be conjugated, partially conjugated or non-conjugated. The oligomers or polymers according to the invention may be linear, branched or dendritic. In the structures linked in a linear manner, the units of the formula (I) may be linked directly to one another or linked to one another via a divalent group, for example via a substituted or unsubstituted alkylene group, via a heteroatom or via a divalent aromatic or heteroaromatic group.

In branched and dendritic structures, three or more units of the formula (I) may, for example, be linked via a trivalent or polyvalent group, for example via a trivalent or polyvalent aromatic or heteroaromatic group, to give a branched or dendritic oligomer or polymer. The same preferences as described above for compounds of the formula (I) apply to the recurring units of the formula (I) in oligomers, dendrimers and polymers.

For the preparation of the oligomers or polymers, the monomers according to the invention are homopolymerised or copolymerised with further monomers. Suitable and preferred comonomers are selected from fluorenes (for example in accordance with EP 842208 or WO 00/22026), spirobifluorenes (for example in accordance with EP 707020, EP 894107 or WO 06/061181), para-phenylenes (for example in accordance with WO 92/18552), carbazoles (for example in accordance with WO 04/070772 or WO 04/113468), thiophenes (for example in accordance with EP 1028136), dihydrophenanthrenes (for example in accordance with WO 05/014689 or WO 07/006383), cis- and trans-indenofluorenes (for example in accordance with WO 04/041901 or WO 04/113412), ketones (for example in accordance with WO 05/040302), phenanthrenes (for example in accordance with WO 05/104264 or WO 07/017066) or also a plurality of these units. The polymers, oligomers and dendrimers usually also contain further units, for example emitting (fluorescent or phosphorescent) units, such as, for example, vinyltriarylamines (for example in accordance with WO 07/068325) or phosphorescent metal complexes (for example in accordance with WO 06/003000), and/or charge-transport units, in particular those based on triarylamines.

The polymers and oligomers according to the invention are generally prepared by polymerisation of one or more types of monomer, at least one monomer of which results in recurring units of the formula (I) in the polymer. Suitable polymerisation reactions are known to the person skilled in the art and are described in the literature. Particularly suitable and preferred polymerisation reactions which result in C—C or C—N links are the following:
 (A) SUZUKI polymerisation;
 (B) YAMAMOTO polymerisation;
 (C) STILLE polymerisation; and
 (D) HARTWIG-BUCHWALD polymerisation
 (E) GRIGNARD polymerisation.

The way in which the polymerisation can be carried out by these methods and the way in which the polymers can then be separated off from the reaction medium and purified is known to the person skilled in the art and is described in detail in the literature, for example in WO 2003/048225, WO 2004/037887 and WO 2004/037887.

The present invention thus also relates to a process for the preparation of the polymers, oligomers and dendrimers according to the invention, which is characterised in that they are prepared by SUZUKI polymerisation, YAMAMOTO polymerisation, STILLE polymerisation or HARTWIG-BUCHWALD polymerisation. The dendrimers according to the invention can be prepared by processes known to the person skilled in the art or analogously thereto. Suitable processes are described in the literature, such as, for example, in Frechet, Jean M. J.; Hawker, Craig J., "Hyperbranched polyphenylene and hyperbranched polyesters: new soluble, three-dimensional, reactive polymers", Reactive & Functional Polymers (1995), 26(1-3), 127-36; Janssen, H. M.; Meijer, E. W., "The synthesis and characterization of dendritic molecules", Materials Science and Technology (1999), 20 (Synthesis of Polymers), 403-458; Tomalia, Donald A., "Dendrimer molecules", Scientific American (1995), 272(5), 62-6; WO 02/067343 A1 and WO 2005/026144 A1.

The compounds according to the invention are suitable for use in an electronic device. An electronic device here is taken to mean a device which comprises at least one layer which comprises at least one organic compound. However, the component here may also comprise inorganic materials or also layers built up entirely from inorganic materials.

The present invention therefore furthermore relates to the use of the compounds according to the invention in an electronic device, in particular in an organic electroluminescent device.

The present invention still furthermore relates to an electronic device comprising at least one compound according to the invention. The preferences stated above likewise apply to the electronic devices.

The electronic device is preferably selected from the group consisting of organic electroluminescent devices (organic light-emitting diodes, OLEDs), organic integrated circuits (O-ICs), organic field-effect transistors (O-FETs), organic thin-film transistors (O-TFTs), organic light-emitting transistors (O-LETs), organic solar cells (O-SCs), organic dye-sensitised solar cells (ODSSCs), organic optical detectors, organic photoreceptors, organic fieldquench devices (O-FQDs), light-emitting electrochemical cells (LECs), organic laser diodes (O-lasers) and organic plasmon emitting devices, but preferably organic electroluminescent devices (OLEDs.

The organic electroluminescent devices and the light-emitting electrochemical cells can be employed for various applications, for example for monochromatic or polychromatic displays, for lighting applications or for medical and/or cosmetic applications, for example in phototherapy.

The organic electroluminescent device comprises a cathode, an anode and at least one emitting layer. Apart from these layers, it may also comprise further layers, for example in each case one or more hole-injection layers, hole-transport layers, hole-blocking layers, electron-transport layers, electron-injection layers, exciton-blocking layers, electron-blocking layers and/or charge-generation layers. Interlayers, which have, for example, an exciton-blocking function, may likewise be introduced between two emitting layers. However, it should be pointed out that each of these layers does not necessarily have to be present.

The organic electroluminescent device here may comprise one emitting layer or a plurality of emitting layers. If a plurality of emission layers is present, these preferably have in total a plurality of emission maxima between 380 nm and 750 nm, resulting overall in white emission, i.e. various emitting compounds which are able to fluoresce or phosphoresce are used in the emitting layers. Particular preference is given to systems having three emitting layers, where the three layers exhibit blue, green and orange or red emission (for the basic structure see, for example, WO 2005/011013).

It is possible here for all emitting layers to be fluorescent or for all emitting layers to be phosphorescent or for one or more emitting layers to be fluorescent and one or more other layers to be phosphorescent.

The compound according to the invention in accordance with the embodiments indicated above can be employed here in different layers, depending on the precise structure.

Preference is given to an organic electroluminescent device comprising a compound of the formula (I) or the preferred embodiments as hole-transport material in a hole-transport or hole-injection or exciton-blocking layer or as matrix material for fluorescent or phosphorescent emitters, in particular for phosphorescent emitters. The preferred embodiments indicated above also apply to the use of the materials in organic electronic devices.

In a preferred embodiment of the invention, the compound of the formula (I) or the preferred embodiments is employed as hole-transport or hole-injection material in a hole-transport or hole-injection layer. The emitting layer here can be fluorescent or phosphorescent. A hole-injection layer in the sense of the present invention is a layer which is directly adjacent to the anode. A hole-transport layer in the sense of the present invention is a layer which is located between a hole-injection layer and an emitting layer.

In still a further preferred embodiment of the invention, the compound of the formula (I) or the preferred embodiments is employed in an exciton-blocking layer. An exciton-blocking layer is taken to mean a layer which is directly adjacent to an emitting layer on the anode side.

The compound of the formula (I) or the preferred embodiments is particularly preferably employed in a hole-transport or exciton-blocking layer.

If the compound of the formula (I) is employed as a hole-transport material in a hole-tranport layer, a hole-injection layer or an exciton-blocking layer, then the compound of formula (I) can be used in such a layer as a single material, i.e. in a proportion of 100%, or the compound of formula (I) can be used in combination with one or more further compounds in such a layer. Preferably, those further compounds are selected from typical hole transport compounds which are known in the art.

According to a preferred embodiment, the organic layer comprising the compound of formula (I) additionally comprises one or more p-dopants.

Preferred p-dopant for the present invention are organic compounds that can accept electrons (electron acceptors) and can oxidize one or more of the other compounds present in the mixture.

Particularly preferred embodiments of p-dopants are described in WO 2011/073149, EP 1968131, EP 2276085, EP 2213662, EP 1722602, EP 2045848, DE 102007031220, U.S. Pat. Nos. 8,044,390, 8,057,712, WO 2009/003455, WO 2010/094378, WO 2011/120709, US 2010/0096600, WO 2012/095143 and DE 102012209523.

Particularly preferred as p-dopants are quinodimethane compounds, azaindenofluorendione, azaphenalene, azatriphenylene, $I_2$, metal halides, preferably transition metal halides, metal oxides, preferably metal oxides containing at least one transition metal or a metal of the 3rd main group and transition metal complexes, preferably complexes of Cu, Co, Ni, Pd and Pt with ligands containing at least one oxygen atom as binding site.

Also preferred are transition metal oxides as dopants, preferably oxides of rhenium, molybdenum and tungsten, particularly preferably $Re_2O_7$, $MoO_3$, $WO_3$ and $ReO_3$.

The p-dopants are preferably distributed substantially uniformly in the p-doped layers. This can be achieved for example by co-evaporation of the p-dopant and of the hole-transport material matrix.

Particularly preferred p-dopants are selected from the compounds (D-1) to (D-13):
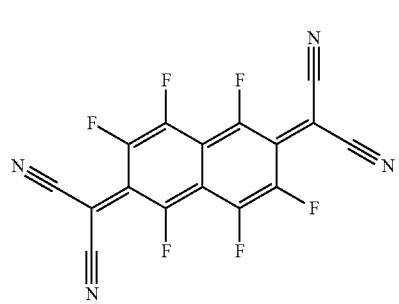 (D-1)
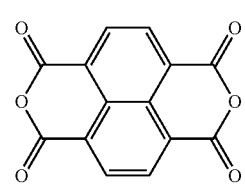 (D-2)
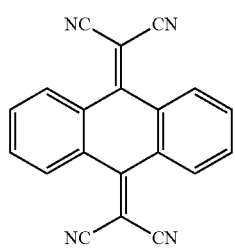 (D-3)
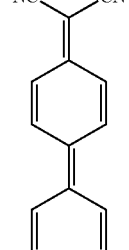 (D-4)
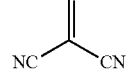 (D-5)
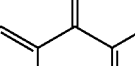 (D-6)
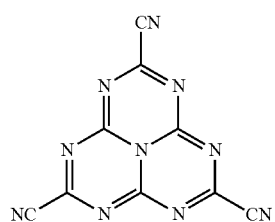 
-continued
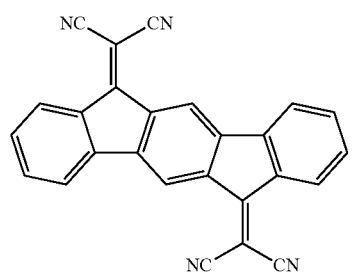 (D-7)
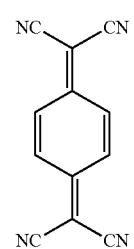 (D-8)
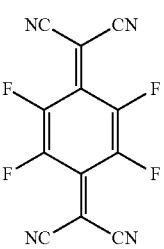 (D-9)
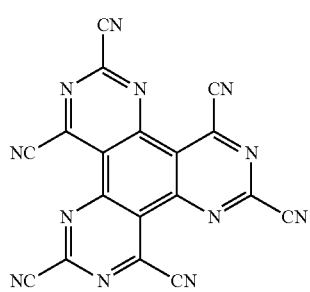 (D-10)
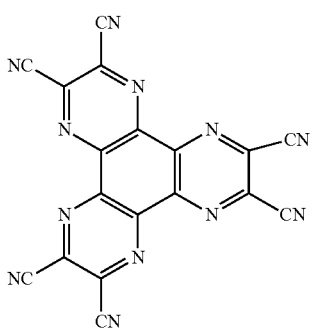 (D-11)

(D-12)

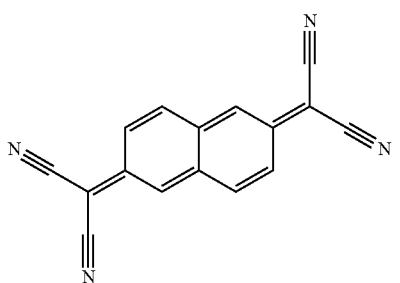

(D-13)

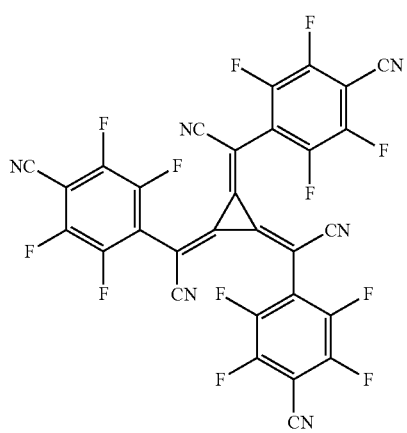

In an embodiment of the invention, the compound of the formula (I) or the preferred embodiments is used in a hole-transport or -injection layer in combination with a layer which comprises a hexaazatriphenylene derivative, in particular hexacyanohexaazatriphenylene (for example in accordance with EP 1175470). Thus, for example, preference is given to a combination which looks as follows: anode—hexaazatriphenylene derivative—hole-transport layer, where the hole-transport layer comprises one or more compounds of the formula (I) or the preferred embodiments. It is likewise possible in this structure to use a plurality of successive hole-transport layers, where at least one hole-transport layer comprises at least one compound of the formula (I) or the preferred embodiments. A further preferred combination looks as follows: anode—hole-transport layer—hexaazatriphenylene derivative—hole-transport layer, where at least one of the two hole-transport layers comprises one or more compounds of the formula (I) or the preferred embodiments. It is likewise possible in this structure to use a plurality of successive hole-transport layers instead of one hole-transport layer, where at least one hole-transport layer comprises at least one compound of the formula (I) or the preferred embodiments.

Preferably, the inventive OLED comprises two or more different hole-transporting layers. The compound of the formula (I) may be used here in one or more of or in all the hole-transporting layers. According to a preferred embodiment, the compound of the formula (I) is used in exactly one hole-transporting layer, and other compounds, preferably aromatic amine compounds, are used in the further hole-transporting layers present.

In a further preferred embodiment of the invention, the compound of the formula (I) or the preferred embodiments is employed as matrix material for a fluorescent or phosphorescent compound, in particular for a phosphorescent compound, in an emitting layer. The organic electroluminescent device here may comprise one emitting layer or a plurality of emitting layers, where at least one emitting layer comprises at least one compound according to the invention as matrix material.

If the compound of the formula (I) or the preferred embodiments is employed as matrix material for an emitting compound in an emitting layer, it is preferably employed in combination with one or more phosphorescent materials (triplet emitters). Phosphorescence in the sense of this invention is taken to mean the luminescence from an excited state having a spin multiplicity >1, in particular from an excited triplet state. For the purposes of this application, all luminescent complexes containing transition metals or lanthanoids, in particular all luminescent iridium, platinum and copper complexes, are to be regarded as phosphorescent compounds.

The mixture comprising the matrix material, which comprises the compound of the formula (I) or the preferred embodiments, and the emitting compound comprises between 99.9 and 1% by volume, preferably between 99 and 10% by volume, particularly preferably between 97 and 60% by volume, in particular between 95 and 80% by volume, of the matrix material, based on the entire mixture comprising emitter and matrix material. Correspondingly, the mixture comprises between 0.1 and 99% by volume, preferably between 1 and 90% by volume, particularly preferably between 3 and 40% by volume, in particular between 5 and 20% by volume, of the emitter, based on the entire mixture comprising emitter and matrix material.

A particularly preferred embodiment of the present invention is the use of the compound of the formula (I) or the preferred embodiments as matrix material for a phosphorescent emitter in combination with a further matrix material. Particularly suitable matrix materials which can be employed in combination with the compounds of the formula (I) are the ones mentioned below as preferred triplet matrix materials.

It is furthermore possible to use the compound of the formula (I) or the preferred embodiments both in a hole-transport layer or exciton-blocking layer and as matrix in an emitting layer.

In the further layers of the organic electroluminescent device according to the invention, it is possible to use all materials as usually employed in accordance with the prior art. The person skilled in the art will therefore be able, without inventive step, to employ all materials known for organic electroluminescent devices in combination with the compounds of the formula (I) according to the invention or the preferred embodiments.

Preferred embodiments of the different functional materials in the electronic device are listed hereinafter.

Suitable phosphorescent compounds (=triplet emitters) are, in particular, compounds which emit light, preferably in the visible region, on suitable excitation and in addition contain at least one atom having an atomic number greater than 20, preferably greater than 38 and less than 84, particularly preferably greater than 56 and less than 80, in particular a metal having this atomic number. The phosphorescent emitters used are preferably compounds which contain copper, molybdenum, tungsten, rhenium, ruthenium, osmium, rhodium, iridium, palladium, platinum, silver, gold or europium, in particular compounds which contain iridium, platinum or copper.

Examples of the emitters described above are revealed by the applications WO 2000/70655, WO 2001/41512, WO 2002/02714, WO 2002/15645, EP 1191613, EP 1191612, EP 1191614, WO 2005/033244, WO 2005/019373, US 2005/

0258742, WO 2009/146770, WO 2010/015307, WO 2010/031485, WO 2010/054731, WO 2010/054728, WO 2010/086089, WO 2010/099852, WO 2010/102709, WO 2011/157339 or WO 2012/007086. In general, all phosphorescent complexes as used in accordance with the prior art for phosphorescent OLEDs and as are known to the person skilled in the art in the area of organic electroluminescence are suitable, and the person skilled in the art will be able to use further phosphorescent complexes without inventive step.

Preferred phosphorescent emitting compounds are those mentioned above, and those listed in the following table.

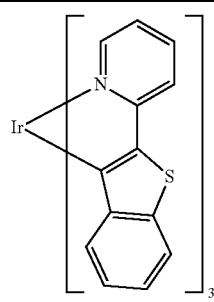

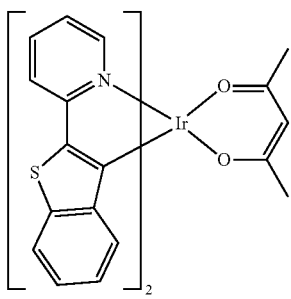

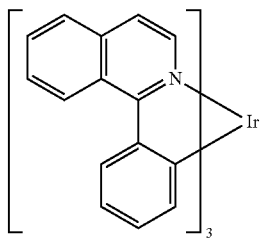

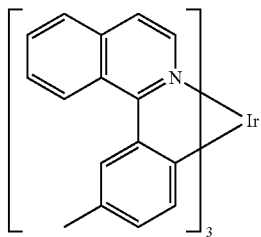

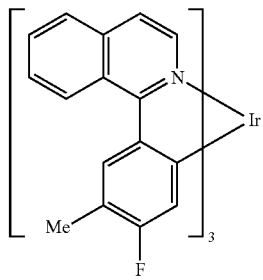

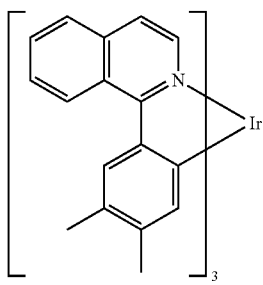

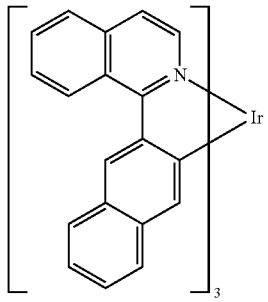

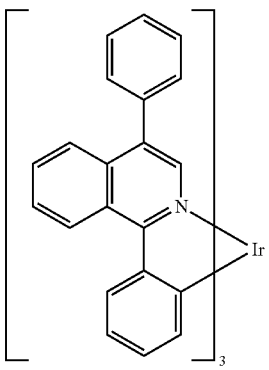

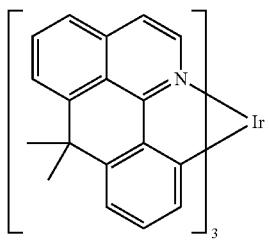

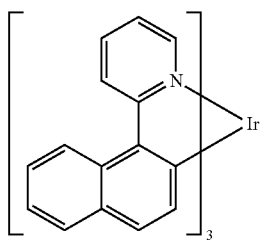
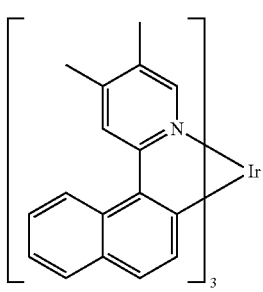
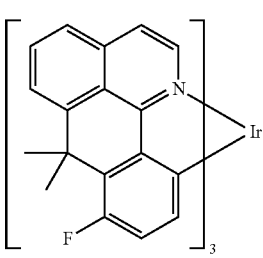
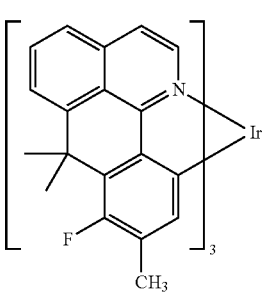
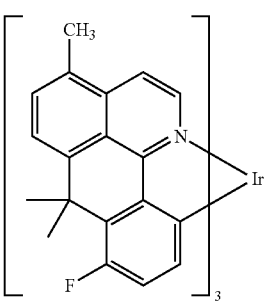
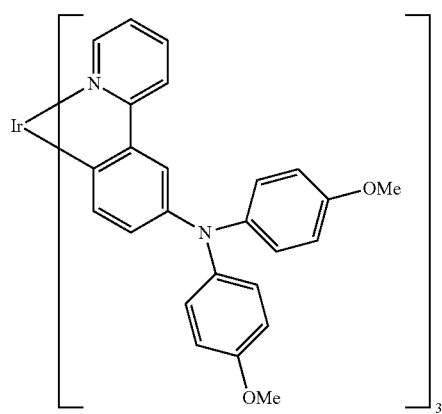
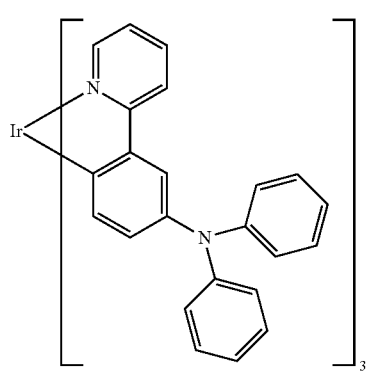
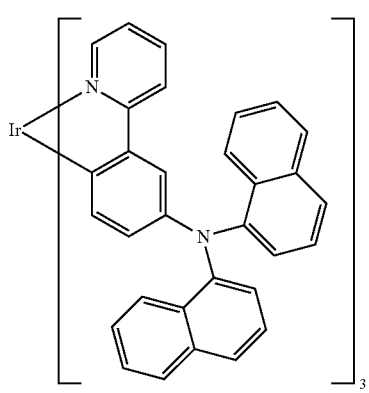
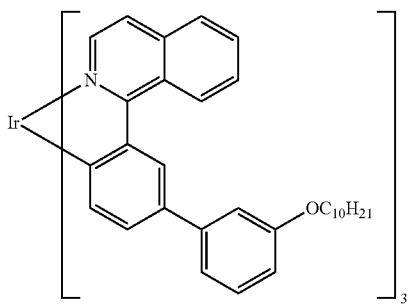

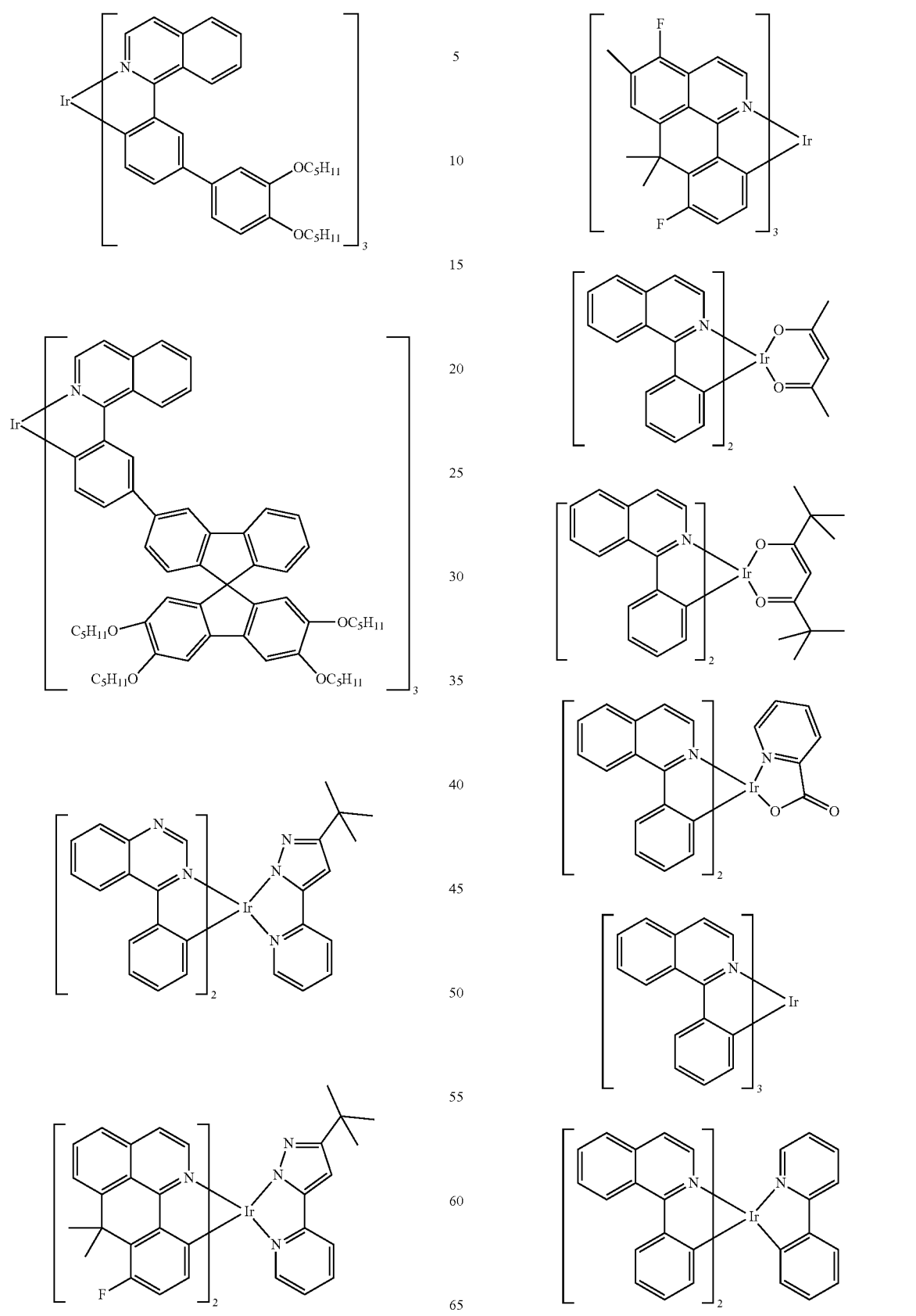

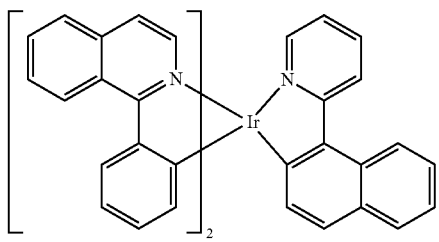
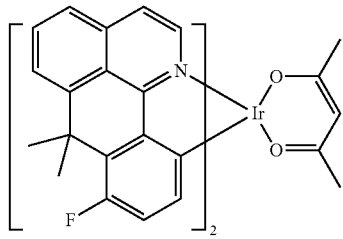
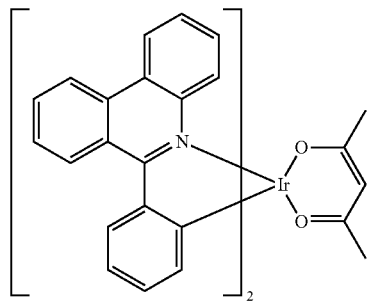
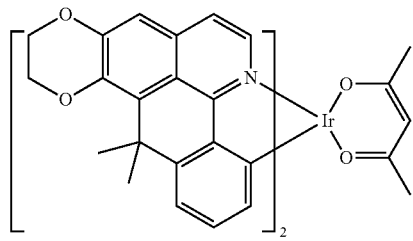
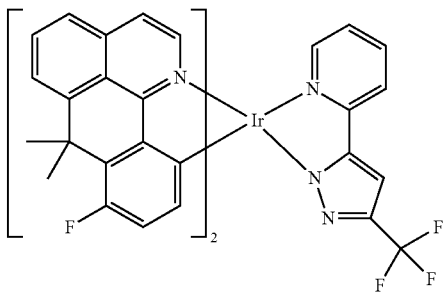
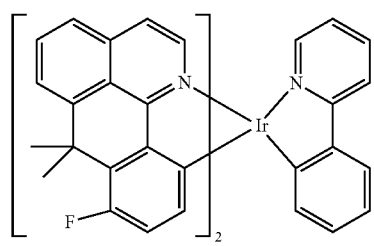
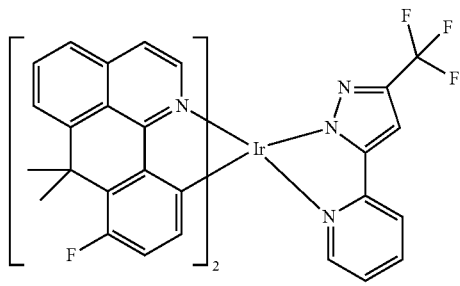
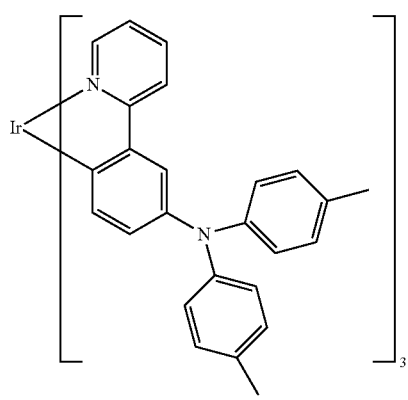
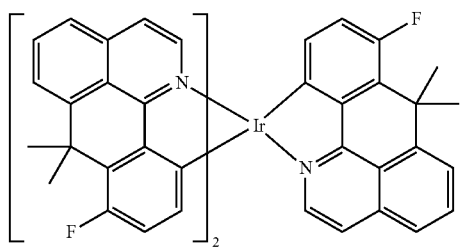
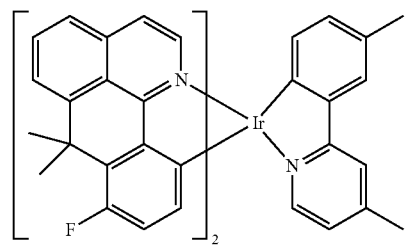
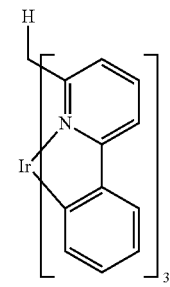

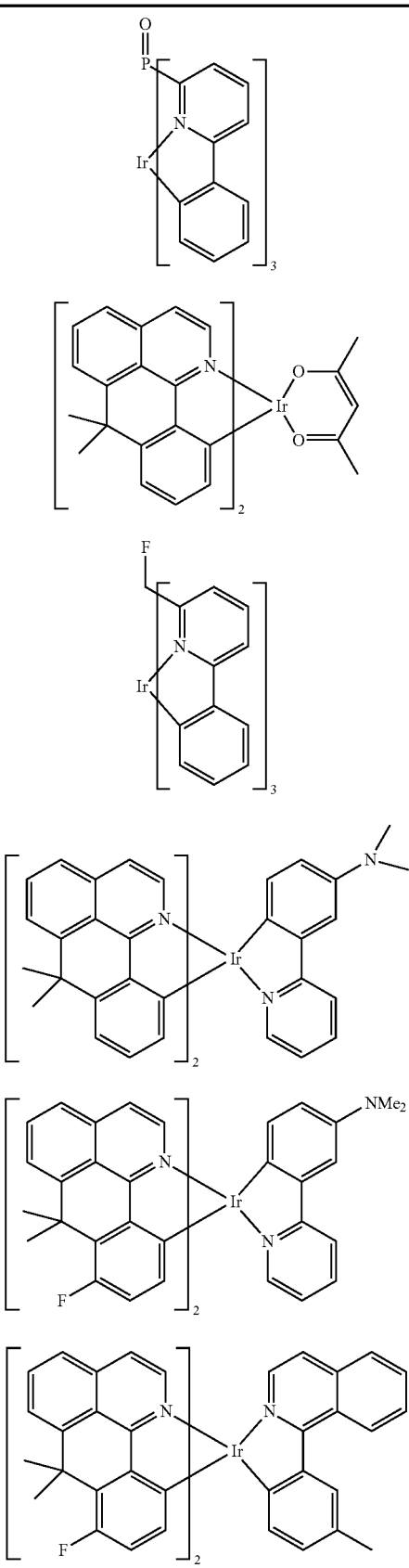
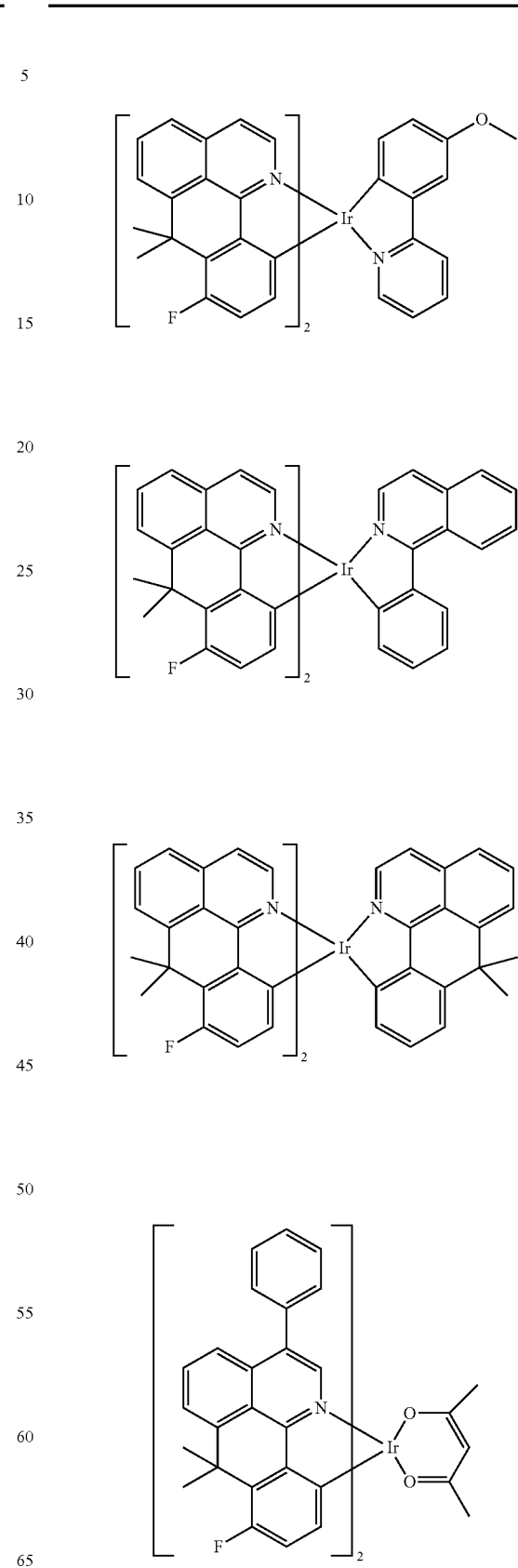

127
-continued
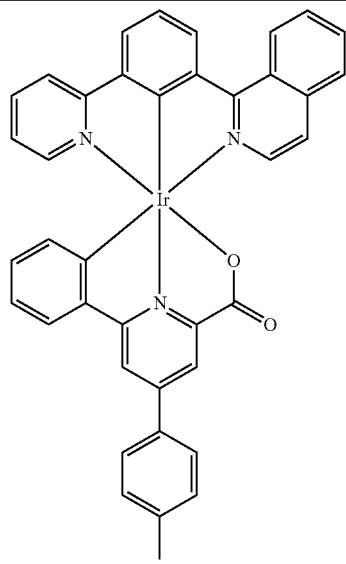
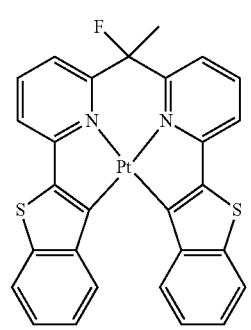
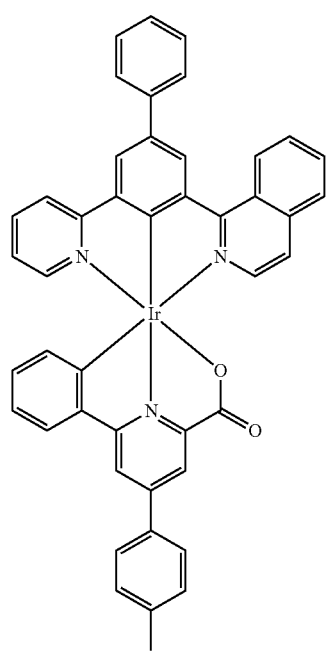
128
-continued
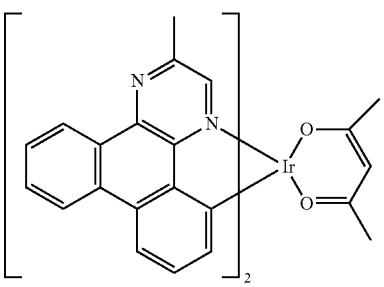
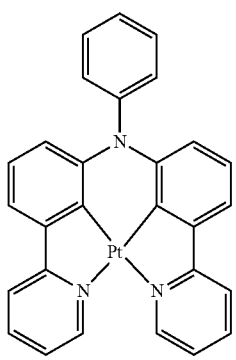
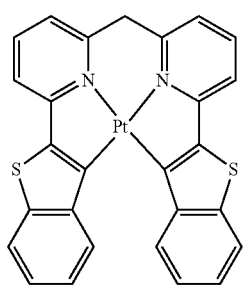
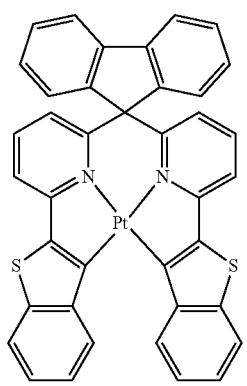
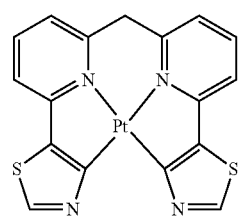

| 129 -continued | 130 -continued |
|---|---|
| 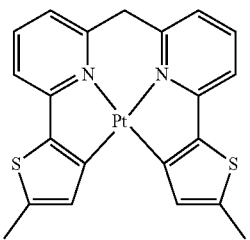 | 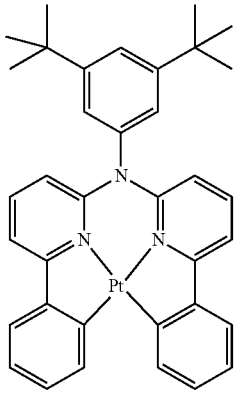 |
| 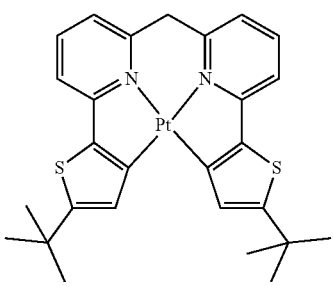 | 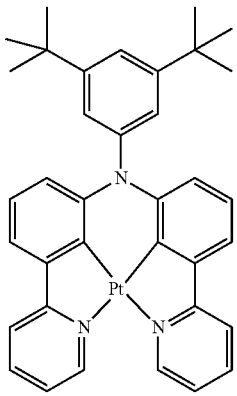 |
| 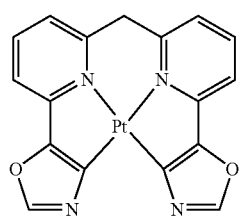 | 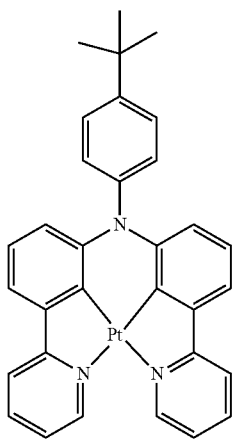 |
| 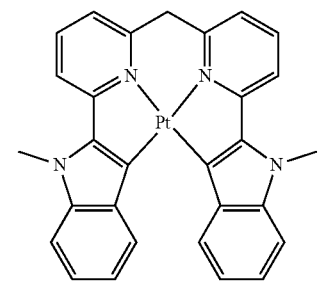 | |
| 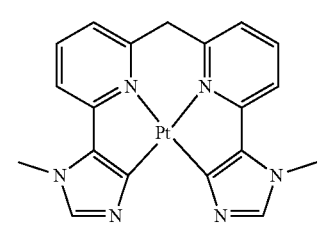 | 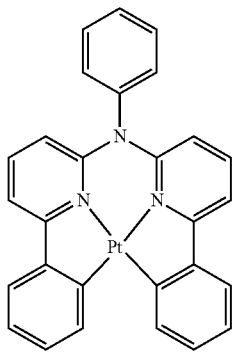 |

| 131 -continued | 132 -continued |
|---|---|
| 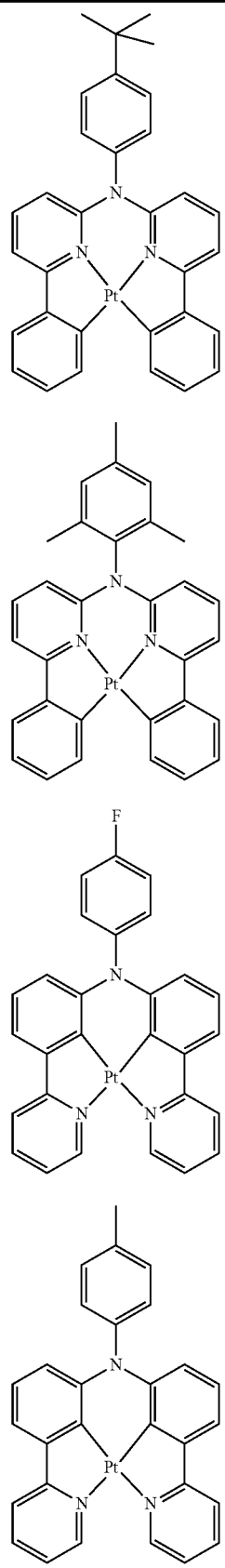 | 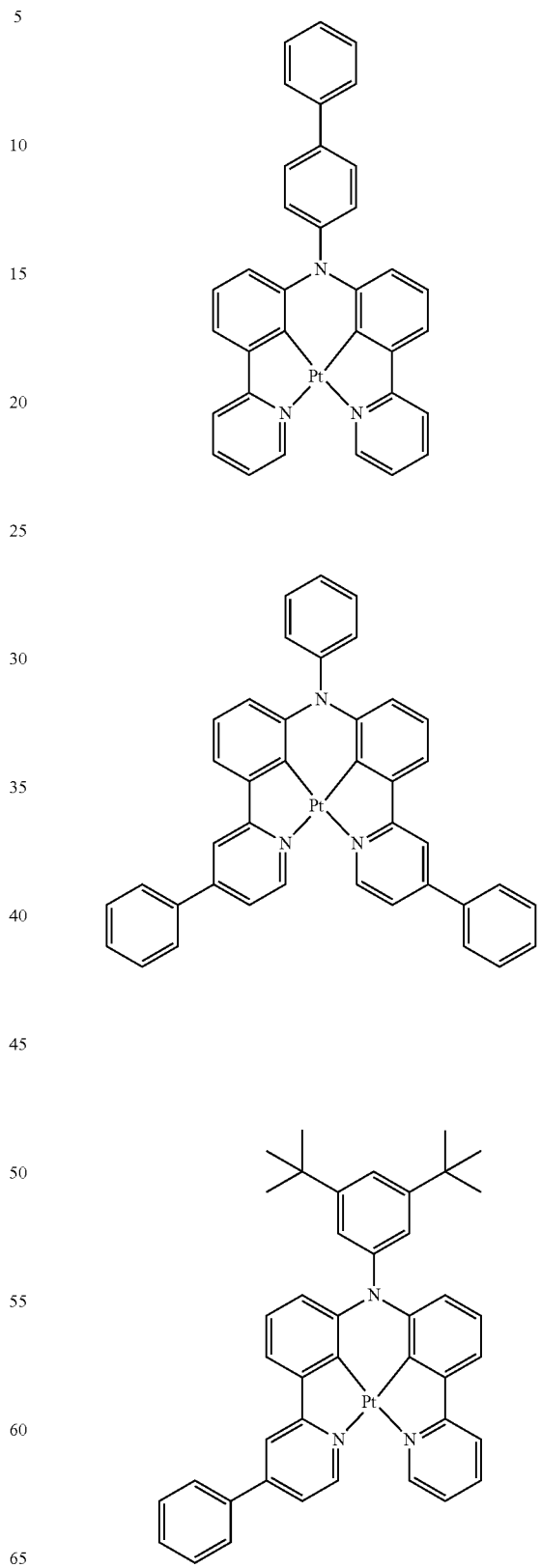 |

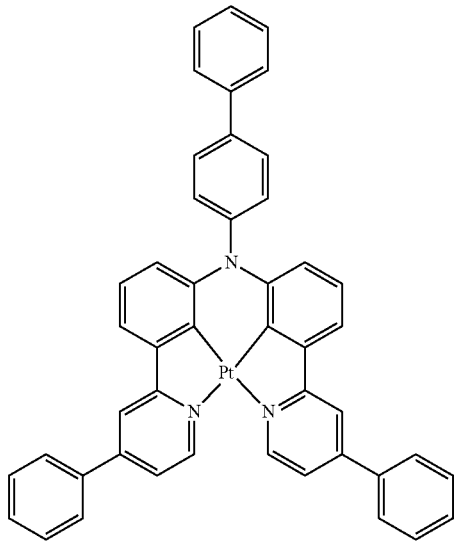
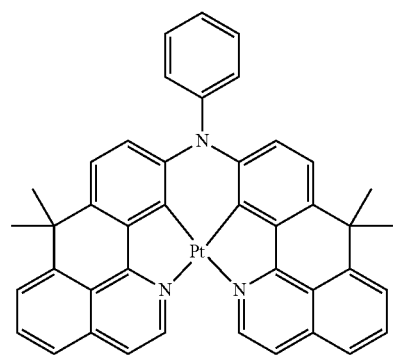
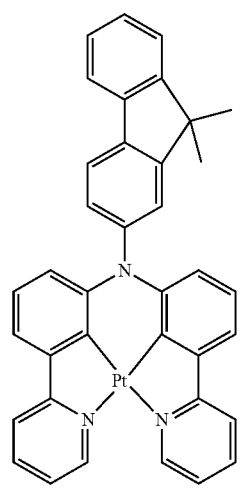
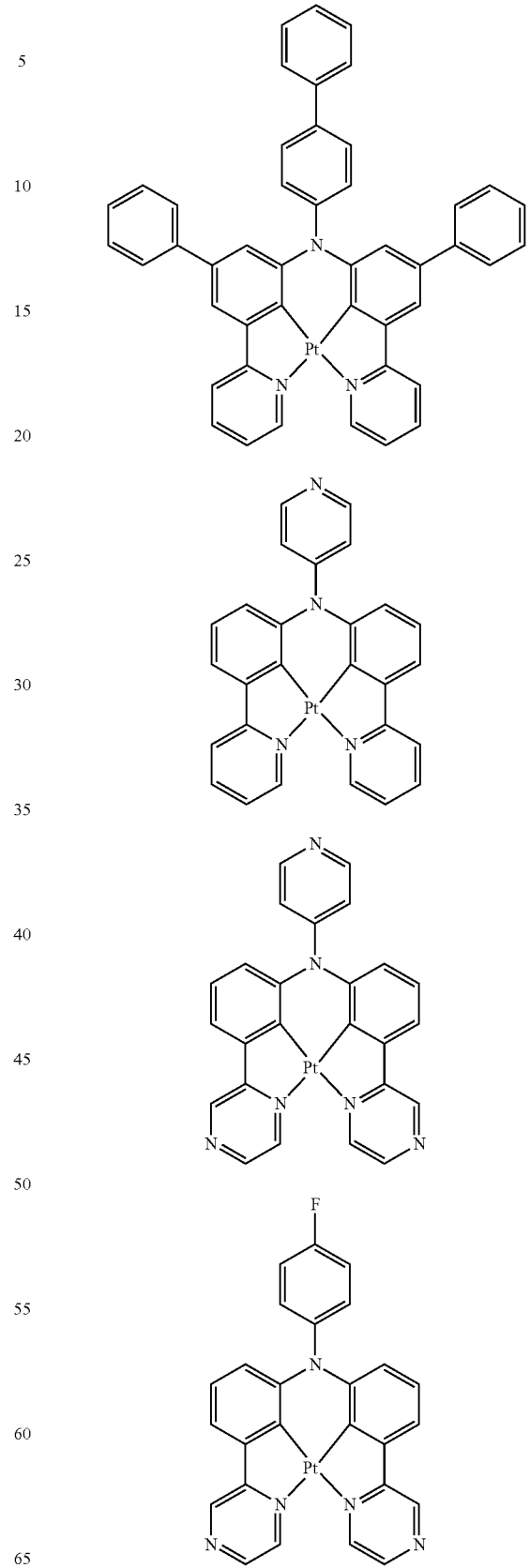

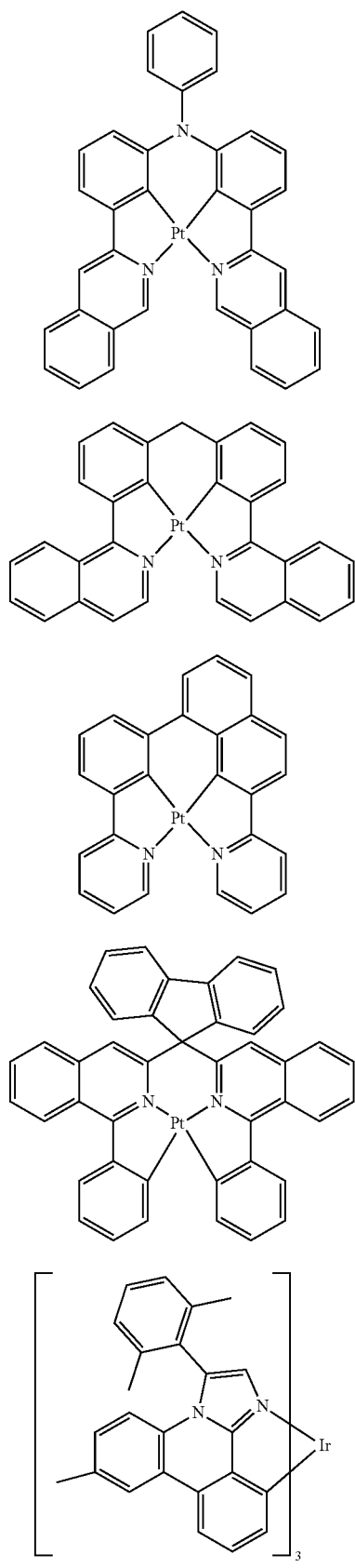
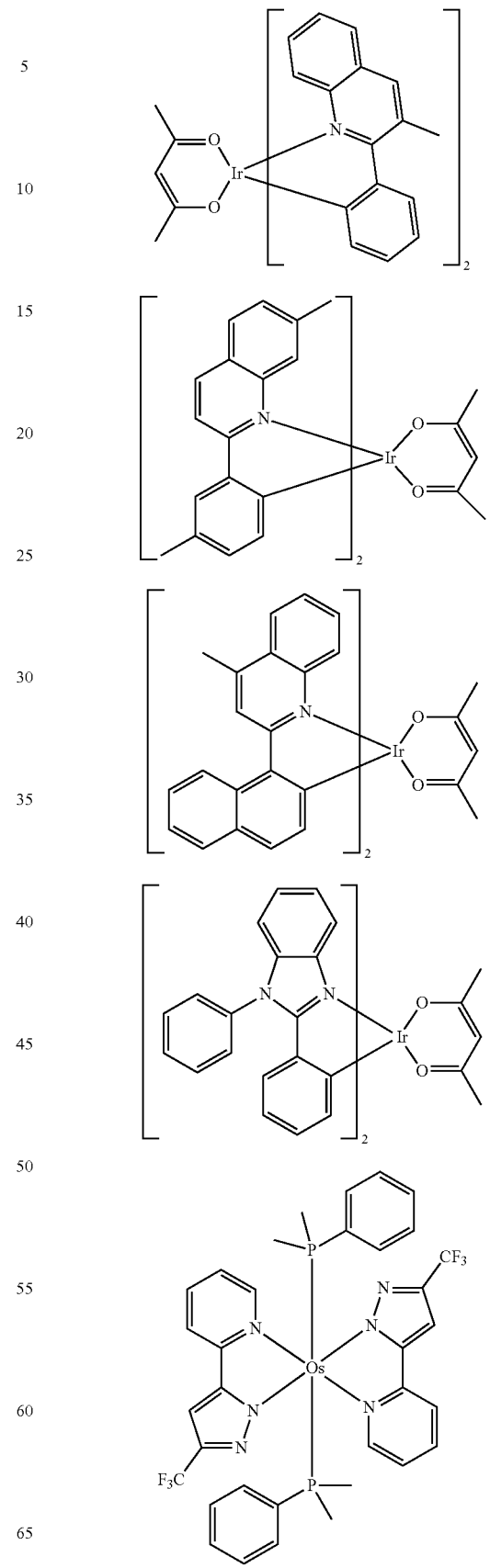

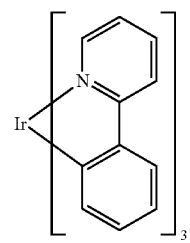
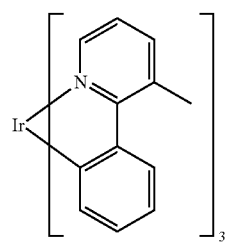
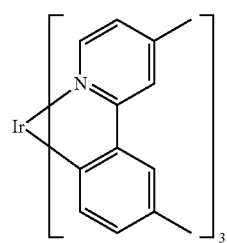
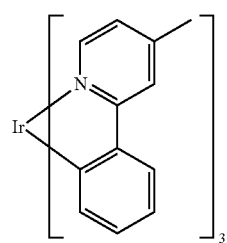
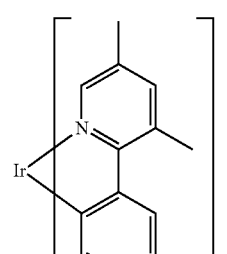
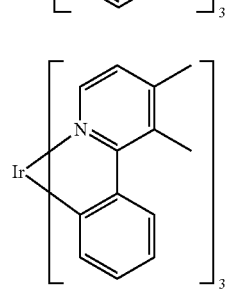
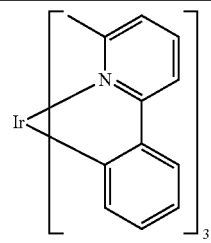
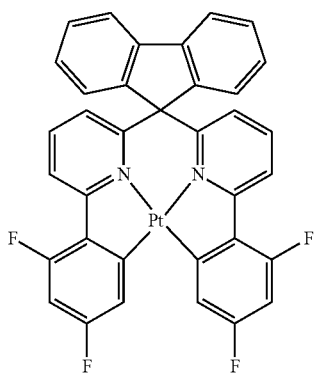
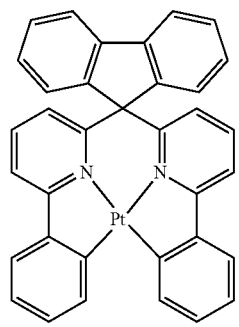
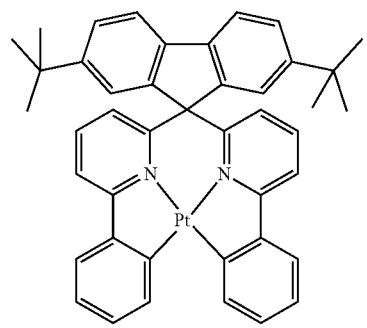
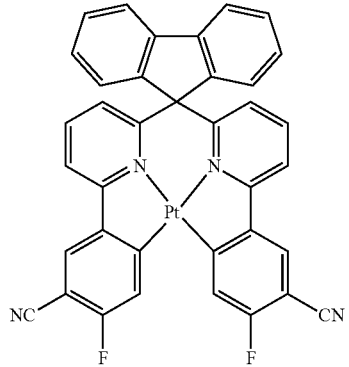

-continued
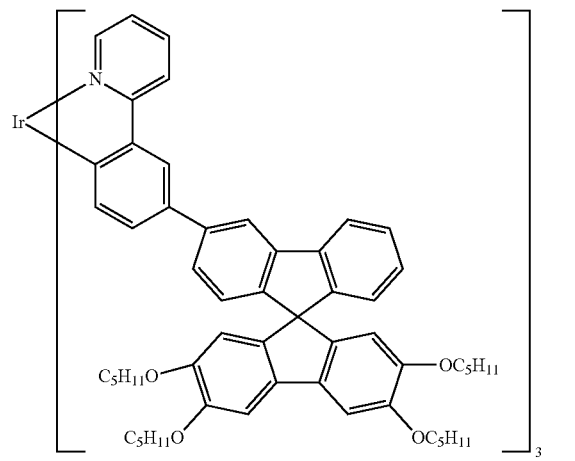
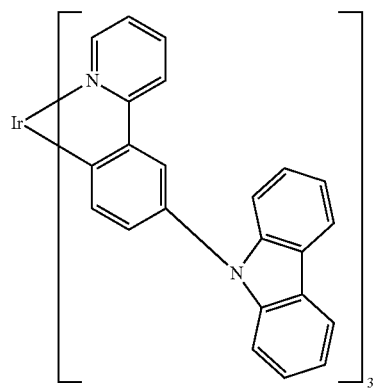
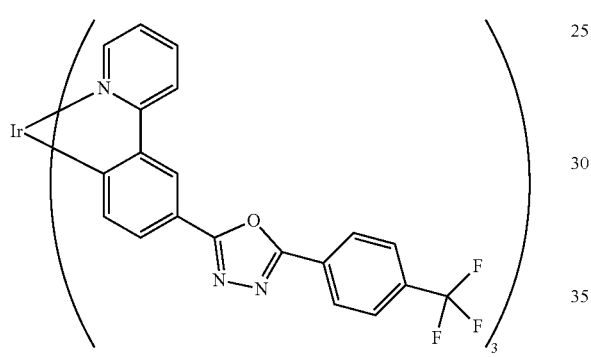
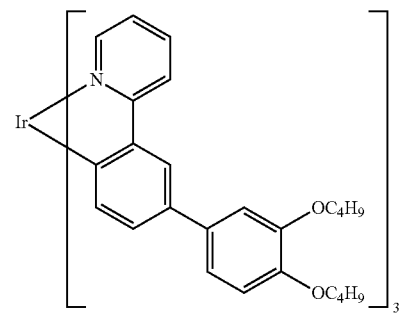
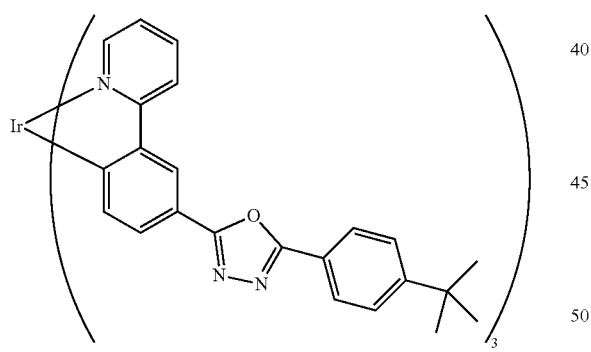
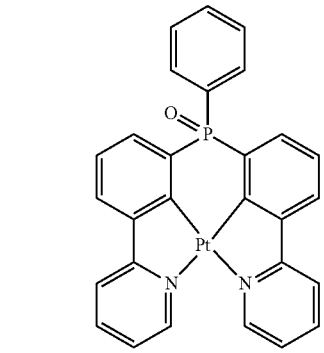
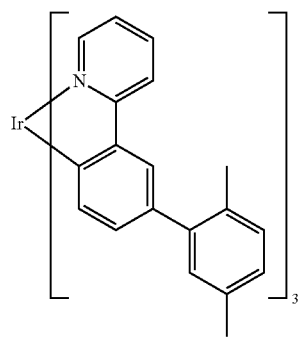
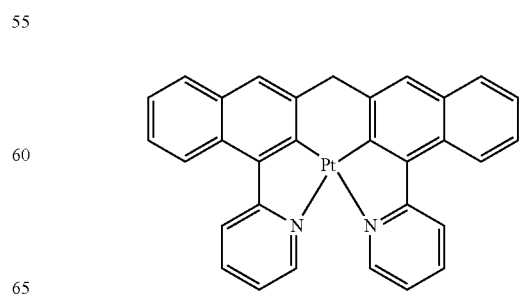

141
-continued
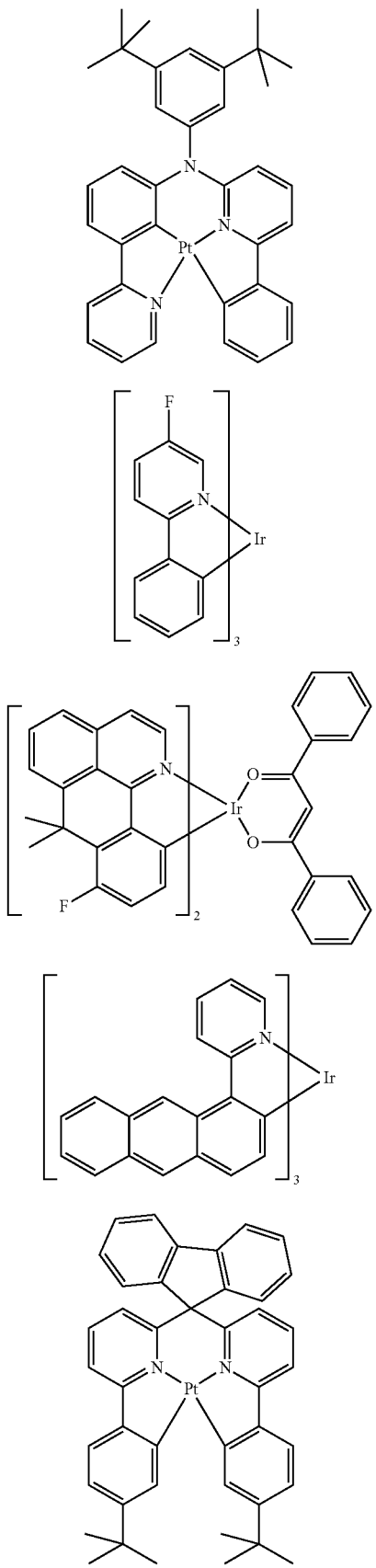
142
-continued
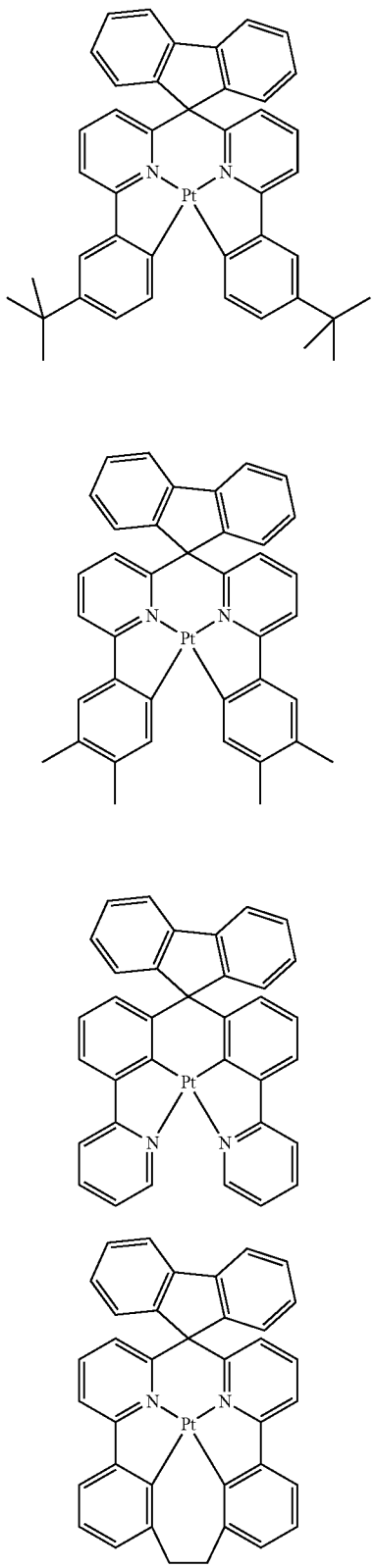

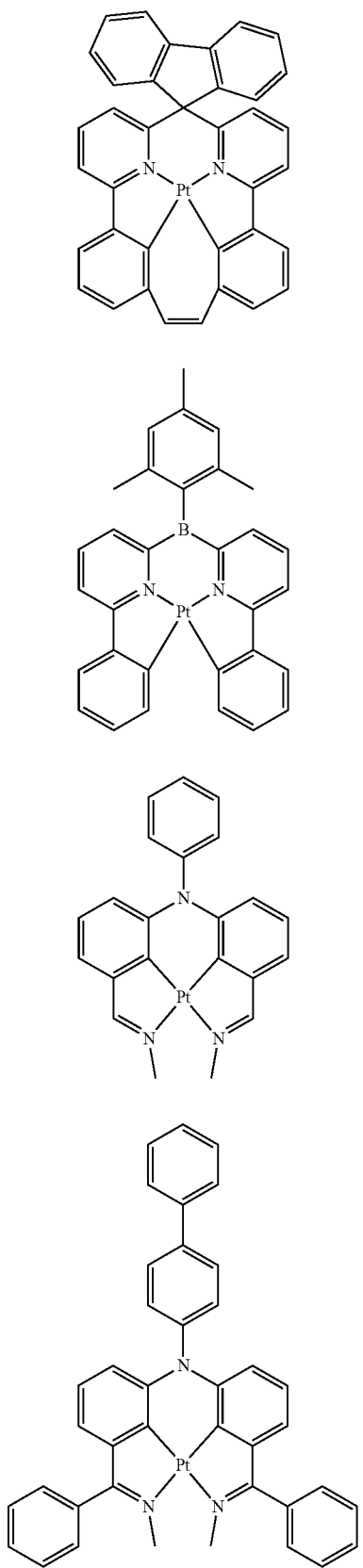
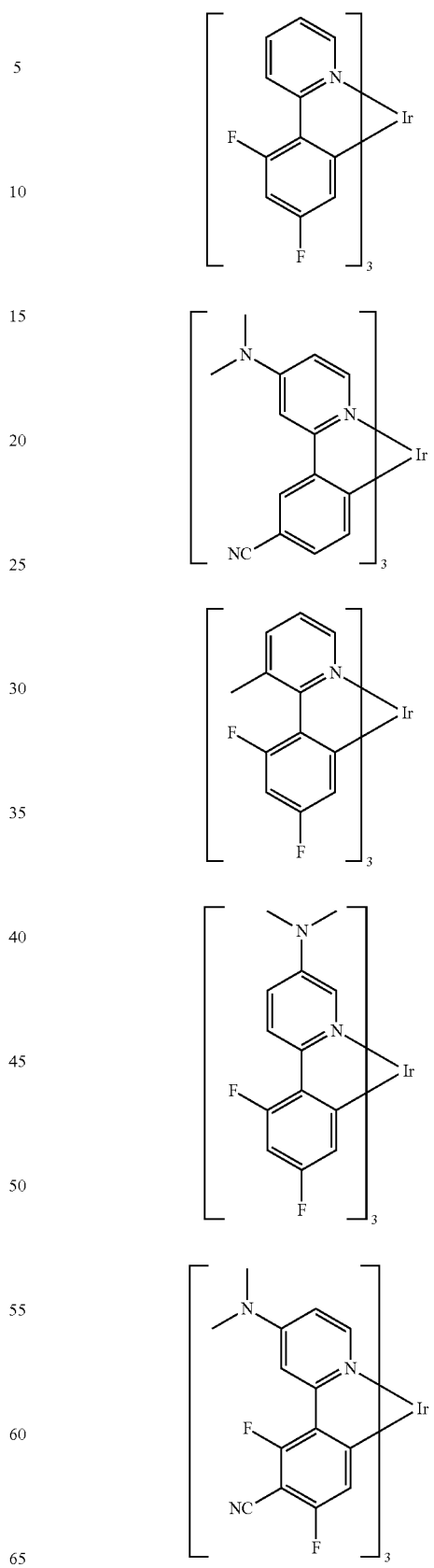

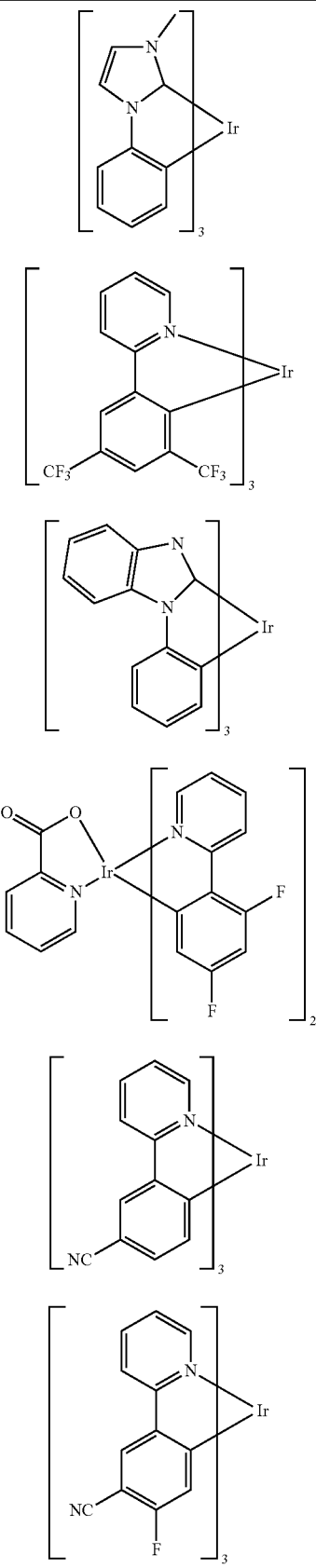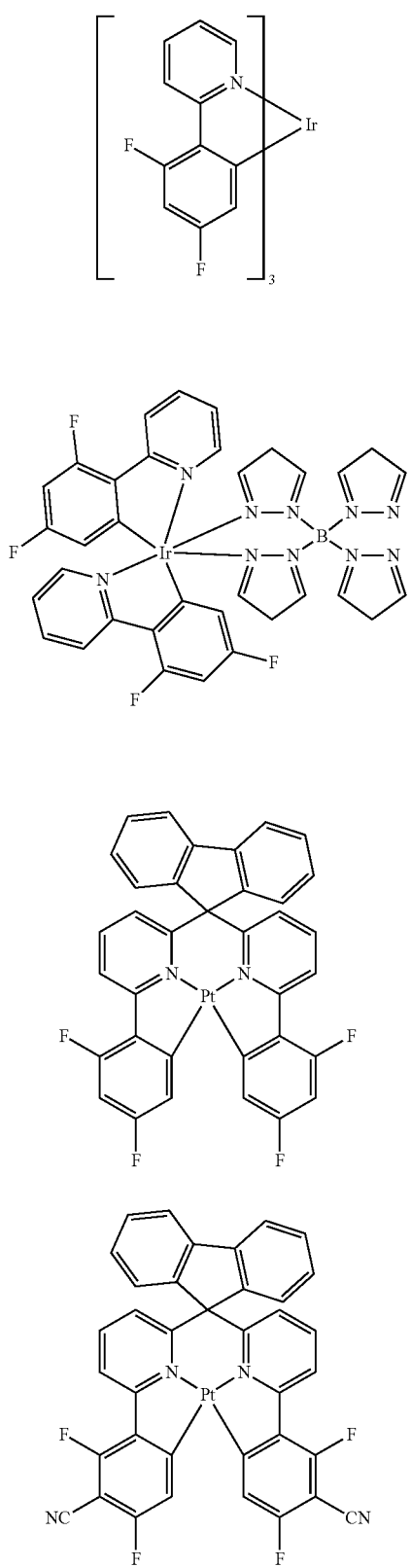

147
-continued
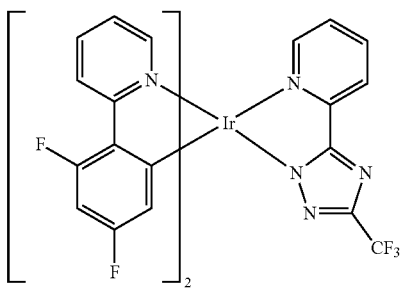
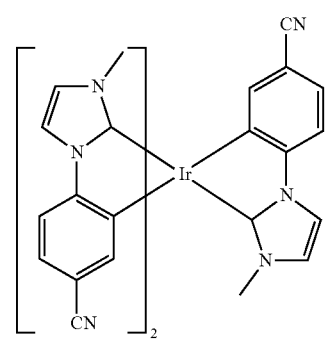
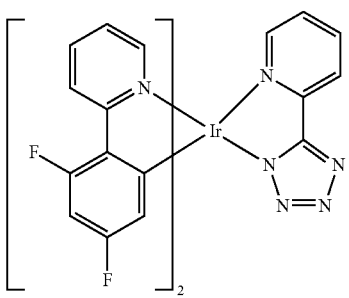
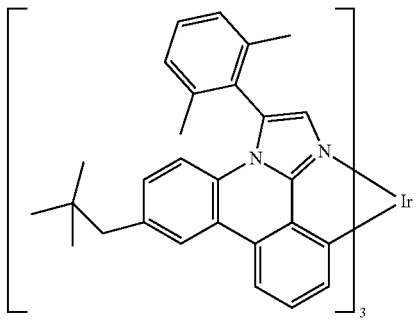
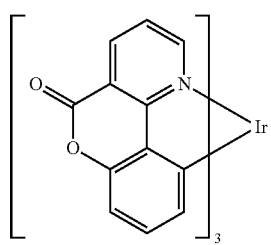
148
-continued
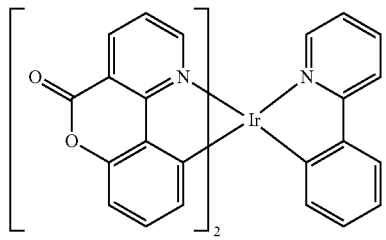
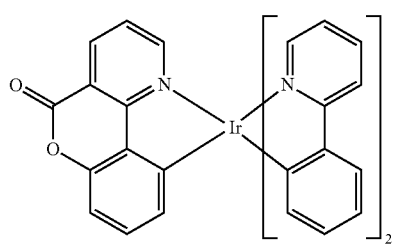
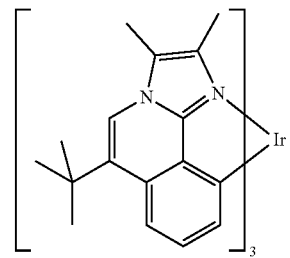
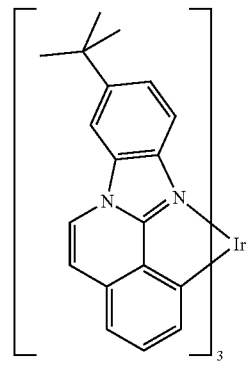
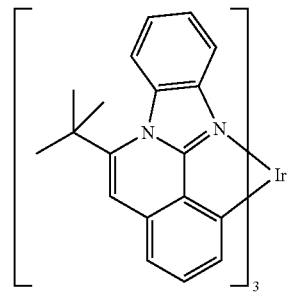

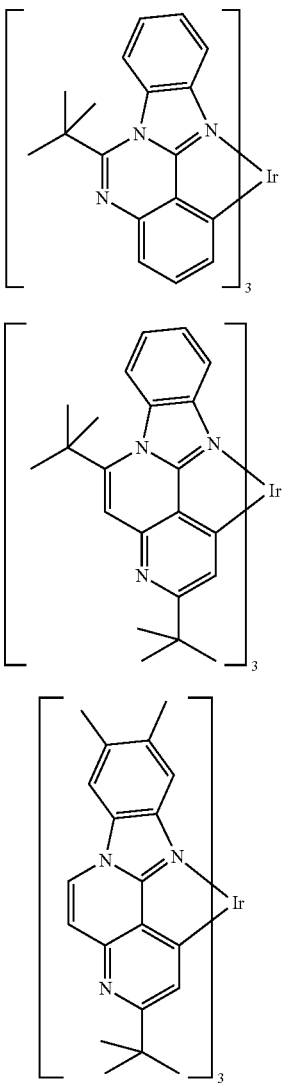

Preferred fluorescent emitting compounds are selected from the class of the arylamines. An arylamine or an aromatic amine in the context of this invention is understood to mean a compound containing three substituted or unsubstituted aromatic or heteroaromatic ring systems bonded directly to the nitrogen. Preferably, at least one of these aromatic or heteroaromatic ring systems is a fused ring system, more preferably having at least 14 aromatic ring atoms. Preferred examples of these are aromatic anthraceneamines, aromatic anthracenediamines, aromatic pyreneamines, aromatic pyrenediamines, aromatic chryseneamines or aromatic chrysenediamines. An aromatic anthraceneamine is understood to mean a compound in which a diarylamino group is bonded directly to an anthracene group, preferably in the 9 position. An aromatic anthracenediamine is understood to mean a compound in which two diarylamino groups are bonded directly to an anthracene group, preferably in the 9,10 positions. Aromatic pyreneamines, pyrenediamines, chryseneamines and chrysenediamines are defined analogously, where the diarylamino groups in the pyrene are bonded preferably in the 1 position or 1,6 positions. Further preferred emitting compounds are indenofluoreneamines or -diamines, for example according to WO 2006/108497 or WO 2006/122630, benzoindenofluoreneamines or -diamines, for example according to WO 2008/006449, and dibenzoindenofluoreneamines or -diamines, for example according to WO 2007/140847, and the indenofluorene derivatives having fused aryl groups disclosed in WO 2010/012328. Likewise preferred are the pyrenearylamines disclosed in WO 2012/048780 and in WO 2013/185871. Likewise preferred are the benzoindenofluoreneamines disclosed in WO 2014/037077, the benzofluoreneamines disclosed in WO 2014/106522 and the extended benzoindenofluorenes disclosed in WO 2014/111269.

Useful matrix materials, preferably for fluorescent emitting compounds, include materials of various substance classes. Preferred matrix materials are selected from the classes of the oligoarylenes (e.g. 2,2',7,7'-tetraphenylspirobifluorene according to EP 676461 or dinaphthylanthracene), especially of the oligoarylenes containing fused aromatic groups, the oligoarylenevinylenes (e.g. DPVBi or spiro-DPVBi according to EP 676461), the polypodal metal complexes (for example according to WO 2004/081017), the hole-conducting compounds (for example according to WO 2004/058911), the electron-conducting compounds, especially ketones, phosphine oxides, sulphoxides, etc. (for example according to WO 2005/084081 and WO 2005/084082), the atropisomers (for example according to WO 2006/048268), the boronic acid derivatives (for example according to WO 2006/117052) or the benzanthracenes (for example according to WO 2008/145239). Particularly preferred matrix materials are selected from the classes of the oligoarylenes comprising naphthalene, anthracene, benzanthracene and/or pyrene or atropisomers of these compounds, the oligoarylenevinylenes, the ketones, the phosphine oxides and the sulphoxides. Very particularly preferred matrix materials are selected from the classes of the oligoarylenes comprising, anthracene, benzanthracene, benzophenanthrene and/or pyrene or atropisomers of these compounds. An oligoarylene in the context of this invention shall be understood to mean a compound in which at least three aryl or arylene groups are bonded to one another. Preference is further given to the anthracene derivatives disclosed in WO 2006/097208, WO 2006/131192, WO 2007/065550, WO 2007/110129, WO 2007/065678, WO 2008/145239, WO 2009/100925, WO 2011/054442 and EP 1553154, and the pyrene compounds disclosed in EP 1749809, EP 1905754 and US 2012/0187826.

Preferred matrix materials for phosphorescent emitting compounds are, as well as the compounds of the formula (I), aromatic ketones, aromatic phosphine oxides or aromatic sulphoxides or sulphones, for example according to WO 2004/013080, WO 2004/093207, WO 2006/005627 or WO 2010/006680, triarylamines, carbazole derivatives, e.g. CBP (N,N-biscarbazolylbiphenyl) or the carbazole derivatives disclosed in WO 2005/039246, US 2005/0069729, JP 2004/288381, EP 1205527 or WO 2008/086851, indolocarbazole derivatives, for example according to WO 2007/063754 or WO 2008/056746, indenocarbazole derivatives, for example according to WO 2010/136109, WO 2011/000455 or WO 2013/041176, azacarbazole derivatives, for example according to EP 1617710, EP 1617711, EP 1731584, JP 2005/347160, bipolar matrix materials, for example according to WO 2007/137725, silanes, for example according to WO 2005/111172, azaboroles or boronic esters, for example according to WO 2006/117052, triazine derivatives, for example according to WO 2010/015306, WO 2007/063754 or WO 2008/056746, zinc complexes, for example according to EP 652273 or WO 2009/062578, diazasilole or tetraazasilole derivatives, for example according to WO 2010/054729, diazaphosphole derivatives, for example according to WO 2010/054730, bridged carbazole derivatives, for example according to US 2009/0136779, WO 2010/050778, WO 2011/042107, WO 2011/088877 or WO 2012/143080, triphenylene derivatives, for example according to WO 2012/048781, or lactams, for example according to WO 2011/116865 or WO 2011/137951.

Suitable charge transport materials as usable in the hole injection or hole transport layer or electron blocker layer or in the electron transport layer of the electronic device of the invention are, as well as the compounds of the formula (I), for example, the compounds disclosed in Y. Shirota et al., Chem. Rev. 2007, 107(4), 953-1010, or other materials as used in these layers according to the prior art.

Materials used for the electron transport layer may be any materials as used according to the prior art as electron transport materials in the electron transport layer. Especially suitable are aluminium complexes, for example $Alq_3$, zirconium complexes, for example $Zrq_4$, lithium complexes, for example Liq, benzimidazole derivatives, triazine derivatives, pyrimidine derivatives, pyridine derivatives, pyrazine derivatives, quinoxaline derivatives, quinoline derivatives, oxadiazole derivatives, aromatic ketones, lactams, boranes, diazaphosphole derivatives and phosphine oxide derivatives. Further suitable materials are derivatives of the above-mentioned compounds as disclosed in JP 2000/053957, WO 2003/060956, WO 2004/028217, WO 2004/080975 and WO 2010/072300.

Preferred cathodes of the electronic device are metals having a low work function, metal alloys or multilayer structures composed of various metals, for example alkaline earth metals, alkali metals, main group metals or lanthanoids (e.g. Ca, Ba, Mg, Al, In, Mg, Yb, Sm, etc.). Additionally suitable are alloys composed of an alkali metal or alkaline earth metal and silver, for example an alloy composed of magnesium and silver. In the case of multilayer structures, in addition to the metals mentioned, it is also possible to use further metals having a relatively high work function, for example Ag or Al, in which case combinations of the metals such as Ca/Ag, Mg/Ag or Ba/Ag, for example, are generally used. It may also be preferable to introduce a thin interlayer of a material having a high dielectric constant between a metallic cathode and the organic semiconductor. Examples of useful materials for this purpose are alkali metal or alkaline earth metal fluorides, but also the corresponding oxides or carbonates (e.g. LiF, $Li_2O$, $BaF_2$, MgO, NaF, CsF, $Cs_2CO_3$, etc.). It is also possible to use lithium quinolinate (LiQ) for this purpose. The layer thickness of this layer is preferably between 0.5 and 5 nm.

Preferred anodes are materials having a high work function. Preferably, the anode has a work function of greater than 4.5 eV versus vacuum. Firstly, metals having a high redox potential are suitable for this purpose, for example Ag, Pt or Au. Secondly, metal/metal oxide electrodes (e.g. Al/Ni/$NiO_x$, Al/$PtO_x$) may also be preferred. For some applications, at least one of the electrodes has to be transparent or partly transparent in order to enable the irradiation of the organic material (organic solar cell) or the emission of light (OLED, O-LASER). Preferred anode materials here are conductive mixed metal oxides. Particular preference is given to indium tin oxide (ITO) or indium zinc oxide (IZO). Preference is further given to conductive doped organic materials, especially conductive doped polymers. In addition, the anode may also consist of two or more layers, for example of an inner layer of ITO and an outer layer of a metal oxide, preferably tungsten oxide, molybdenum oxide or vanadium oxide.

Preference is furthermore given to an organic electroluminescent device, characterised in that one or more layers are applied by means of a sublimation process, in which the materials are vapour-deposited in vacuum sublimation units at an initial pressure of usually less than $10^{-5}$ mbar, preferably less than $10^{-6}$ mbar. However, it is also possible for the initial pressure to be even lower, for example less than $10^{-7}$ mbar.

Preference is likewise given to an organic electroluminescent device, characterised in that one or more layers are applied by means of the OVPD (organic vapour phase deposition) process or with the aid of carrier-gas sublimation, in which the materials are applied at a pressure between $10^{-5}$ mbar and 1 bar. A special case of this process is the OVJP (organic vapour jet printing) process, in which the materials are applied directly through a nozzle and thus structured (for example M. S. Arnold et al., *Appl. Phys. Lett.* 2008, 92, 053301).

Preference is furthermore given to an organic electroluminescent device, characterised in that one or more layers are produced from solution, such as, for example, by spin coating, or by means of any desired printing process, such as, for example, LITI (light induced thermal imaging, thermal transfer printing), ink-jet printing, screen printing, flexographic printing, offset printing or nozzle printing. Soluble compounds, which are obtained, for example, by suitable substitution, are necessary for this purpose. These processes are also particularly suitable for the compounds according to the invention, since these generally have very good solubility in organic solvents.

Also possible are hybrid processes, in which, for example, one or more layers are applied from solution and one or more further layers are applied by vapour deposition. Thus, for example, the emitting layer can be applied from solution and the electron-transport layer by vapour deposition.

These processes are generally known to the person skilled in the art and can be applied by him without inventive step to organic electroluminescent devices comprising the compounds according to the invention.

For the processing of the inventive compounds from the liquid phase, for example by spin-coating or by printing methods, formulations of the inventive compounds are required. These formulations may, for example, be solutions, dispersions or emulsions. For this purpose, it may be preferable to use mixtures of two or more solvents. Suitable and preferred solvents are, for example, toluene, anisole, o-, m- or p-xylene, methyl benzoate, mesitylene, tetralin, veratrole, THF, methyl-THF, THP, chlorobenzene, dioxane, phenoxytoluene, especially 3-phenoxytoluene, (−)-fenchone, 1,2,3,5-tetramethylbenzene, 1,2,4,5-tetramethylbenzene, 1-methylnaphthalene, 2-methylbenzothiazole, 2-phenoxyethanol, 2-pyrrolidinone, 3-methylanisole, 4-methylanisole, 3,4-dimethylanisole, 3,5-dimethylanisole, acetophenone, α-terpineol, benzothiazole, butyl benzoate, cumene, cyclohexanol, cyclohexanone, cyclohexylbenzene, decalin, dodecylbenzene, ethyl benzoate, indane, methyl benzoate, NMP, pcymene, phenetole, 1,4-diisopropylbenzene, dibenzyl ether, diethylene glycol butyl methyl ether, triethylene glycol butyl methyl ether, diethylene glycol dibutyl ether, triethylene glycol dimethyl ether, diethylene glycol monobutyl ether, tripropylene glycol dimethyl ether, tetraethylene glycol dimethyl ether, 2-isopropylnaphthalene, pentylbenzene, hexylbenzene, heptylbenzene, octylbenzene, 1,1-bis(3,4-dimethylphenyl)ethane or mixtures of these solvents.

The present invention therefore furthermore relates to a formulation, in particular a solution, dispersion or miniemulsion, comprising at least one compound of the formula (I) or the preferred embodiments indicated above and at least one solvent, in particular an organic solvent. The way in which solutions of this type can be prepared is known to the person skilled in the art and is described, for example, in WO 2002/072714, WO 2003/019694 and the literature cited therein.

The present invention furthermore relates to mixtures comprising at least one compound of the formula (I) or the preferred embodiments indicated above and at least one further compound. The further compound can be, for example, a fluorescent or phosphorescent emitter if the compound according to the invention is used as matrix material. The mixture may then also additionally comprise a further material as additional matrix material.

The invention is explained in greater detail by the following examples, without wishing to restrict it thereby. On the basis of the descriptions, the person skilled in the art will be able to carry out the invention throughout the range disclosed and prepare further compounds according to the invention without inventive step and use them in electronic devices or use the process according to the invention.

WORKING EXAMPLES

A) Synthesis Examples

Example 1

Synthesis of bis(fluorenyl-2-yl)-(9,9-diphenyl-9H-9-silafluoren-4-yl)amine (I-1) and derivatives (I-2) to (I-15)

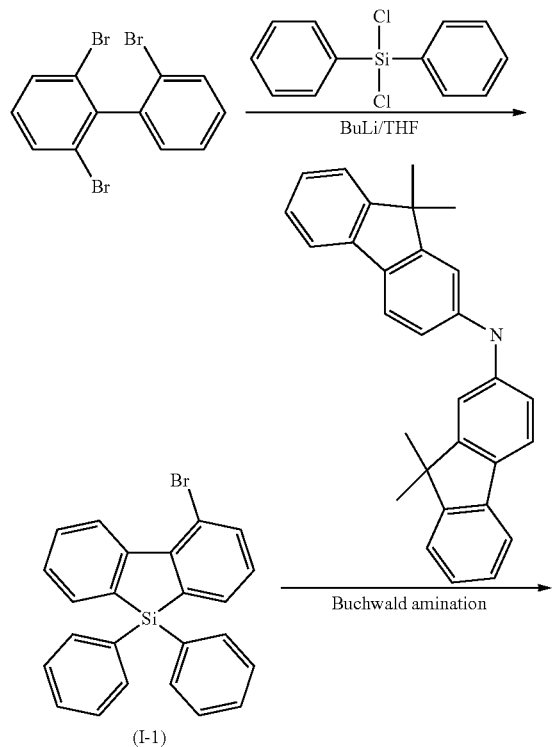

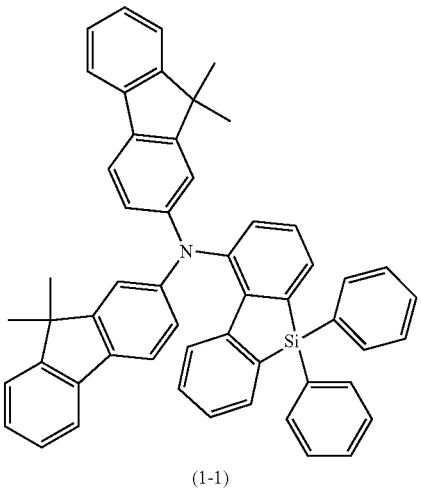

(1-1)

Synthesis of 4'-bromo-9,9-diphenyl-9H-9-silafluorene (Intermediate I-1)

10 g (25.58 mmol) of 2,6,2'-tribromobiphenyl is suspended in 120 mL of diethyl ether under Ar atmosphere then cooled at −30-40° C. 22.51 mL of (56.28 mmol/2.5 M in hexane) n-BuLi is added dropwise at −30-40° C. and the mixture is stirred for 1 hr at the same temperature. Then, 6.8 g (26.86 mmol) of dichlorodiphenylsilane in diethyl ether (30 mL) is added dropwise at −30° C.--40° C. and the mixture is stirred for 3 hr at the same temperature then allow to warm up to room temperature. After reaction completion, 200 mL of H$_2$O and 300 mL of dichloromethane are added in the flask. The organic phase is separated off and dried over magnesium sulfate, filtered and subsequently evaporated to dryness. The residue is washed with 300 mL of heptane. The yield is 4.2 g (10.16 mmol), corresponding to 40% of theory.

The following compounds are synthesized analogously:

| Ex | Dichlorosilane | Tribromobiphenyl | Product | Overall Yield |
|---|---|---|---|---|
| I-2 | [structure] [1796541-30-4] | [structure] [507241-82-9] | [structure] | 34% |

-continued

| Ex | Dichlorosilane | Tribromobiphenyl | Product | Overall Yield |
|---|---|---|---|---|
| I-3 | [75-78-5] | [507241-82-9] | | 37% |
| I-4 | [149-74-6] | [507241-82-9] | | 42% |
| I-5 | [18676-65-8] | [507241-82-9] | | 31% |
| I-6 | [7751-39-5] | [507241-82-9] | | 31% |
| I-7 | [18414-38-5] | [507241-82-9] | | 44% |

Synthesis of bis(fluorenyl-2-yl)-(9,9-diphenyl-9H-9-silafluoren-4-yl)amine (I-1)

3.5 g (8.47 mmol) of compound (I-1) and 3.57 g (8.89 mmol) of bis(9,9-dimethylfluorene)amine are suspended in 50 mL of toluene under Ar atmosphere. 0.34 mL (0.34 mmol) of tri-tert-butyl-phosphine is added to the flask and stirred under Ar atmosphere. 0.04 g (0.17 mmol) of palladium(II) acetate is added to the flask and stirred under Ar atmosphere. Then 1.22 g (12.70 mmol) of sodium tert-butoxide is added to the flask. The reaction mixture is heated at 120° C. and stirred under reflux for 16 hr. The reaction mixture is cooled to RT, the organic phase is quenched with water and extracted three times with 100 mL of toluene, dried over magnesium sulfate, filtered and subsequently evaporated to dryness. The residue is washed with ethyl acetate. The yield is 4.2 g (5.72 mmol), corresponding to 68% of theory.

The following compounds are synthesized analogously:

| Ex | Halogenated diphenylsilafluorene | Amine | Product | Yield |
|---|---|---|---|---|
| 1-2 | | [1198395-24-2] | | 63% |
| 1-3 | | [897671-69-1] | | 70% |
| 1-4 | | [1923735-83-4] | | 57% |

-continued

| Ex | Halogenated diphenylsilafluorene | Amine | Product | Yield |
|---|---|---|---|---|
| 1-5 | | [102113-98-4] | | 72% |
| 1-6 | | [1613331-99-9] | | 51% |
| 1-7 | | [1429508-81] | | 69% |

-continued
| Ex | Halogenated diphenylsilafluorene | Amine | Product | Yield |
|---|---|---|---|---|
| 1-8 | 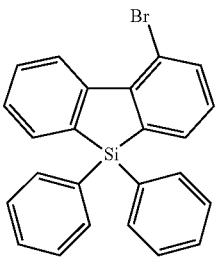 [SMILES: Brc1cccc2c1-c1ccccc1[Si]2(c1ccccc1)c1ccccc1] | 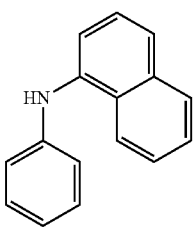 [SMILES: c1ccc(Nc2cccc3ccccc23)cc1]<br>[90-30-2] | 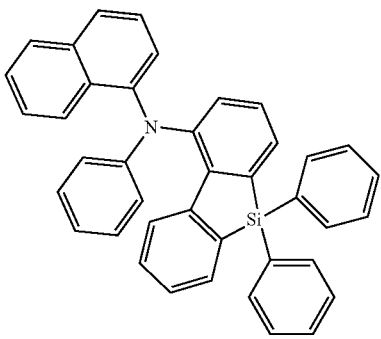 [SMILES: c1ccc(N(c2cccc3c2-c2ccccc2[Si]3(c2ccccc2)c2ccccc2)c2cccc3ccccc23)cc1] | 79% |
| 1-9 | 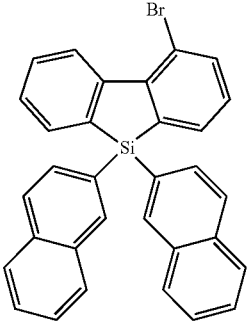 [SMILES: Brc1cccc2c1-c1ccccc1[Si]2(c1ccc2ccccc2c1)c1ccc2ccccc2c1] | 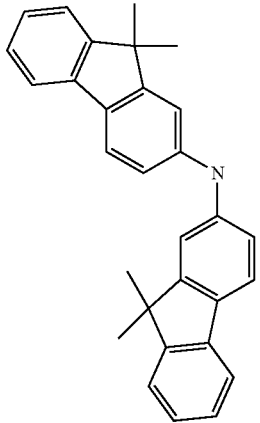 [SMILES: CC1(C)c2ccccc2-c2ccc(Nc3ccc4c(c3)C(C)(C)c3ccccc3-4)cc21]<br>[500717-23-7] | 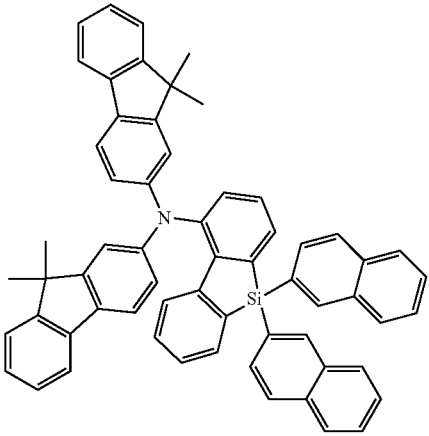 [SMILES: CC1(C)c2ccccc2-c2ccc(N(c3ccc4c(c3)C(C)(C)c3ccccc3-4)c3cccc4c3-c3ccccc3[Si]4(c3ccc4ccccc4c3)c3ccc4ccccc4c3)cc21] | 61% |
| 1-10 | 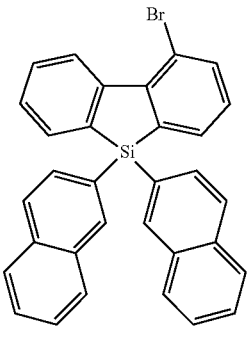 [SMILES: Brc1cccc2c1-c1ccccc1[Si]2(c1ccc2ccccc2c1)c1ccc2ccccc2c1] | 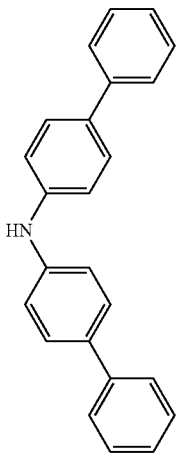 [SMILES: c1ccc(-c2ccc(Nc3ccc(-c4ccccc4)cc3)cc2)cc1]<br>[102113-98-4] | 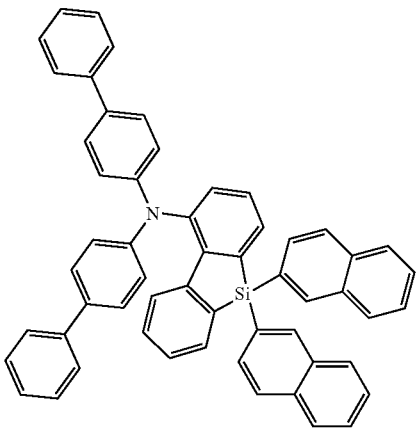 [SMILES: c1ccc(-c2ccc(N(c3ccc(-c4ccccc4)cc3)c3cccc4c3-c3ccccc3[Si]4(c3ccc4ccccc4c3)c3ccc4ccccc4c3)cc2)cc1] | 70% |

-continued
| Ex | Halogenated diphenylsilafluorene | Amine | Product | Yield |
|---|---|---|---|---|
| 1-11 | 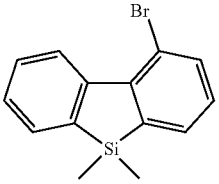 [SMILES: C[Si]1(C)c2ccccc2-c2c(Br)cccc21] | 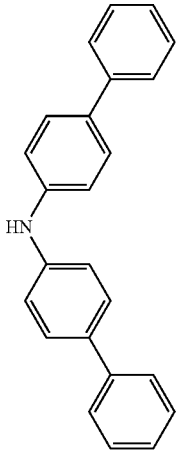 [SMILES: c1ccc(-c2ccc(Nc3ccc(-c4ccccc4)cc3)cc2)cc1] [102113-98-4] | 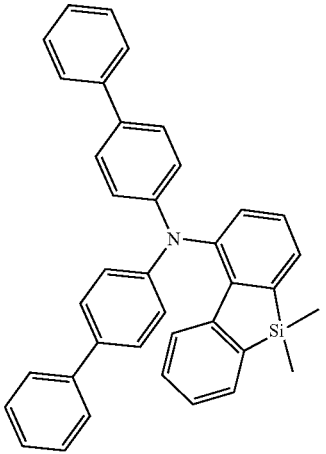 [SMILES: C[Si]1(C)c2ccccc2-c2c(N(c3ccc(-c4ccccc4)cc3)c3ccc(-c4ccccc4)cc3)cccc21] | 75% |
| 1-12 | 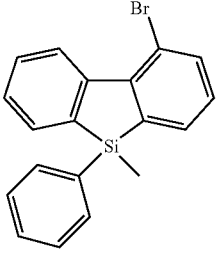 [SMILES: C[Si]1(c2ccccc2)c2ccccc2-c2c(Br)cccc21] | 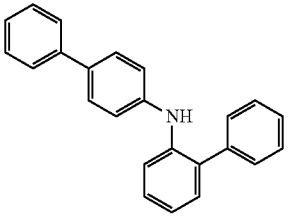 [SMILES: c1ccc(-c2ccc(Nc3ccccc3-c3ccccc3)cc2)cc1] [1372775-52-4] | 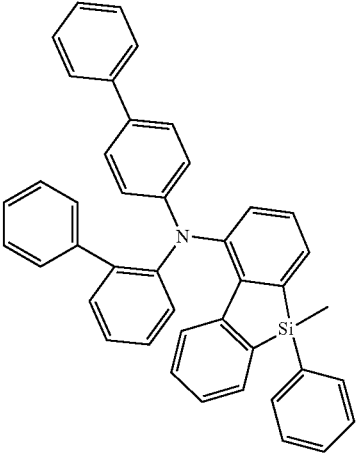 [SMILES: C[Si]1(c2ccccc2)c2ccccc2-c2c(N(c3ccc(-c4ccccc4)cc3)c3ccccc3-c3ccccc3)cccc21] | 66% |
| 1-13 | 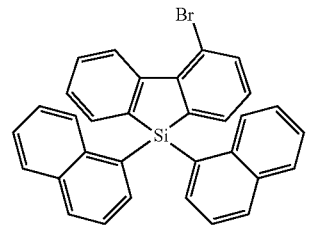 [SMILES: Brc1cccc2c1-c1ccccc1[Si]2(c1cccc2ccccc12)c1cccc2ccccc12] | 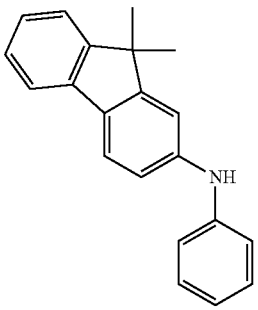 [SMILES: CC1(C)c2ccccc2-c2ccc(Nc3ccccc3)cc21] [355832-04-1] | 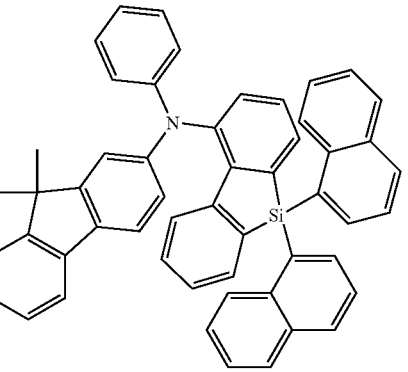 | 62% |

| Ex | Halogenated diphenylsilafluorene | Amine | Product | Yield |
|---|---|---|---|---|
| 1-14 | | | [1547491-85-9] | 55% |
| 1-15 | | | [1372775-63-7] | 69% |
Example 2
Synthesis of bis(fluorenyl-2-yl)-(9,9-diphenyl-9H-9-silafluoren-2-yl)amine (2-1) and derivatives (2-2) to (2-8)
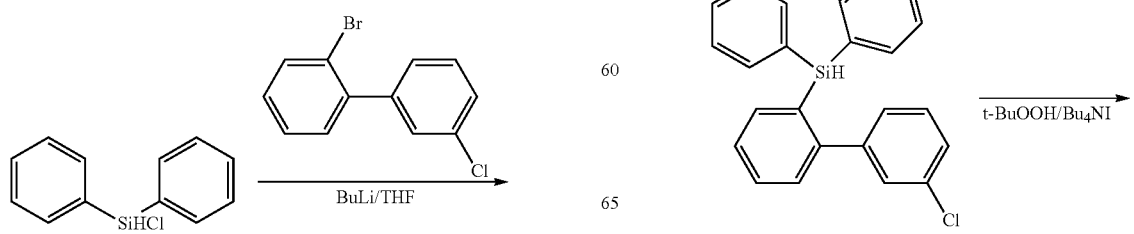
-continued

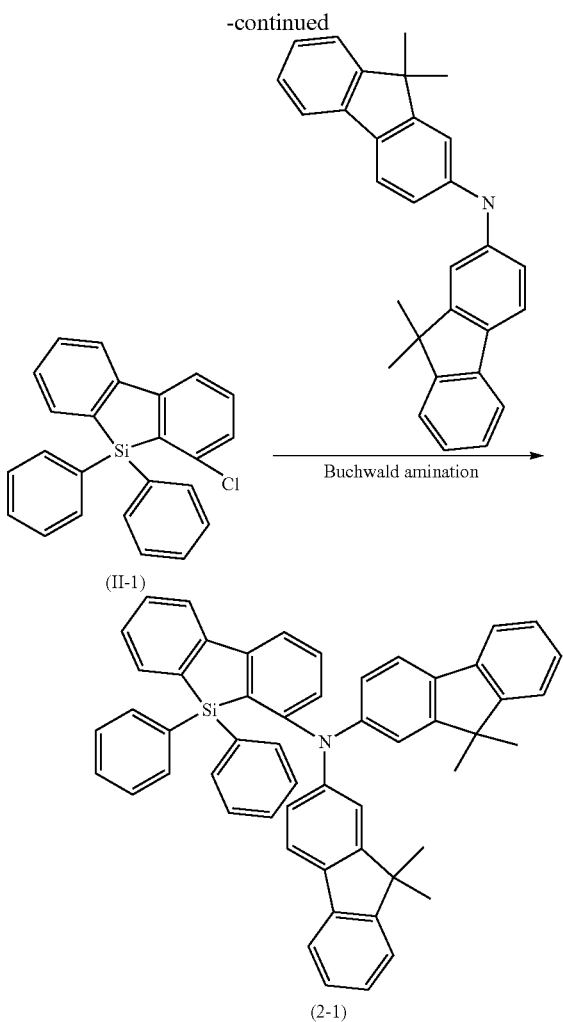

Synthesis of 1-chloro-9,9-diphenyl-7H-9-silafluorene (Intermediate II-1)

8.59 g (32.1 mmol) of 2-bromo-3'-chlorobiphenyl is dissolved in 150 mL of THF under Ar atmosphere then cooled to −78° C. 24 mL (38 mmol/1.6 M in hexane) of n-BuLi is added dropwise at −78° C. and the mixture is stirred for 30 min at the same temperature. Then, 7.5 ml (38 mmol) chlorodiphenylsilane in diethyl ether (100 mL) is added dropwise at −78° C. and the mixture is stirred for 3 hr at the same temperature then allow to warm up to room temperature. After reaction completion, the mixture is quenched with a saturated aqueous solution of NH$_4$Cl in water. After extraction with diethylether (3×100 mL), the solution is dried over MgSO$_4$, filtered and subsequently evaporated to dryness. The residue is washed with 300 mL of heptane. The yield is 10 g (27 mmol), corresponding to 83% of theory.

Tetrabutylammoniumiodide (90 mg, 25.1 mmol, 1 mol %) and a solution of tert-butyl hydroperoxide (15 mL/5.5 M in decane, 0.83 mmol, 3.3 eq.) are added to a solution of 8.89 g (25.1 mmol) of 2-(3'chloro)biphenyldiphenylsilane in toluene (200 mL). After stirring for 5 min at room temperature the mixture is heated to 90° C., stirred for 24 hr at this temperature and cooled to room temperature. After filtration through a short pad of silica eluting with dichloromethane (1800 mL), crude 1H-NMR analysis using dibromomethane as internal standard and concentration in vacuo the residue is purified by fractional column chromatography to afford the desired silafluorenes (II-1). For analysis, the compound is recrystallized from dichloromethane and acetonitrile. The yield is 3.8 g (10.3 mmol), corresponding to 41% of theory.

The following compounds are synthesized analogously:

| Ex | Chlorosilane | 2-bromo-3'-chlorobiphenyl | Product | Overall Yield |
|---|---|---|---|---|
| II-2 | [1631-82-9] | [154407-17-7] | | 31% |
| II-3 | [18551-61-6] | [154407-17-7] | | 28% |

Synthesis of bis(fluorenyl-2-yl)-(9,9-diphenyl-9H-9-silafluoren-2-yl)amine (2-1)

3.1 g (8.4 mmol) of compound (I-1) and 3.57 g (8.9 mmol) of bis(9,9-dimethylfluorene)amine are suspended in 100 mL of toluene under Ar atmosphere. 0.34 mL (0.34 mmol) of tri-tert-butyl-phosphine is added to the flask and stirred under Ar atmosphere. 0.04 g (0.17 mmol) of palladium(II) acetate is added to the flask and stirred under Ar atmosphere then 1.22 g (12.70 mmol) of sodium tert-butoxide is added to the flask. The reaction mixture is heated at 120° C. and stirred under reflux for 24 hr. The reaction mixture is cooled to RT, the organic phase is quenched with water and extracted three times with 100 mL of toluene, dried over magnesium sulfate, filtered and subsequently evaporated to dryness. The residue is washed with ethyl acetate. The yield is 3.6 g (4.9 mmol), corresponding to 58% of theory.

The following compounds are synthesized analogously:

| Ex | Halogenated diphenylsilafluorene | Amine | Product | Yield |
|---|---|---|---|---|
| 2-2 | | [355832-04-1] | | 51% |
| 2-3 | | [897671-69-1] | | 48% |
| 2-4 | | [102113-98-4] | | 55% |

-continued

| Ex | Halogenated diphenylsilafluorene | Amine | Product | Yield |
|---|---|---|---|---|
| 2-5 | | [500717-23-7] | | 42% |
| 2-6 | | [1429508-81] | | 43% |
| 2-7 | | [500717-23-7] | | 50% |

| Ex | Halogenated diphenylsilafluorene | Amine | Product | Yield |
|---|---|---|---|---|
| 2-8 | | | | 40% |
| | | [102113-98-4] | | |

Example 3

Synthesis of bis(fluorenyl-2-yl)-(9,9-diphenyl-9H-9-silafluoren-2-yl)-4-phenyl-amine (3-1) and derivatives (3-2) to (3-8)

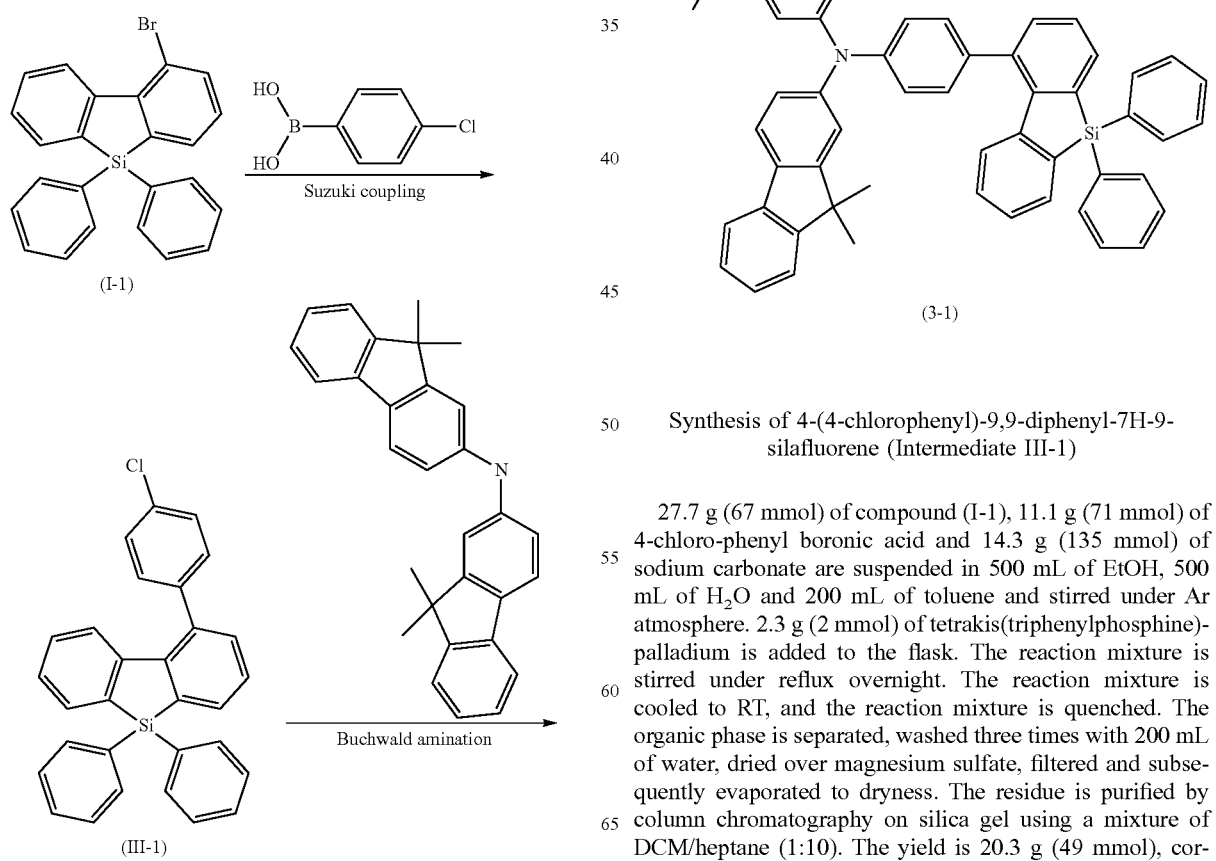

Synthesis of 4-(4-chlorophenyl)-9,9-diphenyl-7H-9-silafluorene (Intermediate III-1)

27.7 g (67 mmol) of compound (I-1), 11.1 g (71 mmol) of 4-chloro-phenyl boronic acid and 14.3 g (135 mmol) of sodium carbonate are suspended in 500 mL of EtOH, 500 mL of H$_2$O and 200 mL of toluene and stirred under Ar atmosphere. 2.3 g (2 mmol) of tetrakis(triphenylphosphine)-palladium is added to the flask. The reaction mixture is stirred under reflux overnight. The reaction mixture is cooled to RT, and the reaction mixture is quenched. The organic phase is separated, washed three times with 200 mL of water, dried over magnesium sulfate, filtered and subsequently evaporated to dryness. The residue is purified by column chromatography on silica gel using a mixture of DCM/heptane (1:10). The yield is 20.3 g (49 mmol), corresponding to 73% of theory.

The following compounds are synthesized analogously:

| Ex | Educt 1 | Arylboronic acid | Product | Yield |
|---|---|---|---|---|
| III-2 | (I-1) | [3900-89-8] | | 65% |
| III-3 | (I-7) | [1679-18-1] | | 67% |
| III-4 | (II-1) | [1765-93-1] | | 62% |
| III-5 | (II-3) | [1765-93-1] | | 63% |

Synthesis of bis(fluorenyl-2-yl)-(9,9-diphenyl-9H-9-silafluoren-2-yl)-4-phenyl-amine (3-1)

5.0 g (11.2 mmol) of compound (III-1) and 4.97 g (12.4 mmol) of bis(9,9-dimethylfluorene)amine are suspended in 200 mL of toluene under Ar atmosphere. 0.45 mL (0.45 mmol) of tri-tert-butyl-phosphine is added to the flask and stirred under Ar atmosphere. 0.05 g (0.22 mmol) of palladium(II)acetate is added to the flask and stirred under Ar atmosphere. Then 1.62 g (16.9 mmol) of sodium tert-butoxide is added to the flask. The reaction mixture is heated at 120° C. and stirred under reflux for 24 hr. The reaction mixture is cooled to RT, the organic phase is quenched with water and extracted three times with 100 mL of toluene, dried over magnesium sulfate, filtered and subsequently evaporated to dryness. The residue is washed with ethyl acetate. The yield is 5.2 g (6.4 mmol), corresponding to 57% of theory.

The following compounds are synthesized analogously:
| Ex | Halogenated diphenylsilafluorene | Amine | Product | Yield |
|---|---|---|---|---|
| 3-2 | | | | 65% |
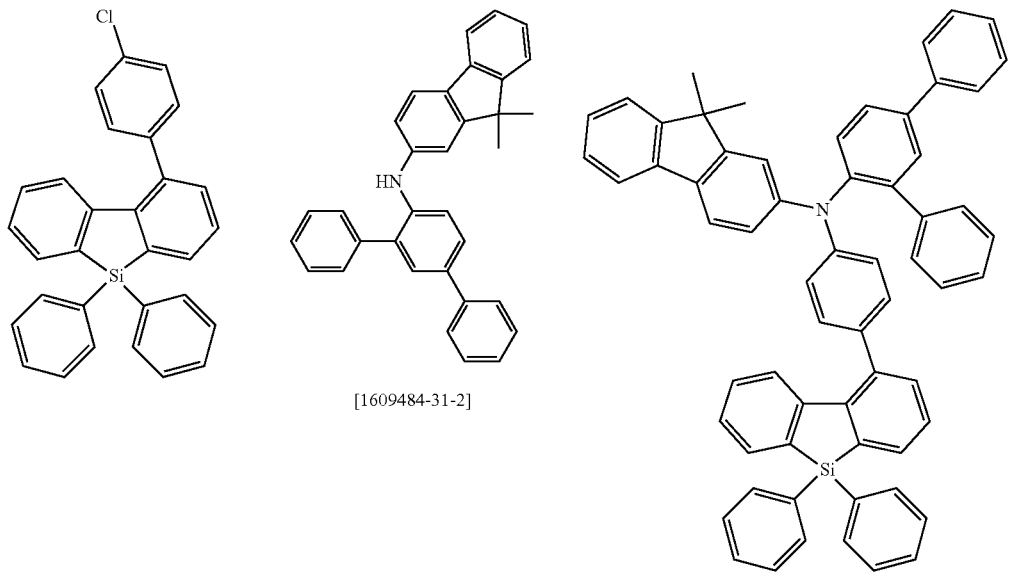
| 3-3 | | | | 66% |
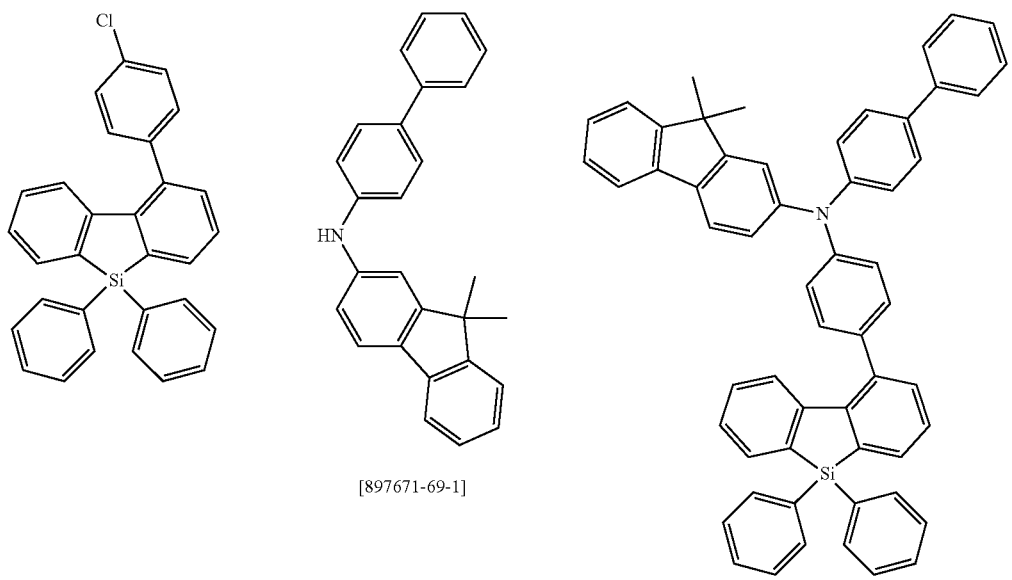

-continued
| Ex | Halogenated diphenylsilafluorene | Amine | Product | Yield |
|---|---|---|---|---|
| 3-4 | | | | 75% |
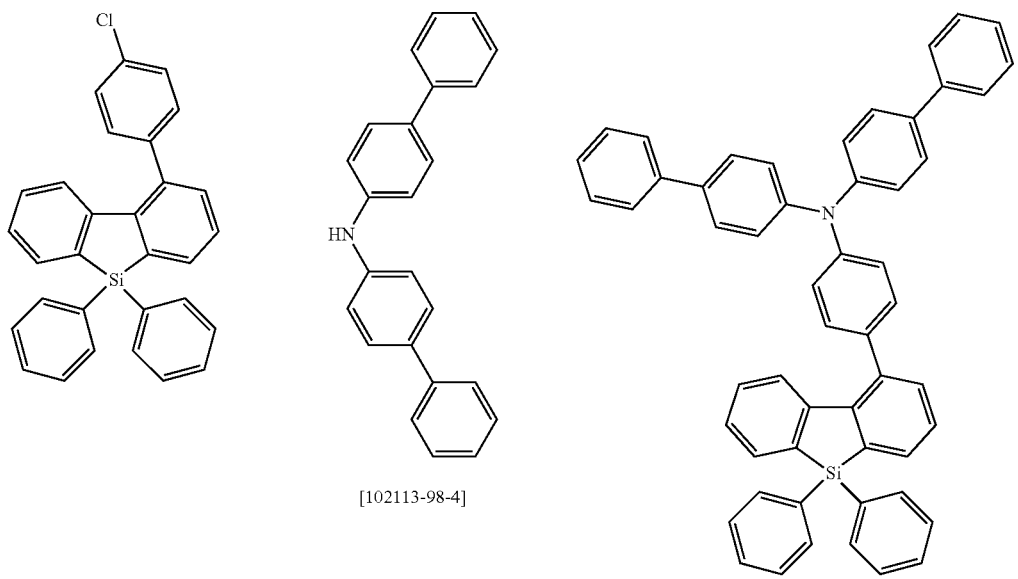
[102113-98-4]
| 3-5 | | | | 70% |
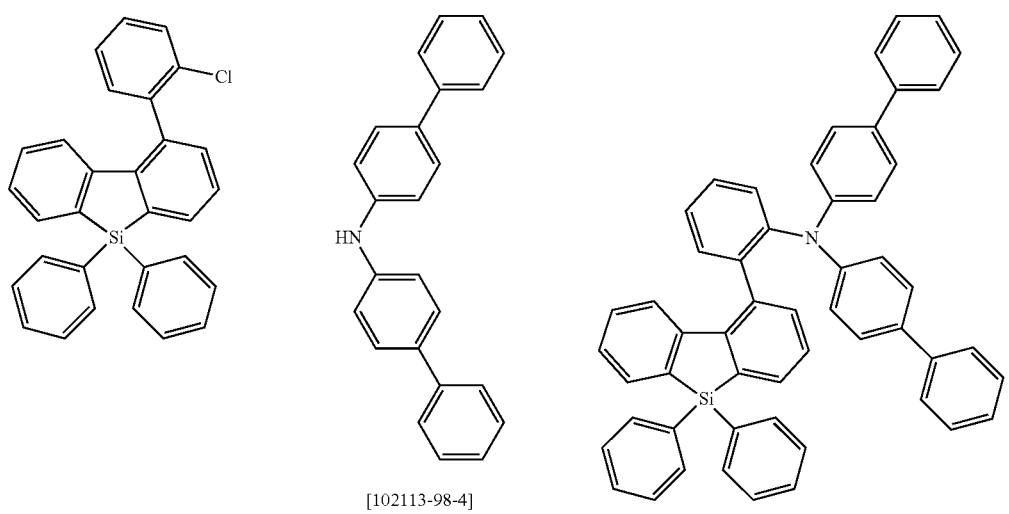
[102113-98-4]

-continued
| Ex | Halogenated diphenylsilafluorene | Amine | Product | Yield |
|---|---|---|---|---|
| 3-6 | 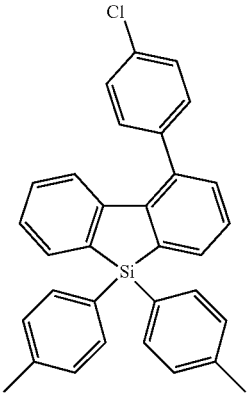 | 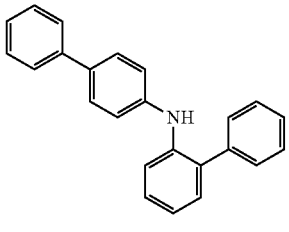 [SMILES: c1ccc(-c2ccc(Nc3ccccc3-c3ccccc3)cc2)cc1][1372775-52-4] | 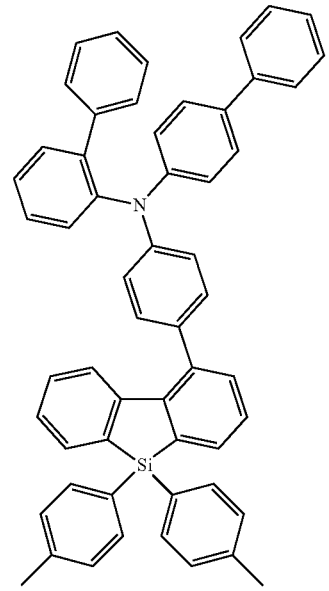 [SMILES: Cc1ccc([Si]2(c3ccc(C)cc3)c3ccccc3-c3c(-c4ccc(N(c5ccc(-c6ccccc6)cc5)c5ccccc5-c5ccccc5)cc4)cccc32)cc1] | 61% |
| 3-7 | 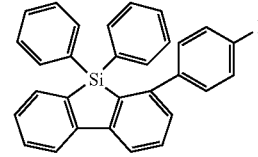 | 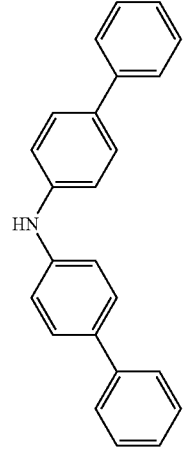 [SMILES: c1ccc(-c2ccc(Nc3ccc(-c4ccccc4)cc3)cc2)cc1][102113-98-4] | 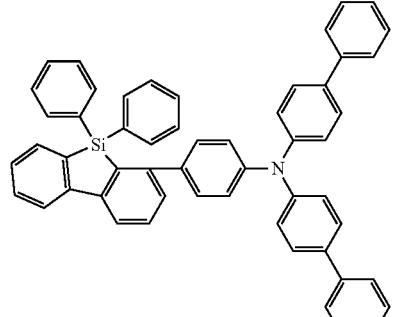 | 53% |
| 3-8 | 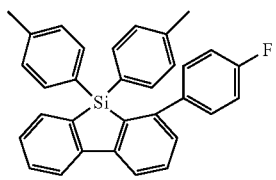 [SMILES: Cc1ccc([Si]2(c3ccc(C)cc3)c3ccccc3-c3cccc(-c4ccc(F)cc4)c32)cc1] | 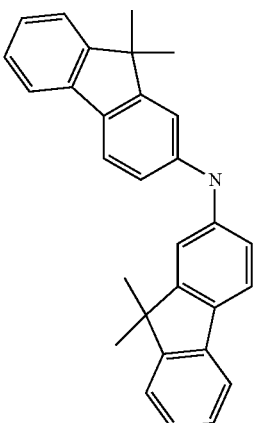[500717-23-7] | 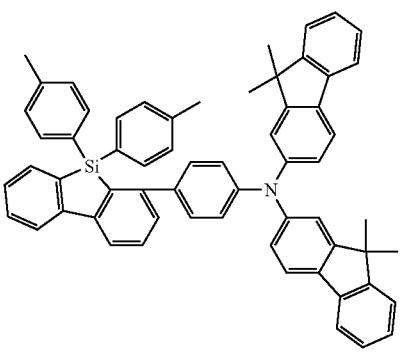 [SMILES: Cc1ccc([Si]2(c3ccc(C)cc3)c3ccccc3-c3cccc(-c4ccc(N(c5ccc6c(c5)C(C)(C)c5ccccc5-6)c5ccc6c(c5)C(C)(C)c5ccccc5-6)cc4)c32)cc1] | 59% |

B) Devices Examples

OLED devices are prepared according to the following process:

The substrates used are glass plates coated with structured ITO (indium tin oxide) in a thickness of 50 nm. The OLEDs have the following layer structure: substrate/hole-injection layer (HIL)/hole-transport layer (HTL)/hole-injection layer (HTL2)/electron-blocking layer (EBL)/emission layer (EML)/electron-transport layer (ETL)/electron-injection layer (EIL) and finally a cathode. The cathode is formed by an aluminium layer with a thickness of 100 nm. The precise structure of the prepared OLEDs is shown in Table 1. The materials required for the production of the OLEDs are shown in Table 3.

All materials are evaporated by thermal vapour deposition in a vacuum chamber. The emission layer always consists of minimum one matrix material (host material) and an emitting dopant (emitter), which is admixed with the matrix material or matrix materials in a certain proportion by volume by co-evaporation. An expression such as H1:SEB (5%) denotes that material H1 is present in the layer in a proportion by volume of 95% and SEB is present in the layer in a proportion of 5%. Analogously, other layers may also consist of a mixture of two or more materials.

The OLEDs are characterised by standard methods. For this purpose, the electroluminescence spectra and the external quantum efficiency (EQE, measured in percent) as a function of the luminous density, calculated from current/voltage/luminous density characteristic lines (IUL characteristic lines) assuming Lambertian emission characteristics, and the lifetime are determined. The expression EQE @ 10 mA/cm$^2$ denotes the external quantum efficiency at an operating current density of 10 mA/cm$^2$. LT80 @ 60 mA/cm$^2$ is the lifetime until the OLED has dropped from its initial luminance of i.e. 5000 cd/m$^2$ to 80% of the initial intensity, i.e. to 4000 cd/m$^2$ without using any acceleration factor. The data for the various OLEDs containing inventive and comparative materials are summarised in Table 2.

Compounds according to the invention are suitable as HIL, HTL, EBL or matrix material in the EML in OLEDs. They are suitable as a single layer, but also as mixed component as HIL, HTL, EBL or within the EML.

Compared with compounds from prior art (V1 to V6), the samples comprising the compounds according to the invention (E1 to E6) exhibit both higher efficiencies and also improved lifetimes in singlet blue emitting devices.

TABLE 1

Structure of the OLEDs

| Ex | HIL Thickness/nm | HTL Thickness/nm | HTL2 Thickness/nm | EBL Thickness/nm | EML Thickness/nm | ETL Thickness/nm | EIL Thickness/nm |
|---|---|---|---|---|---|---|---|
| E1 | HIM:F4TCNQ (5%) 20 nm | HIM 160 nm | HTM1:F4TCNQ (5%) 20 nm | HTM1 10 nm | H1:SEB(5%) 20 nm | ETM:LiQ (50%) 30 nm | LiQ 1 nm |
| E2 | HIM:F4TCNQ (5%) 20 nm | HIM 160 nm | HTM2:F4TCNQ (5%) 20 nm | HTM2 10 nm | H1:SEB(5%) 20 nm | ETM:LiQ (50%) 30 nm | LiQ 1 nm |
| E3 | HIM:F4TCNQ (5%) 20 nm | HIM 160 nm | HTM3:F4TCNQ (5%) 20 nm | HTM3 10 nm | H1:SEB(5%) 20 nm | ETM:LiQ (50%) 30 nm | LiQ 1 nm |
| E4 | HIM:F4TCNQ (5%) 20 nm | HIM 160 nm | HTM4:F4TCNQ (5%) 20 nm | HTM4 10 nm | H1:SEB(5%) 20 nm | ETM:LiQ (50%) 30 nm | LiQ 1 nm |
| E5 | HIM:F4TCNQ (5%) 20 nm | HIM 160 nm | HTM5:F4TCNQ (5%) 20 nm | HTM5 10 nm | H1:SEB(5%) 20 nm | ETM:LiQ (50%) 30 nm | LiQ 1 nm |
| E6 | HIM:F4TCNQ (5%) 20 nm | HIM 160 nm | HTM6:F4TCNQ (5%) 20 nm | HTM6 10 nm | H1:SEB(5%) 20 nm | ETM:LiQ (50%) 30 nm | LiQ 1 nm |
| V1 | HIM:F4TCNQ (5%) 20 nm | HIM 160 nm | HTMv1:F4TCNQ (5%) 20 nm | HTMv1 10 nm | H1:SEB(5%) 20 nm | ETM:LiQ (50%) 30 nm | LiQ 1 nm |
| V2 | HIM:F4TCNQ (5%) 20 nm | HIM 160 nm | HTMv2:F4TCNQ (5%) 20 nm | HTMv2 10 nm | H1:SEB(5%) 20 nm | ETM:LiQ (50%) 30 nm | LiQ 1 nm |
| V3 | HIM:F4TCNQ (5%) 20 nm | HIM 160 nm | HTMv3:F4TCNQ (5%) 20 nm | HTMv3 10 nm | H1:SEB(5%) 20 nm | ETM:LiQ (50%) 30 nm | LiQ 1 nm |
| V4 | HIM:F4TCNQ (5%) 20 nm | HIM 160 nm | HTMv4:F4TCNQ (5%) 20 nm | HTMv4 10 nm | H1:SEB(5%) 20 nm | ETM:LiQ (50%) 30 nm | LiQ 1 nm |
| V5 | HIM:F4TCNQ (5%) 20 nm | HIM 160 nm | HTMv5:F4TCNQ (5%) 20 nm | HTMv5 10 nm | H1:SEB(5%) 20 nm | ETM:LiQ (50%) 30 nm | LiQ 1 nm |
| V6 | HIM:F4TCNQ (5%) 20 nm | HIM 160 nm | HTMv6:F4TCNQ (5%) 20 nm | HTMv6 10 nm | H1:SEB(5%) 20 nm | ETM:LiQ (50%) 30 nm | LiQ 1 nm |

TABLE 2
Data for the OLEDs
| Ex. | EQE @ 10 mA/cm$^2$ | LT80 @ 60 mA/cm$^2$ |
| --- | --- | --- |
| E1 | 7.9 | 350 |
| E2 | 8.2 | 370 |
| E3 | 7.9 | 350 |
| E4 | 7.7 | 340 |
| E5 | 8.3 | 360 |
| E6 | 8.4 | 350 |
| V1 | 7.2 | 290 |
| V2 | 7.4 | 310 |
| V3 | 7.4 | 300 |
| V4 | 7.1 | 290 |
| V5 | 7.3 | 300 |
| V6 | 7.2 | 280 |
TABLE 3
Structures of the materials used
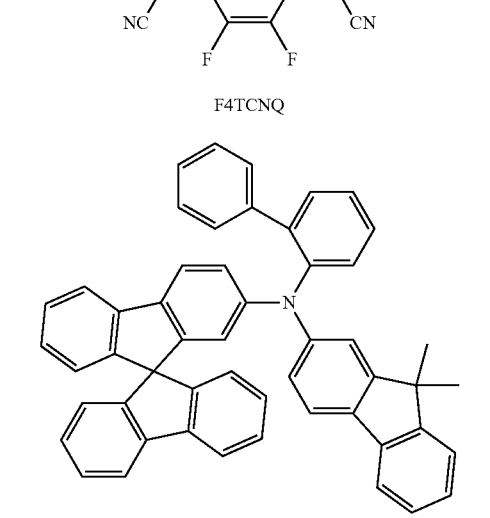
F4TCNQ
HIM
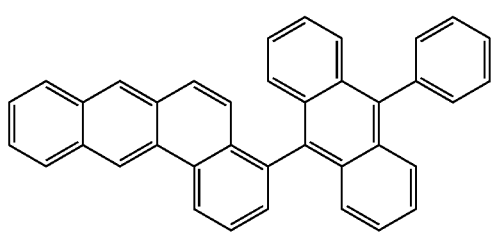 [SMILES: c1ccc(-c2c3ccccc3c(-c3cccc4c3ccc3cc5ccccc5cc34)c3ccccc23)cc1]
H1
TABLE 3-continued
Structures of the materials used
SEB
ETM
LiQ
HTM1

TABLE 3-continued
Structures of the materials used
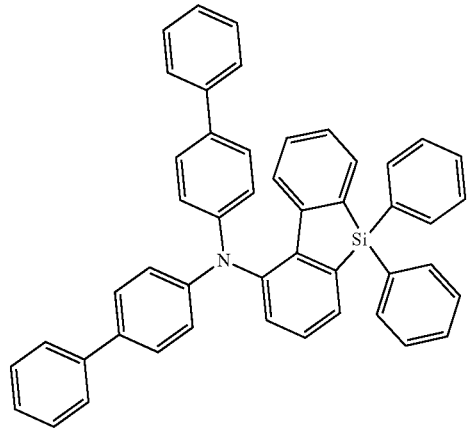 [SMILES: c1ccc(-c2ccc(N(c3ccc(-c4ccccc4)cc3)c3cccc4c3-c3ccccc3[Si]4(c3ccccc3)c3ccccc3)cc2)cc1]
HTM2
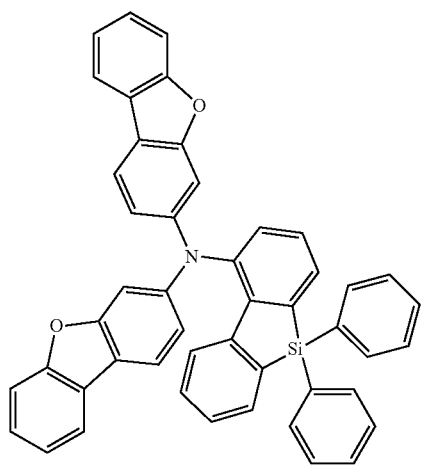 [SMILES: c1ccc([Si]2(c3ccccc3)c3ccccc3-c3c(N(c4ccc5c(c4)oc4ccccc45)c4ccc5c(c4)oc4ccccc45)cccc32)cc1]
HTM3
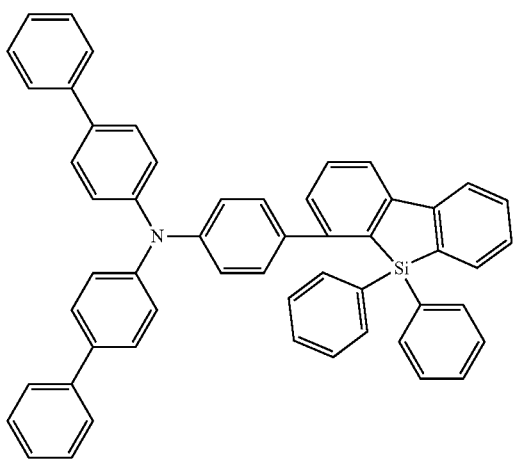 [SMILES: c1ccc(-c2ccc(N(c3ccc(-c4ccccc4)cc3)c3ccc(-c4cccc5c4[Si](c4ccccc4)(c4ccccc4)c4ccccc4-5)cc3)cc2)cc1]
HTM4
TABLE 3-continued
Structures of the materials used
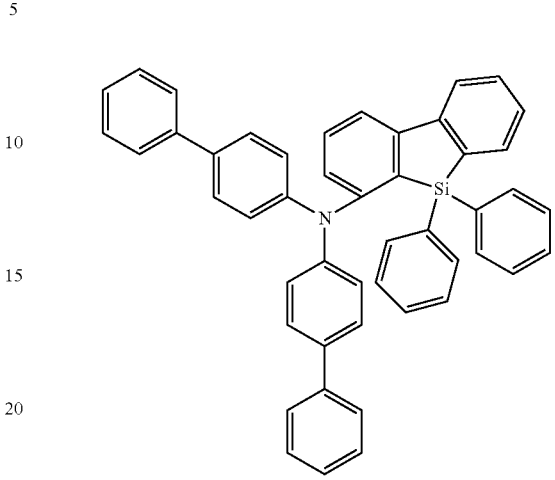
HTM5
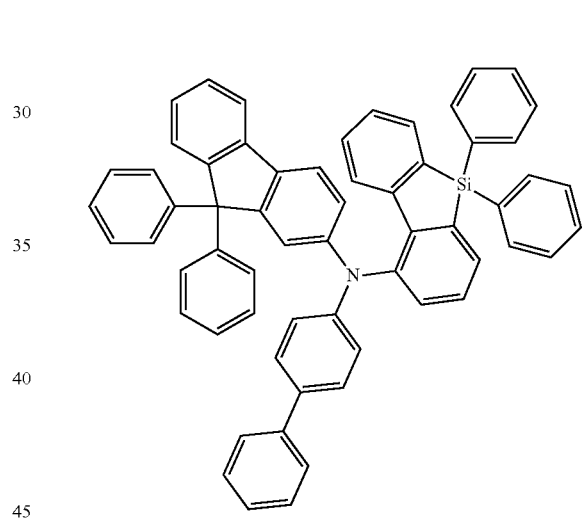
HTM6
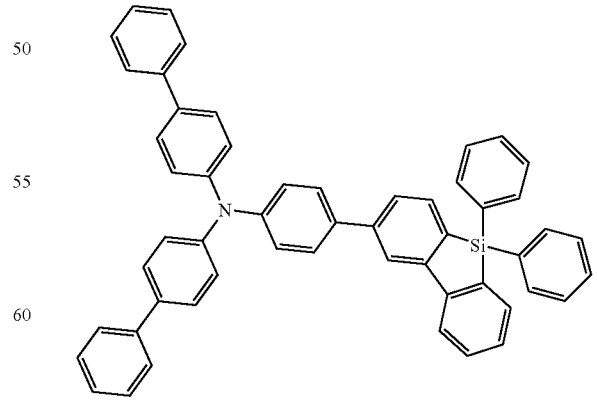
HTMv1

TABLE 3-continued

Structures of the materials used

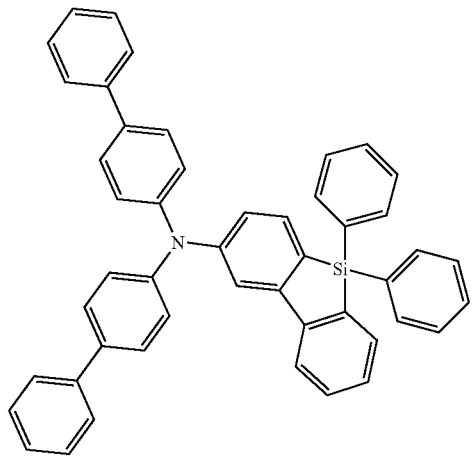 [SMILES: c1ccc(-c2ccc(N(c3ccc(-c4ccccc4)cc3)c3ccc4c(c3)-c3ccccc3[Si]4(c3ccccc3)c3ccccc3)cc2)cc1]

HTMv2

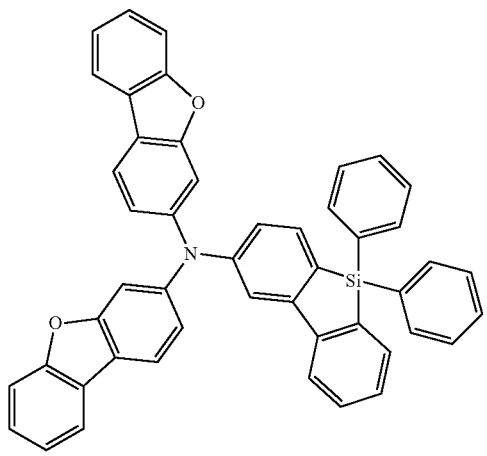 [SMILES: c1ccc([Si]2(c3ccccc3)c3ccccc3-c3cc(N(c4ccc5c(c4)oc4ccccc45)c4ccc5c(c4)oc4ccccc45)ccc32)cc1]

HTMv3

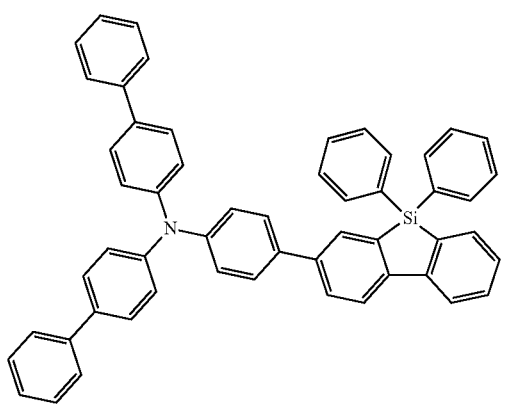 [SMILES: c1ccc(-c2ccc(N(c3ccc(-c4ccccc4)cc3)c3ccc(-c4ccc5c(c4)[Si](c4ccccc4)(c4ccccc4)c4ccccc4-5)cc3)cc2)cc1]

HTMv4

TABLE 3-continued

Structures of the materials used

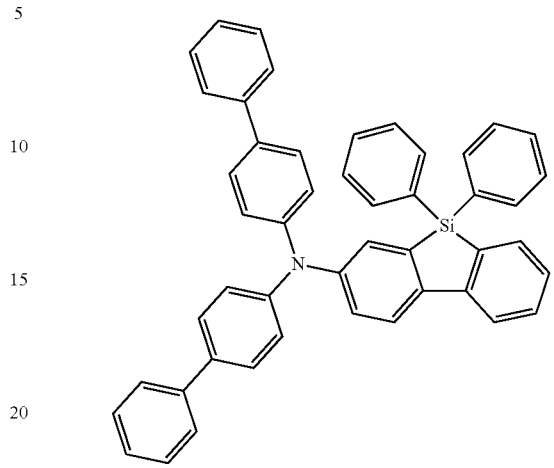

HTMv5

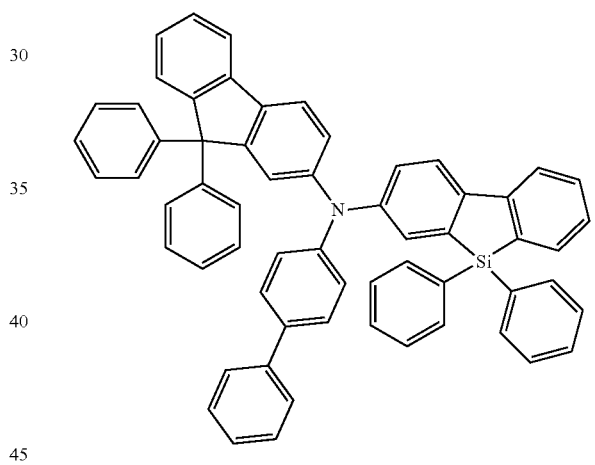

HTMv6

In the above examples, it is shown, that the external quantum efficiency of the device @ 10 mA/cm² with inventive materials HTM1 to HTM6 is higher than the one of the comparative examples. Even in lifetime the inventive examples E1 to E6 are much better than the references. The device with HTM2 has a lifetime down to 80% of its initial brightness @ 60 mA/cm² constant driving current density of 370 h. The six comparative examples achieve 280 h to 310 h. Also the other five inventive examples do show higher lifetimes than the references with 340 h and twice 360 h.

Devices for direct comparison, from which the technical effect according to the invention can be seen, are i) E1 and E4 compared to V1 and V4,
ii) E2 and E5 compared to V2 and V5,
iii) E3 compared to V3, and
iv) E6 compared to V6.

The invention claimed is:
1. A compound of a formula (I)

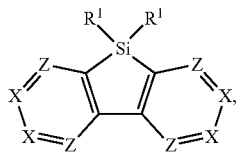

formula (I)

where the following applies to the variable groups:
Z is, identically or differently on each occurrence, selected from $CR^4$;
X is, identically or differently on each occurrence, selected from $CR^2$;
$R^1$ is selected, identically or differently at each occurrence, from H, D, F, straight-chain alkyl or alkoxy groups having 1 to 20 C atoms, branched or cyclic alkyl or alkoxy groups having 3 to 20 C atoms, alkenyl or alkynyl groups having 2 to 20 C atoms, aromatic ring systems having 6 to 40 aromatic ring atoms, and heteroaromatic ring systems having 5 to 40 aromatic ring atoms; where two or more radicals $R^1$ may be connected to each other to form a ring; where the said alkyl, alkoxy, alkenyl and alkynyl groups and the said aromatic and heteroaromatic ring systems may in each case be substituted by one or more radicals $R^4$, and where one or more $CH_2$ groups in the said alkyl, alkoxy, alkenyl and alkynyl groups may in each case be replaced by $—R^4C=CR^4—$, $—C≡C—$, $Si(R^4)_2$, $CO=O$, $C=NR^4$, $—C(=O)O—$, $—C(=O)NR^4—$, $NR^4$, $P(=O)(R^4)$, $—O—$, $—S—$, $SO$ or $SO_2$;
$R^A$ and $R^2$ are selected, identically or differently at each occurrence, from H, D, F, $C(=O)R^4$, CN, $Si(R^4)_3$, $P(=O)(R^4)_2$, $OR^4$, $S(=O)R^4$, $S(=O)_2R^4$, straight-chain alkyl or alkoxy groups having 1 to 20 C atoms, branched or cyclic alkyl or alkoxy groups having 3 to 20 C atoms, alkenyl or alkynyl groups having 2 to 20 C atoms, aromatic ring systems having 6 to 40 aromatic ring atoms and not comprising any heteroatoms as aromatic ring atoms, where two or more radicals $R^A$ and/or $R^2$ may be connected to each other to form a ring; where the said alkyl, alkoxy, alkenyl and alkynyl groups and the said aromatic systems may in each case be substituted by one or more radicals $R^4$, and where one or more $CH_2$ groups in the said alkyl, alkoxy, alkenyl and alkynyl groups may in each case be replaced by $—R^4C=CR^4—$, $Si(R^4)_2$, $C=O$, $C=NR^4$, $—C(=O)O—$, $—C(=O)NR^4—$, $NR^4$, $P(=O)(R^4)$, $—O—$, $—S—$, $SO$ or $SO_2$;
$R^4$ is selected, identically or differently at each occurrence, from H, D, F, $C(=O)R^5$, CN, $Si(R^5)_3$, $N(R^5)_2$, $P(=O)(R^5)_2$, $OR^5$, $S(=O)R^5$, $S(=O)_2R^5$, straight-chain alkyl or alkoxy groups having 1 to 20 C atoms, branched or cyclic alkyl or alkoxy groups having 3 to 20 C atoms, alkenyl or alkynyl groups having 2 to 20 C atoms, aromatic ring systems having 6 to 40 aromatic ring atoms, and heteroaromatic ring systems having 5 to 40 aromatic ring atoms; where two or more radicals $R^4$ may be connected to each other to form a ring; where the said alkyl, alkoxy, alkenyl and alkynyl groups and the said aromatic and heteroaromatic ring systems may in each case be substituted by one or more radicals $R^5$, and where one or more $CH_2$ groups in the said alkyl, alkoxy, alkenyl and alkynyl groups may in each case be replaced by $—R^5C=CR^5—$, $—C≡C—$, $Si(R^5)_2$, $CO=O$, $C=NR^5$, $—C(=O)O—$, $—C(=O)NR^5—$, $NR^5$, $P(=O)(R^5)$, $—O—$, $—S—$, $SO$ or $SO_2$;
$R^5$ is selected, identically or differently at each occurrence, from H, D, F, CN, alkyl groups having 1 to 20 C atoms, aromatic ring systems having 6 to 40 C atoms, or heteroaromatic ring systems having 5 to 40 aromatic ring atoms; where two or more radicals $R^5$ may be connected to each other to form a ring; and where the said alkyl groups, aromatic ring systems and heteroaromatic ring systems may be substituted by F and CN;
provided that
a) at least one radical $R^A$ is replaced by a group according to formula (A)

formula (A)

where the group according to formula (A) is attached via the free bond on the left of the structure of formula (A), and where the variables in formula (A) are defined as follows:
$Ar^1$ is selected, identically or differently on each occurrence, from phenyl, biphenyl, branched terphenyl, non-branched terphenyl, branched quaterphenyl, non-branched quaterphenyl, fluorenyl, naphthyl, anthracenyl, pyridyl, quinolinyl, dibenzofuranyl, dibenzothiophenyl, carbazoleyl, fluorenyl-phenylenyl, dibenzofuranyl-phenylenyl, dibenzothiophenyl-phenylenyl, phenanthrenyl and triphenylyl, each of which may be substituted by one or more radicals $R^3$;
$L^1$ is selected, identically or differently on each occurrence, from aromatic ring systems having 6 to 30 aromatic ring atoms and from heteroaromatic ring systems having 5 to 30 aromatic ring atoms, each of which may be substituted by one or more radicals $R^3$;
$R^3$ is selected, identically or differently at each occurrence, from H, D, F, $C(=O)R^4$, CN, $Si(R^4)_3$, $N(R^4)_2$, $P(=O)(R^4)_2$, $S(=O)R^4$, $S(=O)_2R^4$, straight-chain alkyl or alkoxy groups having 1 to 20 C atoms, branched or cyclic alkyl or alkoxy groups having 3 to 20 C atoms, alkenyl or alkynyl groups having 2 to 20 C atoms, aromatic ring systems having 6 to 40 aromatic ring atoms, and heteroaromatic ring systems having 5 to 40 aromatic ring atoms; where two or more radicals $R^3$ may be connected to each other to form a ring; where the said alkyl, alkoxy, alkenyl and alkynyl groups and the said aromatic and heteroaromatic ring systems may in each case be substituted by one or more radicals $R^4$, and where one or more $CH_2$ groups in the said alkyl, alkoxy, alkenyl and alkynyl groups may in each case be replaced by $—R^4C=CR^4—$, $—C≡C—$, $Si(R^4)^2$, $CO=O$, $C=NR^4$, $—C(=O)O—$, $—C(=O)NR^4—$, $NR^4$, $P(O)(R^4)$, $—O—$, $—S—$, $SO$ or $SO_2$;
n is 0, 1, 2 or 3.

2. The compound according to claim 1, wherein exactly one radical $R^A$ is replaced by a group according to formula (A), as defined in claim 1.

3. The compound according to claim 1, wherein $R^1$ is on each occurrence, identically or differently, selected from straight-chain alkyl groups having 1 to 10 C atoms, branched or cyclic alkyl groups having 3 to 10 C atoms, aromatic ring systems having 6 to 24 aromatic ring atoms, and heteroaromatic ring systems having 5 to 24 aromatic ring atoms, where the said alkyl groups and the said aromatic and heteroaromatic ring systems may in each case be substituted by one or more radicals $R^4$.

4. The compound according to claim 1, wherein $R^4$ is, identically or differently on each occurrence, selected from H, D, F, CN, straight-chain alkyl groups having 1 to 20 C atoms, branched or cyclic alkyl groups having 3 to 20 C atoms, aromatic ring systems having 6 to 40 aromatic ring atoms, and heteroaromatic ring systems having 5 to 40 aromatic ring atoms; where two or more radicals $R^4$ may be connected to each other to form a ring; and where the said alkyl groups and the said aromatic and heteroaromatic ring systems may in each case be substituted by one or more radicals $R^4$.

5. The compound according to claim 1, wherein $R^2$ is, identically or differently on each occurrence, selected from H, D, F, CN, straight-chain alkyl groups having 1 to 20 C atoms, branched or cyclic alkyl groups having 3 to 20 C atoms, aromatic ring systems having 6 to 40 aromatic ring atoms, and heteroaromatic ring systems having 5 to 40 aromatic ring atoms; where two or more radicals $R^2$ may be connected to each other to form a ring; and where the said alkyl groups and the said aromatic and heteroaromatic ring systems may in each case be substituted by one or more radicals $R^4$.

6. The compound according to claim 1, wherein $R^3$ is selected, identically or differently at each occurrence, from H, D, F, CN, $N(R^4)_2$, straight-chain alkyl groups having 1 to 20 C atoms, branched or cyclic alkyl groups having 3 to 20 C atoms, aromatic ring systems having 6 to 40 aromatic ring atoms, and heteroaromatic ring systems having 5 to 40 aromatic ring atoms; where two or more radicals $R^3$ may be connected to each other to form a ring; and where the said alkyl groups and the said aromatic and heteroaromatic ring systems may in each case be substituted by one or more radicals $R^4$.

7. The compound according to claim 1, wherein $R^4$ is selected, identically or differently at each occurrence, from H, D, F, CN, $N(R^5)_2$, straight-chain alkyl groups having 1 to 20 C atoms, branched or cyclic alkyl groups having 3 to 20 C atoms, aromatic ring systems having 6 to 40 aromatic ring atoms, and heteroaromatic ring systems having 5 to 40 aromatic ring atoms; where two or more radicals $R^4$ may be connected to each other to form a ring; and where the said alkyl groups and the said aromatic and heteroaromatic ring systems may in each case be substituted by one or more radicals $R^5$.

8. The compound according to claim 1, wherein n is 0.

9. The compound according to claim 1, wherein the compound of formula (I) conforms to one of formulae (I-1) to (I-2)

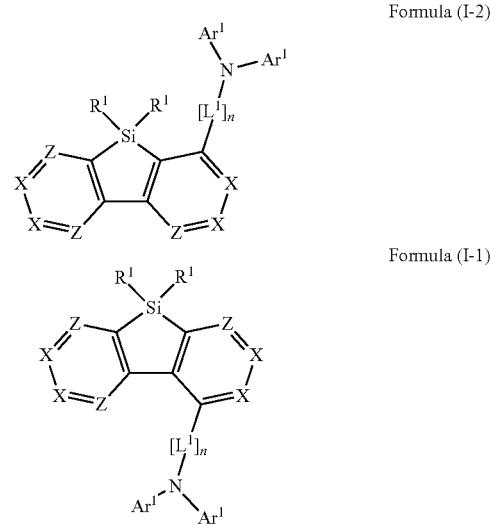

Formula (I-2)

Formula (I-1)

where the variables occurring are defined as in claim 1, and where radicals $R^4$ are not replaced by groups according to formula (A), and where hydrogen atoms or substituents $R^4$ of groups $R^1$ are not replaced by groups according to formula (A).

10. A process for preparation of a compound according claim 1, comprising reacting a mono- or dihalogenated silyl derivative with a halogenated biphenyl group to form the compound according claim 1.

11. An oligomer, polymer or dendrimer, comprising one or more compounds of formula (I) according to claim 1, where the bond(s) to the polymer, oligomer or dendrimer may be localised at any desired positions in formula (I) substituted by $R^1$, $R^2$ or $R^3$.

12. A formulation, comprising at least one compound of formula (I) according to claim 1 and at least one solvent.

13. An electronic device, comprising at least one compound according to claim 1.

14. The electronic device according to claim 13, wherein the electronic device is an organic electroluminescent device, comprising anode, cathode and at least one emitting layer, where at least one organic layer of the device, which is an emitting layer or a hole-transporting layer, comprises the at least one compound.

* * * * *